US006333873B1

(12) United States Patent
Kumanoya et al.

(10) Patent No.: US 6,333,873 B1
(45) Date of Patent: Dec. 25, 2001

(54) SEMICONDUCTOR MEMORY DEVICE WITH AN INTERNAL VOLTAGE GENERATING CIRCUIT

(75) Inventors: Masaki Kumanoya; Katsumi Dosaka; Yasuhiro Konishi; Akira Yamazaki; Hisashi Iwamoto; Kouji Hayano, all of Hyogo-ken (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/942,692

(22) Filed: Sep. 29, 1997

Related U.S. Application Data

(63) Continuation of application No. 08/310,004, filed on Sep. 20, 1994, now abandoned, which is a continuation of application No. 07/781,603, filed on Oct. 23, 1991, now abandoned.

(30) Foreign Application Priority Data

Feb. 7, 1991 (JP) .................................................. 3-016694

(51) Int. Cl.[7] ...................................................... G11C 7/00
(52) U.S. Cl. ...................... 365/189.09; 365/233; 365/229
(58) Field of Search .............................. 365/189.09, 233, 365/229

(56) References Cited

U.S. PATENT DOCUMENTS 4,409,496 * 10/1983 Baba ................................ 307/296.2
4,460,835 * 7/1984 Masuotta ........................... 307/296.2
4,494,223 * 1/1985 Reddy et al. ..................... 307/296.2
4,577,293 3/1986 Matick et al. .................. 365/189.04
4,585,954 * 4/1986 Hashimoto et al. .............. 307/296.2
4,731,758 3/1988 Lam et al. ...................... 365/184.05
4,747,001 * 5/1988 Matsumoto et al. ............ 365/189.09
4,758,987 7/1988 Sakui .............................. 365/189.05
4,894,770 1/1990 Ward et al. .......................... 345/425
4,905,149 * 2/1990 Miyamoto ....................... 365/189.09
4,912,636 * 3/1990 Magar et al. ........................ 395/291
4,926,385 5/1990 Fujishima et al. .............. 365/230.03

(List continued on next page.)

FOREIGN PATENT DOCUMENTS

0030244 A1 6/1981 (EP) .
0036246 A3 9/1981 (EP) .
0118108 A3 9/1984 (EP) .
0185529 A3 6/1986 (EP) .
0206784 A3 12/1986 (EP) .

(List continued on next page.)

OTHER PUBLICATIONS

"Fully Boosted 64K Dynamic RAM with Automatic and Self–Refresh" by Makoto Taniguchi et al., IEEE Journal of Solid–State Circuits, vol. 16, No. 5, Oct. 1981, pp. 492–498.
"Digital Control of Substrate Voltage", IBM Technical Disclosure Bulletin, vol. 28, No. 9, Feb. 1986, pp. 3961–3962.

*Primary Examiner*—Jack A Lane
(74) *Attorney, Agent, or Firm*—McDermott, Will & Emery

(57) ABSTRACT

A semiconductor memory device receives an external control signal repeatedly generated independently of an access to the memory device. The memory device includes an internal voltage generator for generating a desired internal voltage in response to the control signal. The internal voltage generator includes a charge pump circuit responsive to the control signal. The internal voltage may provide a negative voltage such as a substrate bias voltage, or may be a positive voltage boosted over an operating power supply voltage and used as a boosted word line drive signal. This scheme eliminates an oscillator for generating a repeated clock signal to the charge pump circuit, leading to reduced current consumption and reduced chip area for the semiconductor memory device.

47 Claims, 56 Drawing Sheets

U.S. PATENT DOCUMENTS

| | | | | |
|---|---|---|---|---|
| 4,961,167 | * | 10/1990 | Kumaroya et al. | 365/189.09 |
| 4,964,082 | * | 10/1990 | Sato et al. | 365/180.09 |
| 5,022,005 | * | 6/1991 | Tohnishi | 365/189.09 |
| 5,025,421 | | 6/1991 | Cho | 365/230.05 |
| 5,034,625 | * | 7/1991 | Min et al. | 302/296.2 |
| 5,072,134 | * | 12/1991 | Min | 307/296.2 |
| 5,083,296 | * | 1/1992 | Hara et al. | 365/230.02 |
| 5,146,110 | * | 9/1992 | Kim et al. | 307/296.2 |
| 5,157,278 | * | 10/1992 | Min et al. | 365/189.06 |
| 5,179,535 | * | 1/1993 | Nakayama | 365/189.09 |
| 5,185,721 | * | 2/1993 | Love et al. | 365/189.06 |
| 5,200,925 | * | 4/1993 | Morooka | 365/219 |
| 5,208,557 | * | 5/1993 | Kersu, III | 307/296.2 |
| 5,239,639 | * | 8/1993 | Fischer et la. | 395/425 |

FOREIGN PATENT DOCUMENTS

| | | |
|---|---|---|
| 62-212997 | 9/1962 | (JP) . |
| 60-7690 | 1/1985 | (JP) . |
| 60-170962 | 9/1985 | (JP) . |
| 62-38590 | 2/1987 | (JP) . |
| 62-164296 | 7/1987 | (JP) . |
| 62-223891 | 10/1987 | (JP) . |
| 62 283 491 | 12/1987 | (JP) . |
| 63-39057 | 2/1988 | (JP) . |
| 63-81692 | 4/1988 | (JP) . |
| 1-146187 | 6/1989 | (JP) . |
| 1-225354 | 9/1989 | (JP) . |
| 1-263993 | 10/1989 | (JP) . |
| 2-87392 | 3/1990 | (JP) . |
| 2-289996 | 11/1990 | (JP) . |

* cited by examiner

DRAM→SRAM TRANSFER TIMING

4MCDRAM ARRAY

FIG. 26

| OPERATION MODE | E# | CH# | CI# | CR# | W# | REF# |
|---|---|---|---|---|---|---|
| STAND-BY | H | X | X | X | X | H |
| ARRAY REFRESH | H | X | X | X | X | L |
| CPU ← CACHE | L | L | H | H | H | H |
| CPU → CACHE | L | L | H | H | L | H |
| CPU ← CACHE & ARRAY REFRESH | L | L | H | H | H | L |
| CPU → CACHE & ARRAY REFRESH | L | L | H | H | L | L |
| CPU ← ARRAY | L | X | L | H | H | H |
| CPU → ARRAY | L | X | L | H | L | H |
| CACHE ← ARRAY | L | H | H | H | H | H |
| CACHE → ARRAY | L | H | H | H | L | H |
| CPU ↔ COMMAND REGISTER | L | H | H | L | H/L | H |
| CPU ↔ COMMAND REGISTER & ARRAY REFRESH | L | H | H | L | H/L | L |

FIG. 27

| COMMAND REGISTER | $Ar_0$ | $Ar_1$ | W# |
|---|---|---|---|
| $RR_0$ | 0 | 0 | H |
| $RR_1$ | 1 | 0 | H |
| $RR_2$ | 0 | 1 | H |
| $RR_3$ | 1 | 1 | H |
| $WR_0$ | 0 | 0 | L |
| $WR_1$ | 1 | 0 | L |
| $WR_2$ | 0 | 1 | L |
| $WR_3$ | 1 | 1 | L |

RR0 → MASKED WRITE MODE (DEFAULT)

RR1 → D/Q SEPARATION MODE

WR0 → | DQ3(D3) | DQ2(D2) | DQ1(D1) | DQ0(D0) |

{ x0 : TRANSPARENT OUTPUT
  01 : LATCHED OUTPUT
  11 : REGISTERED OUTPUT }

→ OO $n = (ta / tk) - 1$ $: \quad n' = (ta / 2tk) - 1$

ARRAY ACCESS

| | |
|---|---|
| (i) ARRAY WRITE : | 5 ⟶ 7 x n |
| (ii) ARRAY READ : | 6 ⟶ 7 x n' ⟶ 7 Q x (n'+1) |

REFRESH

| | |
|---|---|
| (i) NORMAL REFRESH | 8 ⟶ 7 x n |
| (ii) REFRESH WITH HIT WRITE | 8W ⟶ 1 x n |
| (iii) REFRESH WITH HIT READ | 8R ⟶ 2 x n |

SEMICONDUCTOR MEMORY DEVICE WITH AN INTERNAL VOLTAGE GENERATING CIRCUIT

This application is a continuation of application Ser. No. 08/310,004 filed Sep. 20, 1994, now abandoned, which is a continuation of application Ser. No. 07/781,603 filed Oct. 23, 1991, abandoned Dec. 13, 1994.

BACKGROUND OF THE INVENTION

1. Field of the Invention

The present invention relates circuitry for generating an internal voltage for use in a semiconductor memory device, and more specifically to circuitry for generating an internal voltage for use in a semiconductor memory device including a dynamic random access memory (DRAM) having a large storage capacity serving as a main memory and a static random access memory (SRAM) having small storage capacity serving as a cache memory integrated on the same semiconductor chip.

2. Description of the Background Art

Operation speed of recent 16-bit or 32-bit microprocessing unit (MPU) has been so much increased as to have operation clock frequency as high as 25 MHz or higher. In a data processing system, a standard DRAM (Dynamic Random Access Memory) is often used as a main memory having large storage capacity, since cost per bit is low. Although access time in the standard DRAM has been reduced, the speed of operation of the MPU has been increased much faster than that of the standard DRAM. Consequently, in a data processing system using the standard DRAM as a main memory, increases in the number of wait states is inevitable. The gap in speed of operation between MPU and the standard DRAM is inevitable because the standard DRAM has the following characteristics.

(1) A row address and a column address are time divisionally multiplexed and applied to the same address pin terminal. The row address is taken in the device at a falling edge of a row address strobe signal/RAS. The column address is taken in the device at a falling edge of a column address strobe signal/CAS. The row address strobe signal/RAS defines start of a memory cycle and activates a row selecting system. The column address strobe signal/CAS activates a column selecting system. Since a prescribed time period called "RAS-CAS delay time (tRCD) is necessary from the time the signal/RAS is set to an active state to the time the signals/CAS is set to the active state, there is a limit in reducing the access time, namely, there is a limit derived from address multiplexing.

(2) When the row address strobe signal/RAS is once raised to set the DRAM to a standby state, the row address strobe signal/RAS cannot fall to "L" again until a time period called a RAS precharge time (tRP) has lapsed. The RAS precharge time is necessary for surely precharging various signal lines in the DRAM to prescribed potentials. Due to the RAS precharge time tRP, the cycle time of DRAM cannot be reduced. In addition, when the cycle time of the DRAM is reduced, the number of charging/discharging cycles of signal lines in the DRAM is increased, which increases current consumption.

(3) Higher speed of operation of the DRAM can be realized by circuit techniques such as improvement of layout, increase in degree of integration of circuits, improvement in process techniques and by applications such as improvement in the methods of driving. However, the speed of operation of the MPU is increased at much faster rate than DRAM. The speed of operation of semiconductor memories is hierarchical. For example, there are high speed bipolar RAMs using bipolar transistors such as ECLRAMs (Emitter Coupled RAM) and Static RAM, and comparatively low speed DRAMs using MOS transistors (insulated gate type field effect transistors). It is very difficult to expect the operation speed (cycle time) to be as fast as several tens of ns (nano second) in a standard DRAM formed of MOS transistors.

There have been various applications improvements to close the gap between speed of operations of the MPU and the standard DRAM. Such improvements mainly comprise the following two approaches.

(1) Use of high speed mode of the DRAM and interleave method.

(2) External provision of a high speed cache memory (SRAM).

The first approach (1) includes a method of using a high speed mode, such as a static column mode or a page mode, and combining the high speed mode and an interleave method. In the static mode, one word line (one row) is selected, and thereafter only the column address is changed successively, to successively access memory cells of this row. In the page mode, one word line is selected, and then column addresses are successively taken by toggling the signal/CAS to successively access memory cells connected to the selected one word line. In either of these modes, memory cells can be accessed without toggling the signal/RAS, enabling higher speed accessing than the normal access using the signals/RAS and/CAS.

In the interleave method, a plurality of memories are provided in parallel to a data bus, and by alternately or successively accessing the plurality of memories, the access time is reduced in effect. The use of high speed mode of the DRAM and combination of the high speed mode and the interleave method have been known as methods of using the standard DRAM as a high speed DRAM in a simple and relatively effective manner.

The second approach (2) has been widely used in main frames. A high speed cache memory is expensive. However, in the field of personal computers in which high performance as well as low cost are desired, this approach is employed in some parts with a sacrifice of cost. There are three possible ways to provide the high speed cache memory. Namely, (a) the high speed cache memory is contained in the MPU itself;

(b) the high speed cache memory is provided outside the MPU; and (c) the high speed cache memory is not separately provided but the high speed mode contained in the standard DRAM is used as a cache (the high speed mode is used as a pseudo cache memory). When a cache hit occurs, the standard DRAM is accessed in the high speed mode, and at the time of a cache miss, the standard DRAM is accessed in the normal mode. The above mentioned three ways (a) to (c) have been employed in the data processing systems in some way or other.

In most MPU systems, the memories are adopted to have bank structure and interleaving is carried out on bank by bank basis in order to conceal the RAS precharge time (TRP) which is inevitable in the DRAM, in view of cost. By this method, the cycle time of the DRAM can be substantially one half that of specification value. The method of interleave is effective only when memories are sequentially accessed. When the same memory bank is to be continuously accessed, it is ineffective. Further, substantial improvement of the access time of the DRAM itself cannot be realized. The minimum unit of the memory must be at least 2 banks.

When the high speed mode such as the page mode or the static column mode is used, the access time can be reduced effectively only when the MPU successively accesses a certain page (data of a designated one row). This method is effective to some extent when the number of banks is comparatively large, for example 2 to 4, since different rows can be accessed in different banks. When the data of the memory requested by the MPU does not exist in the given page, it is called a "miss hit". Normally, a group of data are stored in adjacent addresses or sequential addresses. In the high speed mode, a row address, which is one half of the addresses, has been already designated, and therefore possibility of "miss hit" is high. When the number of banks becomes as large as 30 to 40, data of different pages can be stored in different banks, and therefore the "miss hit" rate is remarkably reduced. However, it is not practical to provide 30 to 40 banks in a data processing system. In addition, if a "miss hit" occurs, the signal/RAS is raised and the DRAM must be returned to the precharge cycle in order to re-select the row address, which sacrifices the characteristic of the bank structure.

In the above described second method (2), a high speed cache memory is provided between the MPU and the standard DRAM. In this case, the standard DRAM may have relatively low speed of operation. Standard DRAMs having storage capacities as large as 4M bit or 16M bits have come to be used. In a small system such as a personal computer, the main memory thereof can be formed by one or several chips of standard DRAMs. External provision of the high speed cache memory is not very effective in such a small system in which the main memory can be formed of one standard DRAM. If the standard DRAM is used as the main memory, the data transfer speed between the high speed cache memory and the main memory is limited by the number of data input/output terminals of the standard DRAM, which constitutes a bottleneck in increasing the speed of the system.

When the high speed mode is used as a pseudo cache memory, the speed of operation is lower than the high speed cache memory, and it is difficult to realize the desired system performance.

Provision of the high speed cache memory (SRAM) in the DRAM is proposed as a method of forming a relatively inexpensive and small system, which can solve the problem of sacrifice of system performance when the interleave method or the high speed operation mode is used. More specifically, a single chip memory having a hierarchical structure of a DRAM serving as a main memory and a SRAM serving as a cache memory has been conceived. The 1-chip memory having such a hierarchical structure is called a cache DRAM (CDRAM). The CDRAM will be described.

FIG. 1 shows a structure of a main portion of a conventional standard 1 megabit DRAM. As shown in FIG. 1, the DRAM comprises a memory cell array 500 including a plurality of memory cells MC arranged in a matrix of rows and columns. A row of memory cells are connected to one word line WL. A column of memory cells MC are connected to one column line CL. Normally, the column line CL is formed by a pair of bit lines. A memory cell MC is positioned at a crossing of one of the pair of bit lines and one word line WL. In a 1MDRAM, the memory cells MC are arranged in a matrix of 1024×1024 columns. Namely, the memory cell array 500 includes 1024 word lines WLs and 1024 column lines CLs (1024 pairs of bit lines).

The DRAM further comprises a row decoder 502 which decodes an externally applied row address (not shown) for selecting a corresponding row of the memory cell array 500; a sense amplifier which detects and amplifies data of the memory cell connected to the word line selected by the row decoder 502; and a column decoder which decodes an externally applied column address (not shown) for selecting a corresponding column of the memory cell array 502. In FIG. 1, the sense amplifier and the column decoder are denoted by one block 504. If the DRAM has a ×1 bit structure in which input/output of data is effected bit by bit, one column line CL (bit line pair) is selected by the column decoder. If the DRAM has a ×4 bit structure in which input/output of data is effected 4 bits by 4 bits, 4 column lines CL are selected by the column decoder. One sense amplifier is provided for each column line (bit line pair) CL in the block 504.

In memory access for writing data to or reading data from the memory cell MC in the DRAM, the following operation is carried out. First, a row address is applied to the row decoder 502. The row decoder 502 decodes the row address and raises the potential of one word line WL in the memory cell array 500 to "H". Data of the 1024 bits of memory cells MC connected to the selected word line WL are transmitted to corresponding column lines CL. The data on the column lines CL are amplified by sense amplifiers included in the block 504. Selection of a memory cell to which the data is written or from which the data is read of the memory cells connected to the selected word line WL is carried out by a column selection signal from the column decoder included in the block 504.

In the above described high speed mode, column addresses are successively applied to the column decoder included in the block 504. In the static column mode operation, column addresses applied at every prescribed time interval are decoded as new column addresses by the column decoder, and the corresponding memory cell out of the memory cells connected to the selected word line WL is selected by the column line CL. In the page mode, a new column address is applied at every toggling of the signal/CAS, and the column decoder decodes the column address to select the corresponding column line. In this manner, in the high speed mode, one row of memory cells MC connected to the selected word line WL can be accessed at high speed by setting one word line WL at a selected state and by changing the column addresses only.

FIG. 2 shows a general structure of a conventional 1M bit CDRAM. Referring to FIG. 2, the conventional CDRAM comprises, in addition to the components of the standard DRAM shown in FIG. 1, SRAM 506 and a transfer gate 508 for transferring data between one row of the memory cell array 500 of the DRAM and the SRAM 506. The SRAM includes a cache register provided corresponding to each column line CL of the memory cell array 500 so as to enable simultaneous storage of data of one row of the DRAM memory cell array 500. Therefore, 1024 cache registers are provided. The cache register is formed by a SRAM cell. In the structure of the CDRAM shown in FIG. 2, when a signal representing a cache hit is externally applied, the SRAM 506 is accessed, enabling access to the memory at high speed. At the time of a cache miss (miss hit), the DRAM portion is accessed.

A CDRAM as described above having a DRAM of a large storage capacity and a high speed SRAM integrated on the same chip is disclosed in, for example, Japanese Patent Laying-Open Nos. 60-7690 and 62-38590.

In the above described conventional CDRAM structure, column lines (bit line pairs) CL of the DRAM memory cell array 500 and column lines (bit line pairs) of the SRAM (cache memory) 506 are connected in one to one correspondence through a transfer gate 508. More specifically, in the above described conventional CDRAM structure, data of the memory cells connected to one word line WL in the DRAM memory cell array 500 and the data of the same number of SRAMs as memory cells of one row of the memory cell array 500 are transferred bi-directionally and simultaneously, through the transfer gate 508. In this structure, the SRAM 506 is used as a cache memory and the DRAM is used as a main memory.

The so called block size of the cache is considered to be the number of bits (memory cells) the contents of which are rewritten in one data transfer in SRAM 506. Therefore, the block size is the same as the number of memory cells which are physically coupled to one word line WL of DRAM memory cell array 500. As shown in FIGS. 1 and 2, when 1024 memory cells are physically connected to one word line WL, the block size is 1024.

Generally, when the block size becomes larger, the hit ratio is increased. However, if the cache memory has the same size, the number of sets is reduced in inverse proportion to the block size, and therefore the hit ratio is decreased. For example, when the cache size is 4K bit and the block size 1024, the number of sets is 4. However, if the block size is 32, the number of sets is 128. Therefore, in the conventional CDRAM structure, the block size is made too large, and the cache hit ratio cannot be very much improved.

A structure enabling reduction in block size is disclosed in, for example, Japanese Patent Laying-Open No. 1-146187. In this prior art, column lines (bit line pairs) of the DRAM array and the SRAM array are arranged in one to one correspondence, but they are divided into a plurality of blocks in the column direction. Selection of the block is carried out by a block decoder. At the time of a cache miss (miss hit), one block is selected by the block decoder. Data are transferred between only the selected DRAM block and the SRAM block. By this structure, the block size of the cache memory can be reduced to an appropriate size. However, there remains the following problem unsolved.

FIG. 3 shows a standard array structure of a 1M bit DRAM array. In FIG. 3, the DRAM array is divided into 8 memory blocks DMB1 to DMB8. A row decoder 502 is commonly provided for the memory blocks DMB1 to DMB8 on one side in the longitudinal direction of the memory array. For each of the memory blocks DMB1 to DMB8, (sense amplifier+column decoder) blocks 504-1 to 504-8 are provided.

Each of the memory blocks DMB1 to DMB8 has the capacity of 128K bits. In FIG. 3, one memory block DMB is shown to have 128 rows and 1024 columns, as an example. One column line CL includes a pair of bit lines BL, /BL.

As shown in FIG. 3, when the DRAM memory cell array is divided into a plurality of blocks, one bit line BL (and/BL) becomes shorter. In data reading, charges stored in a capacitor (memory cell capacitor) in the memory cell are transmitted to a corresponding bit line BL (or/BL). At this time the amount of potential change generated on the bit line BL (or/BL) is proportional to the ratio Cs/Cb of the capacitance Cs of the memory cell capacitor to the capacitance Cb of the bit line BL (or/BL). If the bit line BL (or/BL) is made shorter, the bit line capacitance Cb can be reduced. Therefore, the amount of potential change generated on the bit line can be increased.

In operation, sensing operation of the memory block (memory block DMB2 in FIG. 3) including the word line WL selected by the row decoder 502 is carried out only, and other blocks are kept in a standby state. Consequently, power consumption incidental to charging/discharging of the bit line during sensing operation can be reduced.

When the above described block dividing type CDRAM is applied to the DRAM shown in FIG. 3, a SRAM register and a block decoder must be provided for each of the memory blocks DMB1 to DMB8, which significantly increases the chip area.

Further, the bit lines of the DRAM array and the SRAM array are in one to one correspondence, as described above. When a direct mapping method is employed as the method of mapping memories between the main memory and the cache memory, then the SRAM 506 is formed by 1024 cache registers arranged in one row, as shown in FIG. 2. In this case, the capacity of the SRAM cache is 1K bit.

When 4 way set associative method is employed as the mapping method, the SRAM array 506 includes 4 rows of cache registers 506*a* to 506*d* as shown in FIG. 4. One of the 4 rows of cache registers 506*a* to 506*d* is selected by the selector 510 in accordance with a way address. In this case, the capacity of the SRAM cache is 4K bits.

As described above, the method of memory cell mapping between the DRAM array and the cache memory is determined dependent on the structure in the chip. When the mapping method is to be changed, the cache size also must be changed.

In both of the CDRAM structures described above, the bit lines of the DRAM array and the SRAM array are in one to one correspondence. Therefore, the column address of the DRAM array is inevitably the same as the column address of the SRAM array. Therefore, full associative method in which memory cells of the DRAM array are mapped to an arbitrary position of the SRAM array is impossible in principle.

Another structure of a semiconductor memory device in which the DRAM and the SRAM are integrated on the same chip is disclosed in Japanese Patent Laying-Open No. 2-87392. In this prior art, the DRAM array and the SRAM array are connected through an internal common data bus. The internal common data bus is connected to an input/output buffer for inputting/outputting data to and from the outside of the device. The position of selection of the DRAM array and the SRAM array can be designated by separate addresses. However, in this structure of the prior art, data transfer between the DRAM array and the SRAM array is carried out by an internal common data bus, and therefore the number of bits which can be transferred at one time is limited by the number of internal data buses, which prevents high speed rewriting of the contents of the cache memory. Therefore, as in the above described structure in which the SRAM cache is provided outside the standard DRAM, the speed of data transfer between the DRAM array and the SRAM array becomes a bottleneck, preventing provision of a high speed cache memory system. Various internal voltages are generally generated in a semiconductor memory device which is not limited to CDRAM. Such internal voltages includes a substrate bias voltage.

FIG. 5 schematically shows a whole structure of a semiconductor memory device comprising a substrate bias voltage generating circuit. The semiconductor memory device 950 shown in FIG. 5 comprises a memory array 951 including a plurality of memory cells, sense amplifiers and the like, and a peripheral circuitry 952 for controlling access to memory array 951. Peripheral circuitry 952 includes an address buffer, an address decoder, a control signal generating circuit for generating an internal clock signal for determining various operation timings, and so on.

Semiconductor memory device 950 further comprises a substrate bias generating circuit 953 for applying a prescribed bias potential Vbb to a semiconductor chip substrate on which the semiconductor memory device 950 is formed. When the semiconductor substrate on which the semiconductor memory device is to be formed is formed of a P type semiconductor, the substrate bias voltage Vbb from substrate bias generating circuit 953 biases the semiconductor substrate to a prescribed negative potential. The substrate potential is made stable by substrate bias voltage, so as to stabilize threshold voltages of MOS transistors (insulated gate field effect transistors), to prevent capacitance coupling of signal lines and substrate, and to reduce junction capacitance of the MOS transistors. An on-chip substrate bias generating circuit generally has such a structure as shown in FIG. 6.

The substrate bias generating circuit 953 shown in FIG. 6 includes an oscillating circuit 955 for generating clock signals at a prescribed period, and a charge pump circuit 956 generating substrate voltage Vbb by a charge·pump operation in response to the clock signals from the oscillating circuit 955.

Oscillating circuit 955 is formed by a ring oscillator, including an odd number of stages of cascade connected inverter circuits. Consequently, the area occupied by oscillating circuit 95 is increased, which prevents reduction in area of occupation of the substrate bias generating circuit. Especially in a semiconductor memory device containing a cache having a DRAM and a SRAM integrated on the same substrate, the area of occupation by the internal circuit should be reduced as much as possible. It is difficult to provide a CDRAM occupying small area.

Since oscillator circuit 955 oscillates constantly, current is consumed by the oscillating operation, and therefore current consumption of the semiconductor memory device can not be reduced. Boosting voltage in boosted word line schemes is another one of such internal voltages.

A memory cell of a DRAM generally has such a structure as shown in FIG. 7. Referring to FIG. 7, a DRAM cell includes a memory cell capacitor Cm for storing information in the form of charges, and a memory cell transistor Tm responsive to a signal potential on a word line DWL for connecting memory cell capacitor Cm to a bit line DBLa. One electrode (cell plate) of capacitor Cm is connected to a prescribed potential Vsg. Transistor Tm is formed of a MOS transistor. Generally, an MOS transistor can transmit only a voltage applied to the gate minus the threshold voltage Vth thereof. For example, when the word line DWL is at 5V when it is selected and the threshold voltage of the transistor Tm is 1V, the maximum voltage stored in capacitor Cm is 4V. In order to prevent reduction of the stored voltage in capacitor Cm due to the threshold voltage of the transistor Tm, a boosted word line scheme for boosting voltage of the word line DWL to be higher than the supply voltage is generally used. The boosted word line scheme is generally used for surely storing sufficient signal charges in the capacitor Cm when operational supply voltage of DRAM becomes as low as 3.3V, for example, other than 5V power supply voltage scheme.

FIG. 8 shows an example of a circuit structure for boosting the word line. Referring to FIG. 8, a circuit generating a word line driving signal ϕx includes a boosting circuit 961 for generating a prescribed boosting voltage which is higher than the supply voltage, and a row decoder 962 for decoding an internal address ADD, selecting a corresponding word line, and for transmitting a boosting signal from boosting circuit 961 as a word line driving signal ϕx to the selected word line. A boosting signal from applied circuit 961 is generally boosted at a restore (rewriting) of a memory cell, not initially at the driving of the word line.

FIG. 9 shows an example of a specific structure of the boosting circuit shown in FIG. 8. The structure of the word line boosting circuit shown in FIG. 9 is disclosed in, for example, Japanese Patent Laying-Open No. 62-212997. Referring to FIG. 9, boosting circuit 961 includes three stages of cascade connected inverters VN4, VN5 and VN6 receiving an internal control signal rasA, providing a prescribed delay and generating a control signal dr1, and three stages of cascade connected inverters VN1, VN2 and VN3 for providing a delay to the control signal rasA, inverting the same and for generating an internal control signal dr2. The delay time provided by the inverters VN1 to VN3 is longer than that of the inverters VN4 to VN6.

The boosting circuit 961 further includes a boost capacitance Cp1 for generating a boosted voltage, and transistors TQ5 to TQ11 responsive to the control signal dr2 and to a precharge signal PC for applying a boosting designating signal to boost capacitance Cp1. Transistors TQ5 and TQ6 receive the control signal dr2 at their gates. Transistor TQ5 is turned on when the control signal DR2 is at “L” and transmits the operational supply voltage Vcc. Transistor TQ6 receives a constant voltage at its gate from transistors TQ7 and TQ8 and it is kept constantly on, and it limits level of the voltage transmitted from transistor TQ5 and transmits the same to an input side electrode of the capacitance Cp1. Transistor TQ9 holds the input side electrode of the capacitance Cp1 at the ground potential until the control signal dr2 is applied. Transistors TQ10 and TQ11 are turned on in response to the precharge signal PC, and surely hold the output node (drain electrode) of the transistor TQ5 and the input side electrode of capacitance Cp1 at the ground potential. Transistor TQ7 and TQ8 are diode connected and connected in reverse parallel to each other. Transistor TQ7 clamps gate voltage of transistor TQ6 at VC−Vth. Transistor TQ8 clamps gate voltage of transistor TQ6 at VC+Vth. The reference character Vth represents threshold voltage of transistors TQ7 and TQ8.

A constant voltage VC is generated by diode connected transistors TQ15 to TQ18 provided in series between supply voltage Vcc and the ground potential. Since conductance of transistor TQ15 is sufficiently smaller than that of the transistors TQ16 to TQ18, the constant voltage VC is provided as VC=3Vth.

The boosting circuit 961 further includes a transistor TQ1 for precharging an electrode of the output side of boost capacitance Cp1 at a prescribed potential, and transistors TQ2 to TQ4 responsive to control signal dr1 for generating word line driving signal ϕx. Transistor TQ1 is turned on in response to a precharge signal PC and precharges the output side electrode of capacitance Cp1 at the supply potential Vcc.

Transistor TQ2 transmits output side voltage of boost capacitance Cp1 and generates boosted word line driving signal ϕx when control signal dr1 is set to the on state because its source is connected to the substrate. Transistor TQ3 is turned on in response to “H” of control signal dr1 and makes the word line driving signal ϕx fall to “L” through the normally on transistor TQ4. Supply voltage Vcc is applied to the gate of transistor TQ4 to prevent application of boosted voltage to the drain of transistor TQ3. The operation will be described in the following with reference to FIG. 10, which is a diagram of waveforms.

If the DRAM is in the non-selected state, the precharge signal PC is at "H" and the internal control signal rasA is at "L". The control signal rasA is a control signal of a positive logic generated internally in response to an external row address strobe signal/RAS. In the precharge state, transistors TQ1, TQ9 and TQ10 are on, and the output side electrode of the boost capacitance Cp1 is precharged to Vcc−Vth. The input side electrode of boost capacitance Cp1 is discharged to the ground potential. The word line driving signal ϕx is discharged to "L" by transistors TQ4 and TQ3.

When the signal/RAS falls to "L" and the DRAM is set to a selected state, precharge signal PC attains to "L", and control signal rasA rises to "H". First, transistor TQ1 is turned off, and the output side electrode of boost capacitance Cp1 is set to a floating state at a potential of Vcc−Vth. Transistors TQ10 and TQ11 are turned off.

In response to the rise of the control signal rasA to "H", the control signal dr1 falls to "L". Consequently, transistor TQ2 is turned on and transistor TQ3 is turned off. Since transistor TQ2 is turned on, word line driving signal ϕx rises to a high level (Vcc−Vth) in accordance with the precharge voltage (Vcc−Vth) of boost capacitance Cp1. The word line driving signal ϕx is transmitted to the word line selected through the row decoder, and thereafter sensing operation and so on are carried out.

Thereafter, when control signal dr2 falls to "L", transistor TQ9 is turned off, transistor TQ5 is turned on, and voltage Vcc is transmitted to one electrode of the transistor TQ6. Gate voltage of transistor TQ6 rises from supply voltage Vcc from transistor TQ5 (self bootstrap operation), but is clamped by transistor TQ8 at a voltage VC+Vth. The voltage VC is lower than supply voltage Vcc. Accordingly, voltage transmitted to the input side electrode of boost capacitance Cp1 is the constant voltage VC. By the voltage VC applied to the boost capacitance Cp1, the voltage at the output side electrode thereof attains to the precharge voltage Vcc−Vth+VC. The boosted voltage of boost capacitance Cp1 is transmitted as the word line driving signal ϕx through transistor TQ2. Since the substrate and the source of transistor TQ2 are connected, the boosted level of boosted word line driving signal ϕx becomes Vcc−Vth+3·Vth, that is, Vcc+2·Vth, when the voltage VC is 3·Vth.

As described above, by boosting the word line driving signal ϕx to be higher than the level of the supply voltage Vcc, sufficient charges are stored in the memory cell capacitor without signal loss, and during reading of data, charges stored in the capacitor Cm can be transmitted at high speed to the bit line DBLa. However, if such a boosting circuit for generating a word line boosting signal is provided, chip area of the semiconductor memory device can not be reduced, since such a circuit includes a number of transistor elements, a complicated circuit structure, and the boosting circuit having small area of occupation can not be formed.

In this boosting circuit, in order to hold the boosted level of the boosted word line driving signal, an oscillating signal is applied to an input side electrode of another boosted capacitance, and charges supplied from an output side electrode of this boost capacitance are supplied to an output terminal of transistor TQ2 through a diode connected transistor. By the charges supplied from this separate boost capacitance, lowering of the boosted level due to leak current of the word line driving signal ϕx can be prevented. However, since an oscillating signal is used in this case, an oscillating circuit for supplying the oscillating signal is further provided. As in the above described substrate bias generating circuit, the power consumption is increased, and the area of occupation of the boosting circuit is increased. Therefore, the semiconductor memory device having higher degree of integration can not be provided,

SUMMARY OF THE INVENTION

Therefore, an object of the present invention is to provide a semiconductor memory device having an internal voltage generating circuit capable of generating desired internal voltage with small area of occupation.

Another object of the present invention is to provide a semiconductor device capable of generating desired internal voltage with low current consumption.

A further object of the present invention is to provide a semiconductor memory device containing a cache having high degree of integration and low power consumption.

A still further object of the present invention is to provide a clock synchronized type semiconductor memory device having an internal voltage generating circuit of low current consumption with small area of occupation.

The semiconductor memory device in accordance with the present invention includes an internal voltage generating circuit for generating a desired internal voltage in response to an externally applied control signal. The external control signal is repeatedly generated no matter whether the semiconductor memory device is accessed or not.

By using external control signals repeatedly applied, an oscillating circuit or the like become unnecessary, and therefore an internal voltage generating circuit which has simple circuit structure and small area of occupation can be provided.

In addition, since an oscillating circuit for generating oscillating signals becomes unnecessary, current consumption is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 26 shows in a table operation modes of CDRAM in accordance with an embodiment of the invention.

FIG. 27 shows correspondence between command registers and command register selecting signals shown in FIG. 11.

DESCRIPTION OF THE PREFERRED EMBODIMENTS

[Array Structure]

Figure 11:
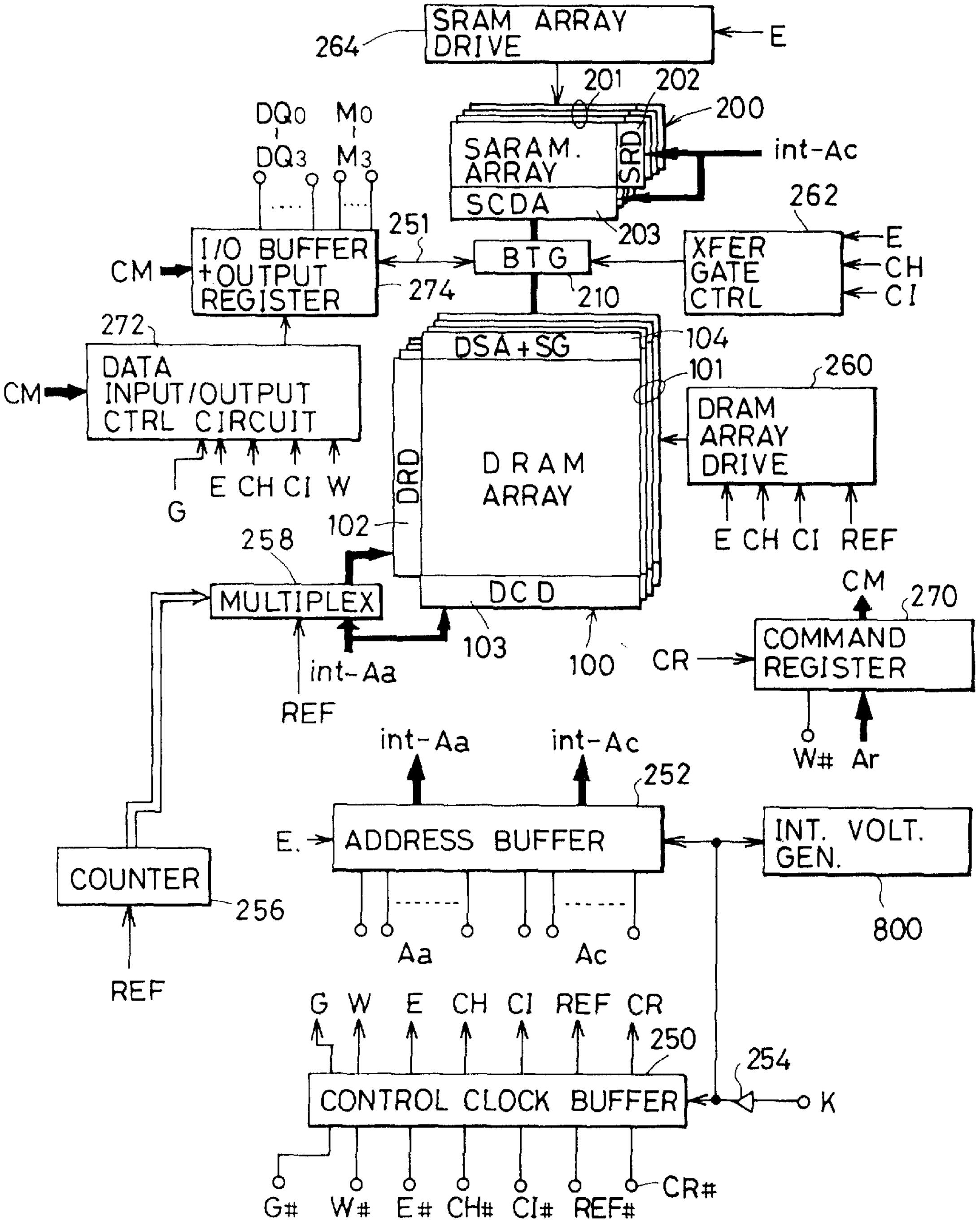
FIG. 11 is a block diagram showing functionally an overall structure of a semiconductor memory device according to an embodiment of the present invention.

FIG. 11 schematically illustrates an overall structure of a semiconductor memory device according to an embodiment of the present invention. The semiconductor memory device shown in FIG. 11 comprises an SRAM as a fast access memory and a DRAM as a large storage capacity memory integrated on a common single semiconductor ship to provide a cache containing semiconductor memory device (CDRAM).

Referring to FIG. 11, a CDRAM includes a DRAM 100 and a SRAM 200. DRAM 100 comprises a 4M bit DRAM array 101; a DRAM row decoder block 102 for decoding an applied internal row address for the DRAM and for selecting 4 rows from DRAM array 101; a DRAM column decoder block 103 for decoding applied internal column address for DRAM and for selecting one column from each of the selected 4 rows in a normal operation mode (array access; an access to DRAM); and a block 104 including DRAM sense amplifiers DSA for detecting and amplifying data of the memory cells connected to the selected rows, and selecting gates SG responsive to a column selecting signal from block 103 for selecting 16 bits of DRAM array 101 in a data transfer mode and for selecting 4 bits of memory cells in an array access mode.

SRAM 200 comprises an SRAM array 201 having the capacity of 16K bits; a SRAM row decoder block 202 for decoding an internal row address for the SRAM and for selecting 4 rows from SRAM array 201; and a column decoder/sense amplifier block 203 including SRAM column decoders and SRAM sense amplifiers for decoding the internal column address for the SRAM, selecting 1 bit from each of the selected 4 rows and connect the same to an internal data bus 251, and for detecting and amplifying information of the selected SRAM cells in data reading. A bi-directional transfer gate circuit 210 is provided between DRAM 100 and SRAM 200. Referring to FIG. 11, the gate circuit 210 may be connected to an output (input) of the column decoder/sense amplifier block 203. However, in FIG. 11, data input/output to and from DRAM 100 are carried out through the common data bus 251 and bidirectional transfer gate circuit 210 (this structure will be discussed later) in the array access mode, and therefore the common data bus 251 is shown as coupled to bi-directional transfer gate circuit 210.

The CDRAM further comprises a control clock buffer 250 receiving externally applied control signals or an output enable signal G#, a write enable signal W#, a chip select signal E#, a cache hit signal CH#, a cache inhibit signal CI#, a refresh signal REF# and a command register CR# to generate internal control signals G, W, E, CH, CI, REF and CR; an address buffer 252 for generating internal address int-Aa for the DRAM and an internal address int-Ac for the SRAM; and a clock buffer 254 for buffering an externally applied clock signal K.

Control clock buffer 250 takes in an applied control signal and generates an internal control signal in response to a rise of an internal clock from clock buffer 254. An output from clock buffer 254 is also applied to address buffer 252. Address buffer 252 takes in an externally applied addresses Aa and Ac which are applied when the internal chip select signal E is active at a rising edge of the clock K from the clock buffer 254 and generates internal addresses int-Aa and int-Ac.

The CDRAM of FIG. 11 further comprises a counter circuit 256 which is activated in response to internal refresh designating signal REF for generating a refresh address of the DRAM array; and an address multiplex circuit 258 for applying either a refresh address from counter circuit 256 or an internal row address from address buffer 252 to DRAM row decoder block 102 in response to the internal refresh designating signal REF.

The CDRAM further comprises a DRAM array driving circuit 260 responsive to the internal control signals E, CH, CI, W and REF for generating various control signals for driving DRAM 100; a transfer gate controlling circuit 262 responsive to the internal control signals E, CH and CI for generating signals for controlling transfer operation of bi-directional transfer gate circuit 210; and a SRAM array driving circuit 264 responsive to internal chip select signal E for generating various control signals for driving SRAM 200.

When the refresh designating signal is generated, DRAM array driving circuit drives or activates only circuitry related to row selection in DRAM array. Transfer gate controlling circuit 262 may be so structured to disable the bi-directional transfer circuit 210 to isolate the SRAM array 201 and DRAM array 101 from each other upon generation of the refresh designating signal REF.

The CDRAM in accordance with the present invention further comprises a command register 270 which is activated in response to an internal control signal CR for generating a command CM for designating operation mode of the CDRAM in response to external write enable signal W# and to command addresses Ar (Ar0 and Ar1); a data input/output control circuit 272 for controlling data input/output in accordance with the internal control signals G, E, CH, CI and W and to the special mode command CM; an input/output circuit 274 including an input/output buffer and an output register for inputting/outputting data between common data bus 251 and an outside of the device. An output register is provided in the input/output circuit 274 for realizing a latched output mode and a register output mode, which are the special modes of the CDRAM. Data input/output control circuit 272 sets input/output timing of data in accordance with the mode designated by the special mode command CM as well as the manner of input/output of data. In FIG. 11, configuration of data input/output pins in masked write mode is shown as an example. The masked write mode will be described later.

Figure 12:
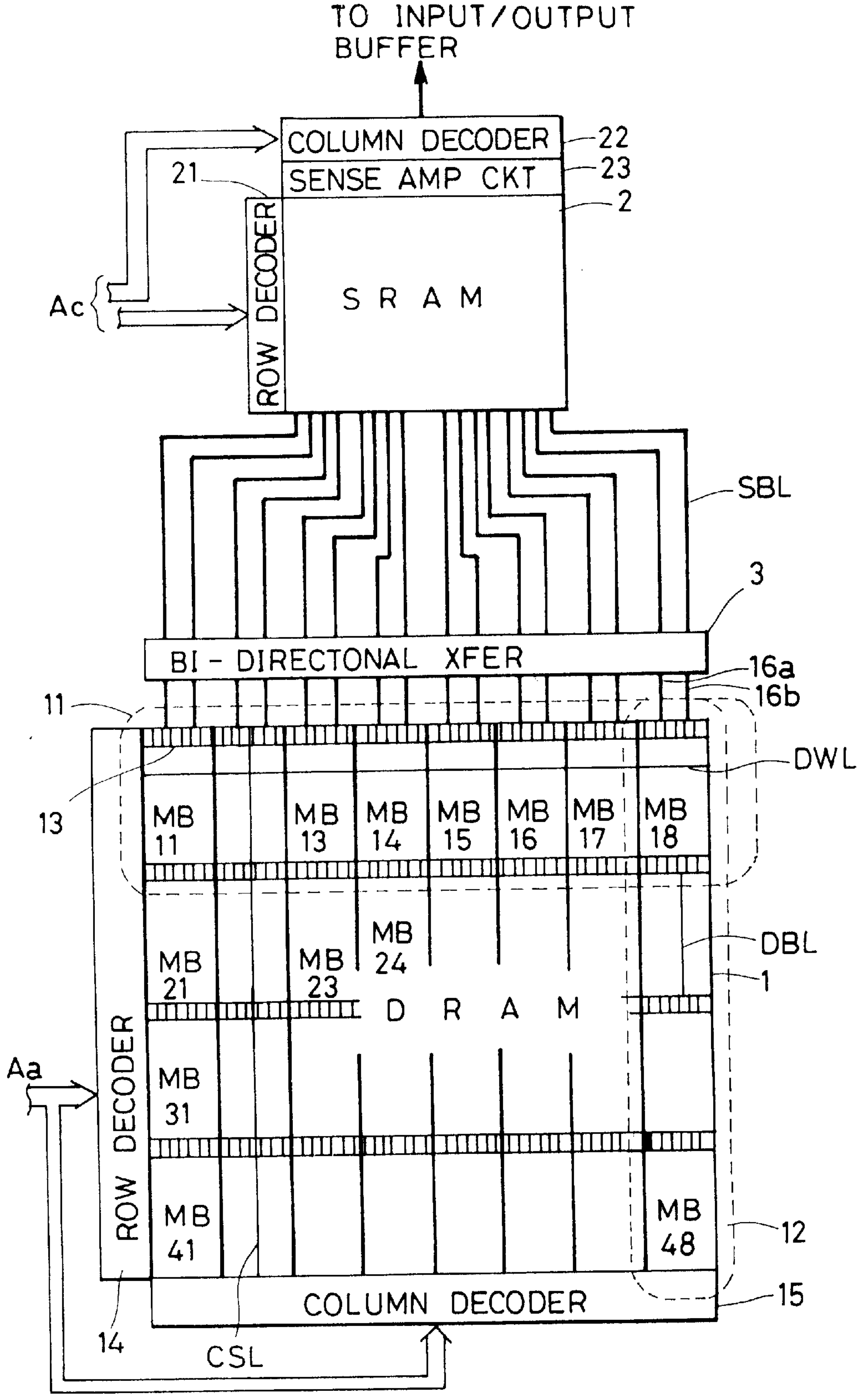
FIG. 12 shows a structure of a memory array of a semiconductor memory device containing a cache in accordance with one embodiment of the present invention.

FIG. 12 schematically shows a structure of a memory array portion of the semiconductor memory device in accordance with one embodiment of the present invention. Referring to FIG. 12, the semiconductor memory device comprises a DRAM array 1 including dynamic memory cells arranged in a matrix of rows and columns, a SRAM array 2 including static memory cells arranged in a matrix of rows and columns, and a bi-directional transfer gate circuit 3 for transferring data between DRAM array 1 and SRAM 2.

DRAM array 1 includes, assuming that it has storage capacity of 1M bit, 1024 word lines WL and 1024 pairs of bit lines BL and/BL. In FIG. 12, the bit line pair is denoted by DBL. DRAM array 1 is divided into a plurality of blocks along the row and column directions. In FIG. 12, DRAM array 1 is divided into 8 blocks MBI1 to MBI8 (I=1 to 4) along the column direction and divided into 4 blocks MB1*j* to MB4*j* (j=1 to 8) along the row direction, namely, it is divided into a total of 32 memory blocks as an example.

8 blocks MBi1 to MBi8 divided in the column direction constitute a row block 11. 4 blocks MB1*j* MB4*j* divided in the row direction constitute a column block 12. The memory blocks Mbi1 to Mbi8 included in one row block 11 shares one word line WL. The memory blocks MB1*j* to MB4*j* included in the same column block 12 shares a column selecting line CSL. A sense amplifier+IO block 13 is provided for each of the memory blocks MB11 to MB18. The structure of sense amplifier+IO block 13 will be described later. Column selecting line CSL simultaneously selects two columns (two pairs of bit lines).

The semiconductor memory device further comprises a row decoder 14 responsive to an external address for selecting a corresponding one row from DRAM array 1, and a column decoder 15 responsive to an externally applied column address for selecting one column selecting line CSL. Column blocks 12 are connected to the bi-directional transfer gate circuit 3 through two pairs of I/O lines 16*a* 16*a* and 16*b* which are independent from each other.

SRAM array 2 includes 16 pairs of bit lines SBL which are connected to 16 pairs of I/O lines through the bi-directional transfer gates circuit 3, respectively. If SRAM array 2 has the capacity of 4K bit, it includes 16 pairs of bit lines and 256 word lines. Namely, in SRAM array 2, one row is comprised of 16 bits. SRAM array 2 is associated with a SRAM row decoder 21 for decoding a row address externally applied to the SRAM array for selecting one row of SRAM array 2, a SRAM column decoder 22 for decoding an externally applied column address and for selecting a corresponding column in SRAM array 2, and a sense amplifier circuit 23 for amplifying and outputting data of the memory cell selected by SRAM row decoder 21 and SRAM column decoder 22 in data reading.

The SRAM bit line pair SBL selected by SRAM column decoder 22 is connected to a common data bus, and input/output of data with the outside of the device is effected through an input/output buffer (not shown). Addresses applied to DRAM row decoder 14 and DRAM column decoder 15 are independent of addresses applied to SRAM row decoder 21 and SRAM column decoder 22, which addresses are applied to mutually different address pin terminals. Data transfer operation of the semiconductor memory device shown in FIG. 12 will be briefly described.

[Data Transfer]

The operation of the DRAM portion will be described. First, in accordance with an externally applied row address, row decoder 14 carries out a row selecting operation and raises potential of one word line DWL to "H". Data are read to corresponding 1024 bit liens BL (or/BL) from memory cells connected to the selected one word line DWL.

Then, sense amplifiers (included in the block 13) of row block 11 including the selected word line DWL are activated at one time, and differentially amplify potential difference between each bit line pair. Only one of the four row blocks 11 is activated to reduce power consumption associated with charging/discharging of the bit lines during the sensing operation. This operation, in which only the row block including the selected row is activated, is called partial activation method.

In accordance with an externally applied column address, DRAM column decoder 15 carries out a column selecting operation and one column selecting line CSL is set to the selected state in each column block 12. The column selecting line CSL selects two pairs of bit lines, and the two pairs of bit lines are connected to two pairs of I/O lines 16*a* and 16*b* provided corresponding to the block. Consequently, a plurality of bits (16 bits in this embodiment) of data are read to the plurality of I/O line pairs 16*a* and 16*b* from DRAM array 1.

Operation of the SRAM portion will be described. In accordance with an externally applied row address, SRAM row decoder 21 carries out row selecting operation and selects one word line from SRAM array 2. As described above, 26 bits of memory cells are connected to one SRAM word line. Therefore, by the selection of one word line, 16 static memory cells (SRAM cells) are connected to 16 pairs of bit lines SBL.

After 16 bits data have been transmitted to I/O line pairs 16*a* and 16*b* for DRAM array 1, bi-directional transfer gate circuit 3 is turned ON, and 16 pairs of I/O lines 16*a* and 16*b* are connected to 16 pairs of bit lines SBL of the SRAM. Consequently, data which have been transmitted to 16 pairs of I/O lines 16*a* and 16*b* are written to the 16 bits of memory cells which have been selected in SRAM array 2.

A sense amplifier circuit 23 and column decoder 22 provided in the SRAM are used to transfer data between the memory cells in SRAM array 2 and an input/output buffer for inputting/outputting external data.

It is possible to set addresses for selecting SRAM cells in SRAM array 2 completely independent from addresses for selecting dynamic memory cells (DRAM cells) in DRAM array 1 (these addresses are input through different address pins). Therefore, it is possible for the 16 bits of memory cells selected in DRAM array 1 to exchange data with memory cells at an arbitrary position (row) of SRAM array 2. Therefore, all of the direct mapping method, set associative method and full associative method can be realized without changing the structure and array arrangement.

The principal of simultaneous transfer of 16 bits of data from the DRAM to the SRAM has been described. Simultaneous transfer of 16 bits of data from SRAM array 2 to DRAM array 1 is carried out in the same manner, except that the direction of data flow through the bi-directional transfer gate circuit 3 is reversed. The structure and operation of the semiconductor memory device containing a cache in accordance with the present invention will be described in detail.

[Details of Array Structure]

Figure 13:
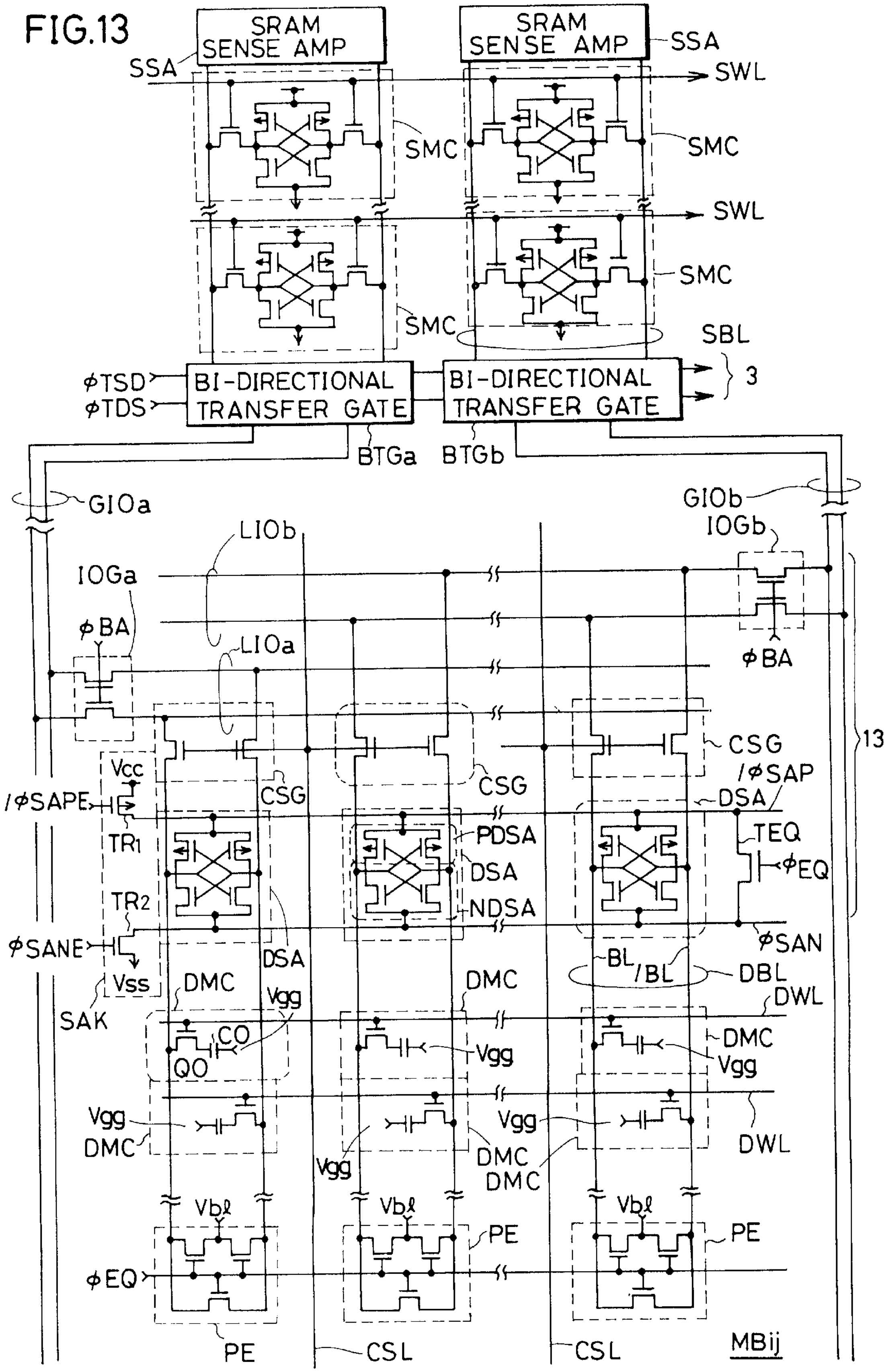
FIG. 13 shows a detailed structure of portions related to one memory block of the semiconductor memory device shown in FIG. 12.

FIG. 13 shows a specific structure of a main portion of the semiconductor memory device shown in FIG. 12. FIG. 13 shows, as a representative, a portion related to data transfer of one memory block MBij of DRAM array shown in FIG. 12. Referring to FIG. 13, DRAM memory block MBij includes a plurality of DRAM cells DMCs arranged in rows and columns. DRAM cell DMC includes one transistor Q0 and one capacitor C0. A constant potential Vgg is applied to one electrode (cell plate) of memory capacitor C0.

The memory block MBij further includes DRAM word lines DWL to each of which one row of DRAM cells DMCs are connected, and DRAM bit line pairs DBL to each of which a column of DRAM cells DMCs are connected. The DRAM bit line pair DBL includes two bit lines BL and/BL. Signals complementary to each other are transmitted to bit lines BL and/BL. A DRAM cell DMC is arranged at an intersection of a DRAM word line DWL and a DRAM bit line pair DBL.

A DRAM sense amplifier DSA for detecting and amplifying potential difference on a corresponding bit line pair is provided for each of the DRAM bit line pairs DBL. Operation of DRAM sense amplifier DSA is controlled by a sense amplifier activating circuit SAK which generates sense amplifier driving signals ϕSAN and/ϕSAP in response to sense amplifier activating signals ϕSANE and/ϕSAPE. DRAM sense amplifier DSA includes a first sense amplifier portion PDSA having p channel MOS transistors cross coupled for raising a bit line potential which is higher to operational supply potential Vcc level in response to the signal /ϕSAP, and a second sense amplifier portion NDSA having n channel MOS transistors cross coupled for discharging potential of a bit line which is lower to, for example, the potential Vss of the ground potential level, in response to the signal ϕSAN.

The sense amplifier activating circuit SAK includes a sense amplifier activating transistor TR1 which is turned on in response to sense amplifier activating signal/ϕSAPE for activating the first sense amplifier portion of DRAM sense amplifier DSA, and a sense amplifier activating transistor TR2 which is turned on in response to sense amplifier activating signal ϕSANE for activating the second sense amplifier portion of DRAM sense amplifier DSA. Transistor TRl is formed by a P channel MOS transistor, while the transistor TR2 is formed by an n channel MOS transistor. When turned on, transistor TR1 transmits a driving signal/ϕSAP of the operational supply potential Vcc level to one supply node of each sense amplifier DSA. When turned on, transistor TR2 transmits a signal ϕSAN of the potential Vss level to the other supply node of DRAM sense amplifier DSA.

Between a signal line/ϕSAP and the signal line ϕSAN to which signals /ϕSAP and ϕSAN are output from sense amplifier activating circuit SAK, an equalize transistor TEQ is provided for equalizing both signal lines in response to an equalize designating signal ϕEQ. Therefore, in the standby state, sense amplifier driving signal lines /ϕSAP and ϕSAN are precharged to an intermediate potential of (Vcc+Vss). Signal lines and signals transmitted thereto are represented by the same reference characters.

For each of the DRAM bit line pairs DBL, a precharge/equalize circuit PE which is activated in response to a precharge equalize signal ϕEQ for precharging and equalizing bit lines of the corresponding bit line pair to a prescribed precharge potential Vb1 (=(Vcc+Vss)/2 is provided.

DRAM memory block MBij further comprises a column selecting gate CSG provided for each of the DRAM bit line pairs DBL and turned on in response to a signal potential on column selecting line CSL for connecting the corresponding DRAM bit line pair DBL to a local I/O line pair LIO. A column selecting line CSL is commonly provided for two pairs of DRAM bit lines, and therefore, two DRAM bit line pairs DBL are selected simultaneously. In order to receive data from the simultaneously selected two pairs of DRAM bit lines, two pairs of local I/O lines, that is, LIOa and LIOb are provided.

Memory block MBij further comprises IO gates IOGa and IOGb responsive to a block activating signal ϕBA for connecting the local I/O line pairs LIOa and LIOb to global I/O line pairs GIOa and GlOb, respectively. Column selecting line CSL extends in the row direction over one column block shown in FIG. 12, and global I/O line pair GIOa and GIOb also extend in the row direction over one column block. Local I/O line pair LIOa and LIOb extend only in the column direction in one memory block.

I/O lines 16*a* and 16*b* in FIG. 11 correspond to local I/O line pair LIOa and LIOb, LIO gates IOGa and IOGb, and global I/O line pairs GIOa and GIOb, respectively.

SRAM comprises SRAM word lines SWL to each of which one row of SRAM cells SMCs are connected, SRAM bit line pairs SBL to each of which a column of SRAM cells SMCs are connected, and SRAM sense amplifiers SSA provided corresponding to the SRAM bit line pairs SBL for detecting and amplifying potential difference between the corresponding bit line pair. Bi-directional transfer gate 3 comprises bi-directional transfer gates BTGa and BTGb provided between SRAM bit line pair SBL and global I/O line pair GIO. Both of bi-directional transfer gates BTGa and BTGb transfer data between SRAM bit line pair SBL and global I/O line pairs GIOa and GIOb in response to data transfer designating signals ϕTSD and ϕTDS. Data transfer designating signal ϕTSD designates data transfer from SRAM portion to DRAM portion, while data transfer designating signal ϕTDS designates data transfer from DRAM portion to SRAM portion.

Figure 14:
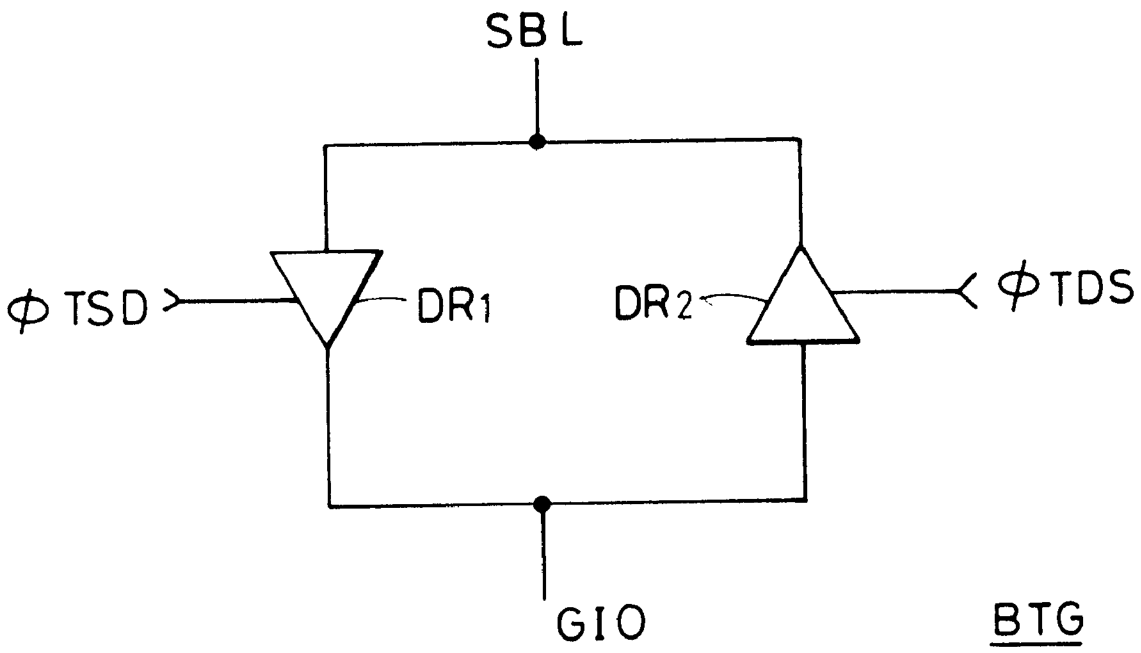
FIG. 14 shows one example of a bi-directional transfer gate structure shown in FIG. 13.

FIG. 14 shows one example of a structure of bi-directional transfer gate BTG. Referring to FIG. 14, bi-directional transfer gate BTG (BTGa or BTGb) comprises a drive circuit DR1 which is activated in response to data transfer designating signal ϕTSD for transmitting data on SRAM bit line pair SBL to global I/O line pair GIO, and a drive circuit DR2 which is activated in response to data transfer designating signal ϕTDS for transmitting data on global I/O line pair GIO to SRAM bit line pair SBL. Drive circuits DR1 and DR2 are set to an output high impedance state when data transfer designating signals ϕTSD and ϕTDS are inactive.

[Data Transfer Operation (I)]

Figure 15:
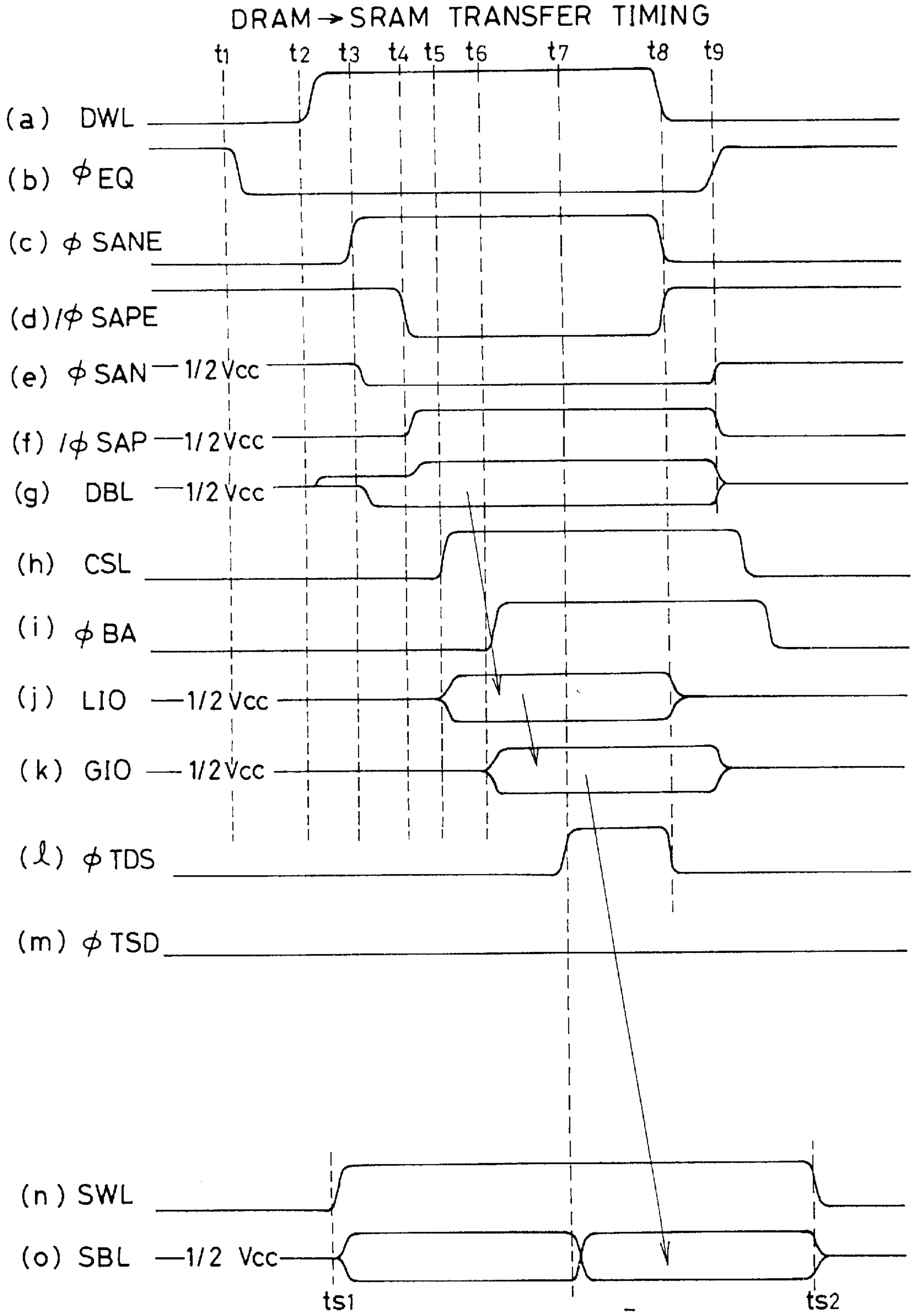
FIG. 15 is a diagram of signal waveforms showing the data transfer operation from the DRAM array to the SRAM in the semiconductor memory device shown in FIG. 12.

FIG. 15 is a diagram of signal waveforms showing operation when data are transferred from DRAM array to SRAM array. Data transfer operation from DRAM array to SRAM array will be described with reference to FIGS. 13 to 15.

While precharge designating signal ϕEQ is at an active state "H" before time T1, sense amplifier driving signal lines ϕSAN, /ϕSAP, local I/O line pair LIO and global I/O line pair GIO are maintained at a precharge potential of Vcc/2. At this time, precharge equalize circuit PE is activated to precharge DRAM bit line pair DBL to the precharge potential of Vcc/2 (=Vb1) and equalizes potentials of the bit lines BL, /BL.

When precharge designating signal ϕEQ falls at t1, precharge equalize circuit PE and equalize transistor TEQ are rendered inactive. Consequently, equalizing operation of the sense amplifier driving signal lines ϕSAN and/ϕSAP is completed, equalize/precharge operation of DRAM bit line pair DBL is stopped, and DRAM bit line pair DBL and sense amplifier driving signal lines ϕSAN and/ϕSAP are set to a floating state of the intermediate potential Vcc/2 (where Vss=0V).

Thereafter, in accordance with an externally applied address, row selecting operation is effected by row decoder 14 (see FIG. 12), one word line DWL is selected in DRAM array 1 (see FIG. 12) at t2, and potential of the selected word line DWL rises to "H". One row of memory cells connected to the selected word line DWL are connected to corresponding DRAM bit line pair DBL (DRAM bit line BL or /BL), and potential of respective DRAM bit lines changes dependent on data of the memory cell connected thereto. FIG. 15 shows potential change of a DRAM bit line pair DBL when a memory cell storing the potential "H" is selected.

At time t3, sense amplifier activating signal ϕSANE rises from ground potential Vss to the operational supply potential Vcc level, and transistor TR2 in sense amplifier activating circuit SAK is turned on. Consequently, the second sense amplifier portion in DRAM sense amplifier DSA is activated, and a bit line of lower potential of the DRAM bit line pair DBL is discharged to the level of the ground potential GND.

At time t4, sense amplifier activating signal/ϕSAPE falls from the potential Vcc to the ground potential GND level, and transistor TR1 in sense amplifier activating circuit SAK is turned on. Consequently, the first sense amplifier portion PDSA of DRAM sense amplifier DSA is activated, and the bit line of higher potential of the DRAM bit line pair DBL is charged to the level of the operational supply potential Vcc.

At time t5, in accordance with a column selecting signal from DRAM column decoder 15 (see FIG. 12), one column selecting line CSL is selected in each column block, and potential of the selected column selecting line CSL rises to "H". Consequently, two pairs of DRAM bit line pairs DBL are connected to local I/O line pairs (LIOa and LIOb) through the column selecting gate CSG. Consequently, potential on the selected DRAM bit line pair DBL is transmitted to local I/O line pair LIO, and potential of local I/O line pair changes from the precharge potential Vcc/2 according to the transmitted data.

At time t6, block activating signal ϕBA rises to "H" only for the selected row block, and I/O gate IOG is turned on. Consequently, signal potential on local I/O line pair LIO is transmitted to global I/O line pair GIO. "Selected row block" means a row block including the selected word line DWL. Designation of the selected row block is effected by decoding, for example, upper 2 bits of the row address used for selecting the DRAM word line. By such partial activation operation, current consumption can be reduced.

In SRAM, row selecting operation is done by SRAM row decoder 21 (see FIG. 12) at time ts1, one SRAM word line SWL is selected in SRAM array, and potential of the selected SRAM word line SWL rises to "H". Row selecting operation in DRAM and row selecting operation in SRAM are carried out in a synchronous manner. Data of SRAM cells connected to the SRAM word line SWL are transmitted to corresponding SRAM bit line pair SBL. Consequently, potential of SRAM bit line pair SBL changes from the precharge potential Vcc/2 to potential corresponding to the information stored in the corresponding SRAM cell.

At time t7, data transfer designating signal ϕTDS attains to and is maintained at "H" for a prescribed time period. Before t7, data of the DRAM cell has been already transmitted to the global I/O line pair GIO, and SRAM cells have been connected to SRAM bit line pairs SBL. In response to data transfer designating signal ϕTDS, bi-directional transfer gate BTG is activated and it transmits signal potential on global I/O line pair GIO to the corresponding SRAM bit line pair SBL. Consequently, data are transmitted from DRAM cell to SRAM cell.

Time relation between ts1 and t1 through t6 is arbitrary, provided that the time t7 at which data transfer designating signal ϕTDS is activated is after t6 at which block activating signal ϕBA rises and after ts1 at which SRAM word line SWL is selected. In this cycle, data transfer designating signal ϕTSD designating transfer from SRAM to DRAM is kept at inactive state, that is, "L".

At time t8, potential of the selected DRAM word line DWL falls to "L", at time ts2, potential of the selected SRAM word line SWL falls to "L", and various signals are returned to the initial state. Thus, the data transfer cycle from DRAM to SRAM is completed.

As described above, DRAM column decoder 15 (see FIG. 12) selects one column selecting line CSL in each column block 12. One column selecting line CSL selects two pairs of DRAM bit lines DBL. Data transfer from DRAM to SRAM is carried out column block by column block in parallel. Therefore, in the embodiment shown in the figure, 16 bits of data are transferred simultaneously. This relation is realized in a structure having 8 column blocks and in which two pairs of DRAM bit lines are selected in each column block. The number of bits of the data transferred at one time changes dependent on the number of DRAM bit line pairs selected at one time or dependent on the number of column blocks. Therefore, appropriate block size can be set.

As shown in FIG. 15, when DRAM word line driving signal DWL falls to "L" of the inactive state approximately at the time t8, data transfer designating signal ϕTDS falls to "L" in response. At this time t8, local I/O line pair LIO is disconnected from SRAM bit line pair SBL, and DRAM array and SRAM are electrically separated. After the time t8, DRAM portion and SRAM portion can operate independent from each other. Therefore, when data transfer designating signal ϕTDS is made inactive at time t8, the word line driving signal DWL in DRAM array is still maintained at the active state, that is, "H". At this time, the DRAM cannot be newly accessed externally, but SRAM array portion can be externally accessed.

Figure 16:
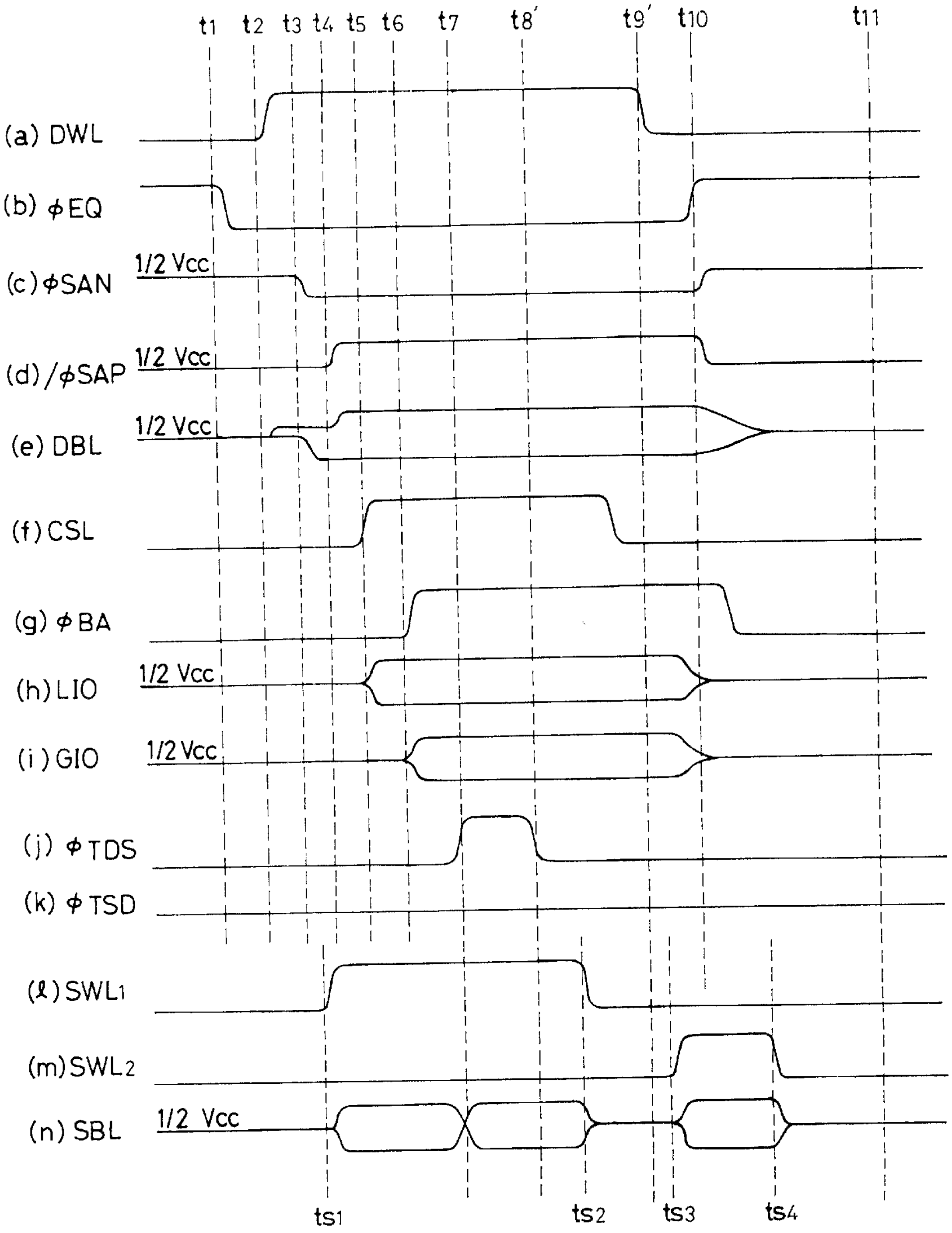
FIG. 16 is a diagram of signal waveforms showing a data transfer operation from the SRAM array to the DRAM array in the semiconductor memory device of FIG. 12.

FIG. 16 is a diagram of signal waveforms showing operations in data transfer rom SRAM to DRAM. The data transfer operation from SRAM to DRAM will be described with reference to FIGS. 13 and 16. The operation in the DRAM portion from t1 to t6 is the same as that in data transfer from the DRAM to SRAM shown in FIG. 15. As to the operation of the SRAM portion, potential of SRAM word line SWL rises to "H" at time ts1, as in the signal waveform of FIG. 15.

After the time ts1 and the time t6, that is, or after DRAM bit line pair DBL is connected to global I/O line pair GIO and SRAM cells (SMCs) are connected to SRAM bit line pairs SBLs, data transfer designating signal ϕTSD is activated and rises to "H" for a prescribed time period after t7. In response, bi-directional transfer gate BTG is activated and transmits signals on SRAM bit line pair SBL to DRAM bit line pair DBL through global I/O line pair GIO (GIOa, GIOb) and through local I/O line pair LIO (LIOa, LIOb). Consequently, data of the DRAM cells connected to the selected DRAM bit line pairs DBL are rewritten. Namely, data in the SRAM cells are transferred to the DRAM cells. In the data transfer cycle from SRAM array to DRAM array, data transfer designating signal ϕTDS is maintained at inactive state, that is, "L".

In this manner, by successively setting the signals ϕTSD and ϕTDS active, data transfer (copy back) from SRAM to DRAM and from DRAM to SRAM can be easily carried out regardless of the type of mapping.

[Specific Structure of Array Layout]

Figure 17:
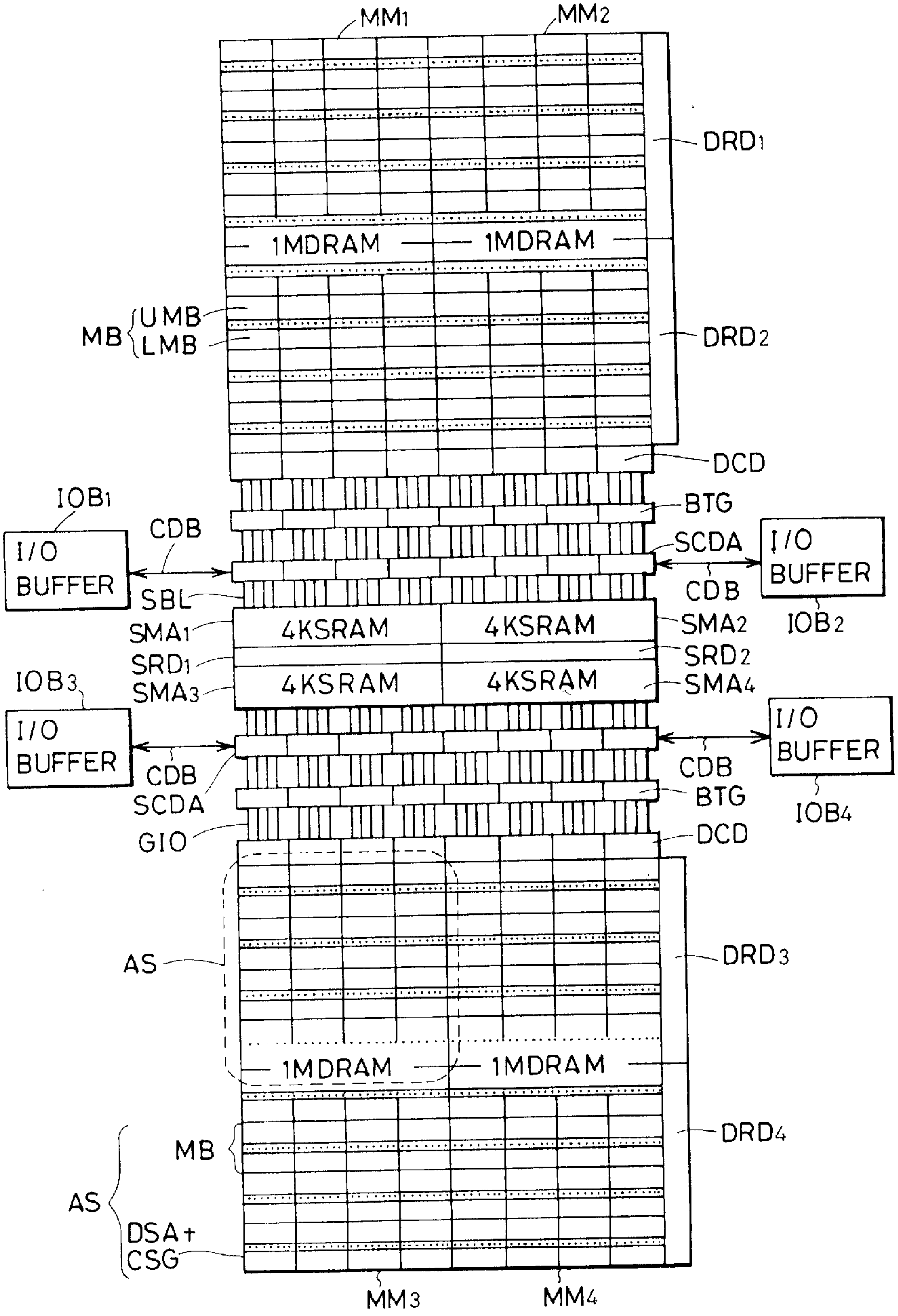
FIG. 17 shows a whole structure of a semiconductor memory device containing a cache in accordance with another embodiment of the present invention.

FIG. 17 shows a layout of an array in a semiconductor memory device in accordance with another embodiment of the present invention. A CDRAM shown in FIG. 17 includes a 4M bit DRAM array and a 16K bit SRAM array. More specifically, the CDRAM of FIG. 17 includes 4 CDRAMs shown in FIG. 12. Referring to FIG. 17, the CDRAM includes four memory mats MM1, MM2, MM3 and MM4 each having the storage capacity of 1M bit. Each of the DRAM memory mats MM1 to MM4 includes a memory cell arrangement of 1024 rows (word lines) by 512 columns (bit line pairs). Each of the DRAM memory mats MM1 to MM4 is divided into 32 memory blocks MBs each having a structure of 128 columns (bit line pais)×256 rows (word lines).

One memory mat MM is divided into 4 memory blocks in the row direction, and into 8 blocks in the column direction. As shown in FIG. 17, a 1M bit memory mat is divided into 8 in the column direction and 4 in the row direction, different from the arrangement of the DRAM of FIG. 12, in order to house the device in a rectangular package, as will be described later. Sense amplifiers DSA for DRAMs and column selecting gates CSG are arranged corresponding to respective bit line pairs DBL at the central portion in the column direction of the memory blocks MB. A memory block MB is divided into an upper memory block UMB and a lower memory block LMB with the sense amplifier DSA and column selecting gate CSG positioned at the center. In operation, either the upper memory block UMB or the lower memory block LMB is connected to the sense amplifier DSA and to the column selecting gate CSG. Whether the upper memory block UMB or lower memory block LMB is to be connected to sense amplifier DSA and column selecting gate CSG is determined by an address. Such a structure in which one memory block MB is divided into upper and lower two memory blocks UMB and LMB and one of the two blocks is connected to sense amplifier DSA and to column selecting gate CSG is commonly used in DRAMs having shared sense amplifier structure having the storage capacity larger than 4M bits.

Figure 1:
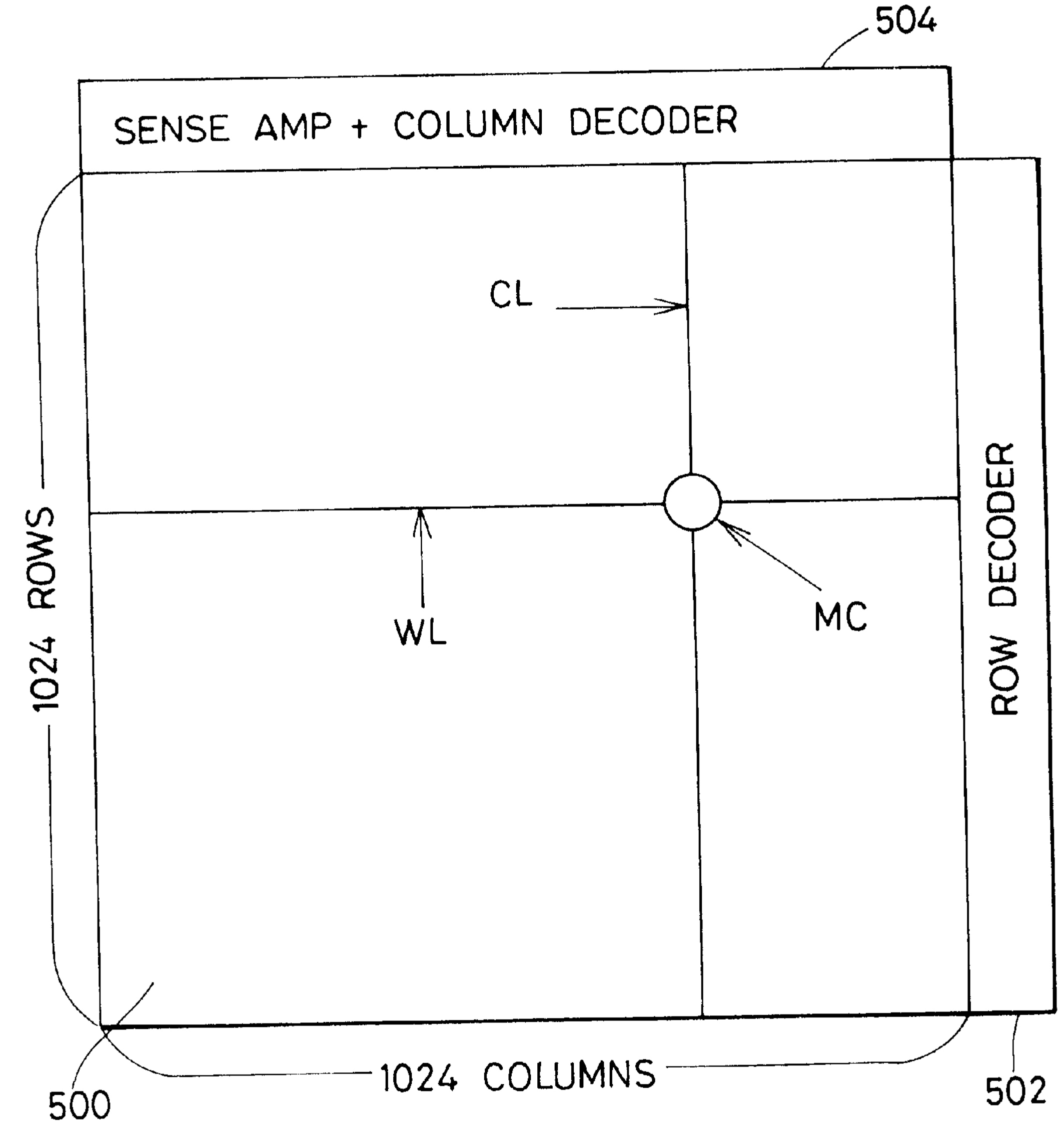
FIG. 1 shows an array structure of a conventional 1M bit DRAM.
Figure 2:
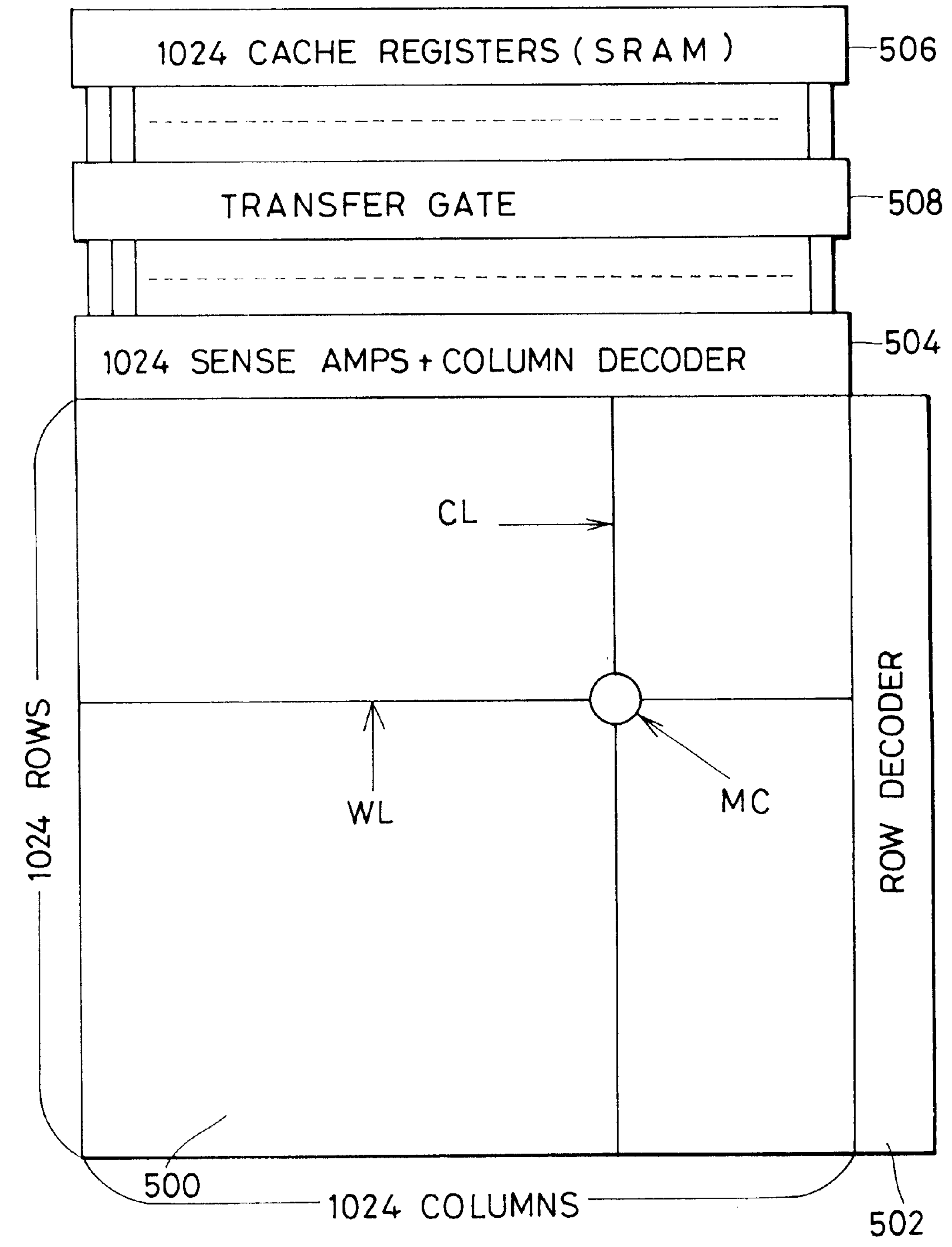
FIG. 2 shows an array arrangement of a conventional semiconductor memory device containing a cache.
Figure 3:
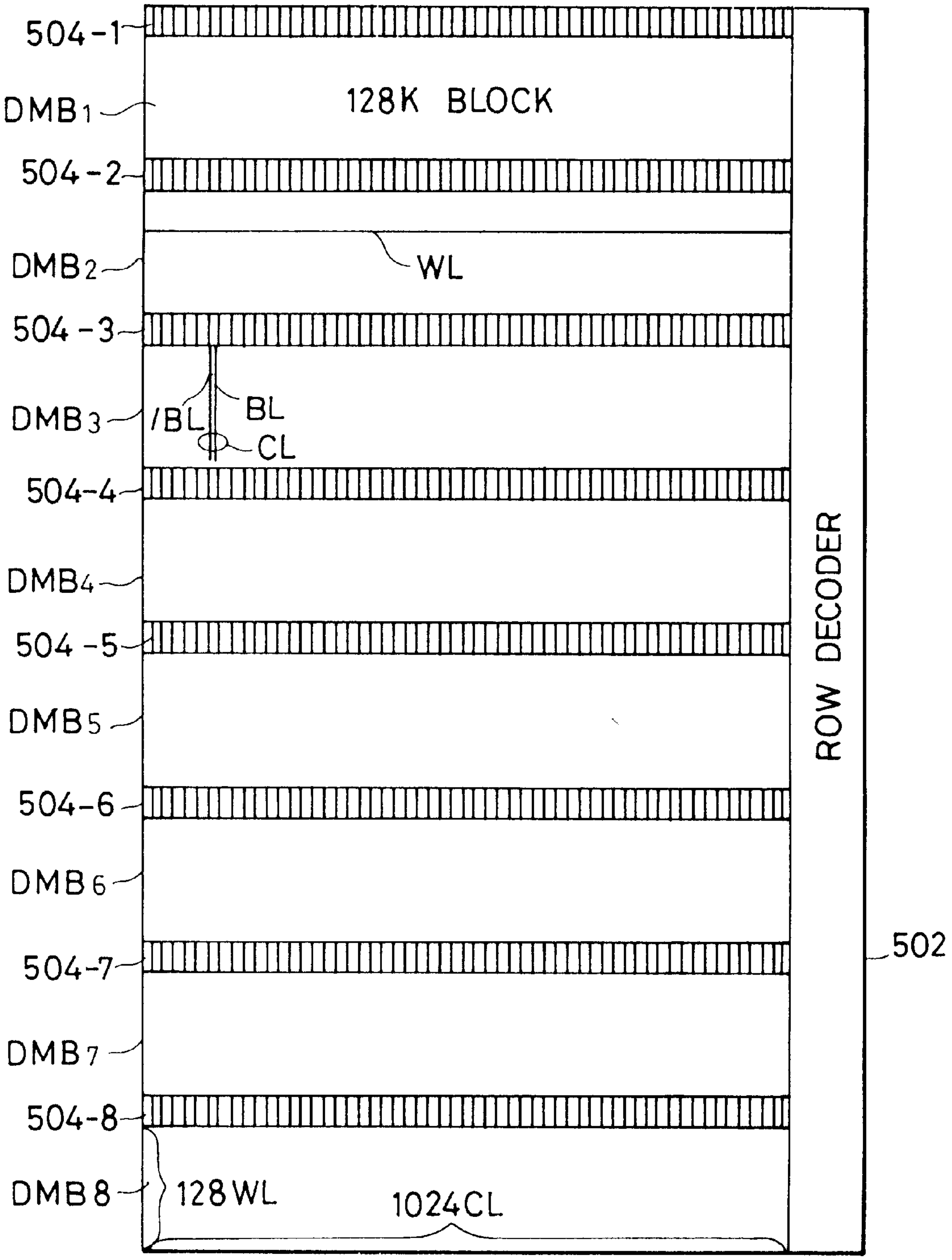
FIG. 3 shows a specific arrangement of a conventional 1M bit DRAM as an example.
Figure 4:
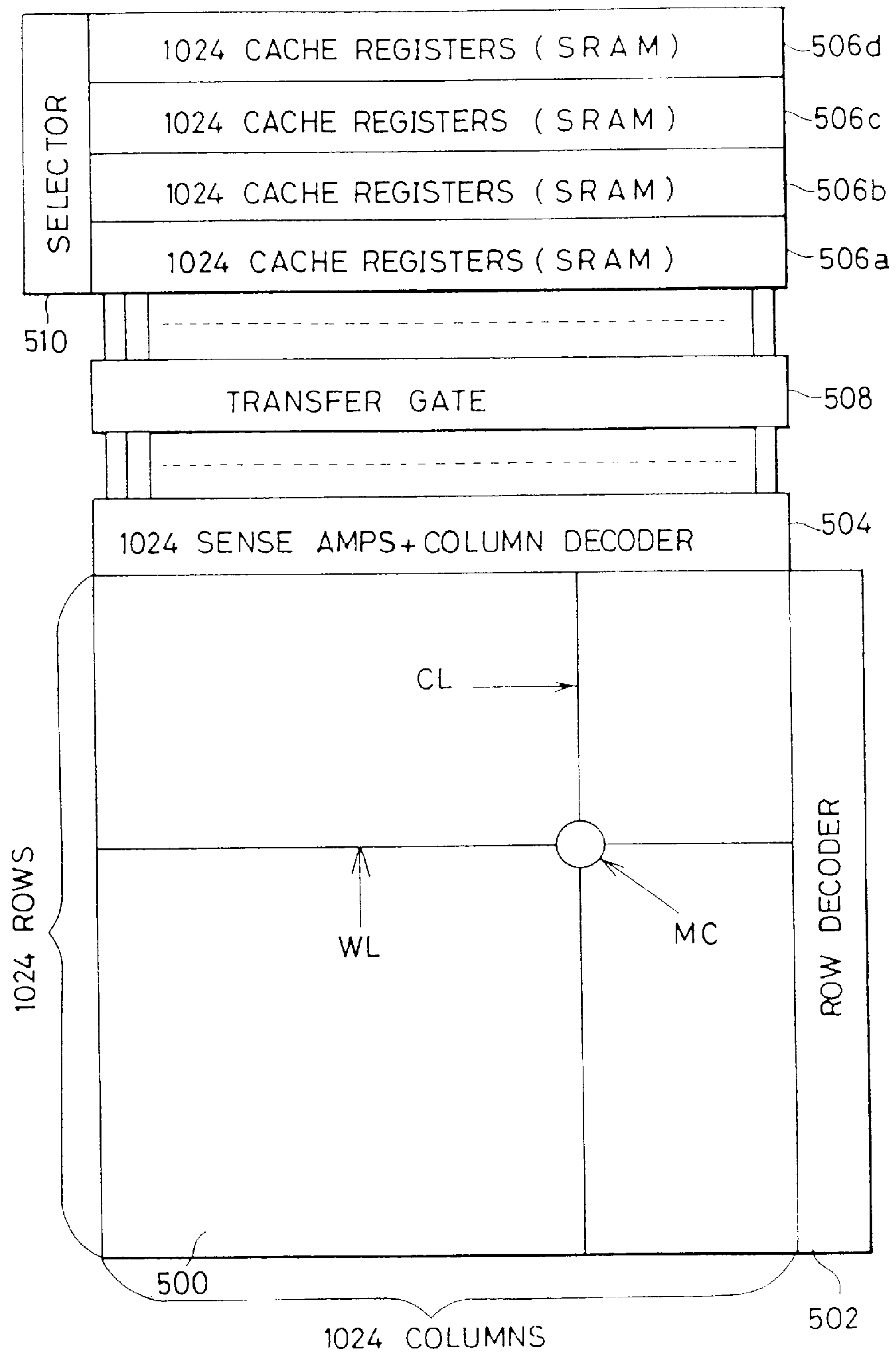
FIG. 4 shows an array arrangement for a prior art 4 way set associative method in a conventional semiconductor memory device containing a cache.
Figure 5:
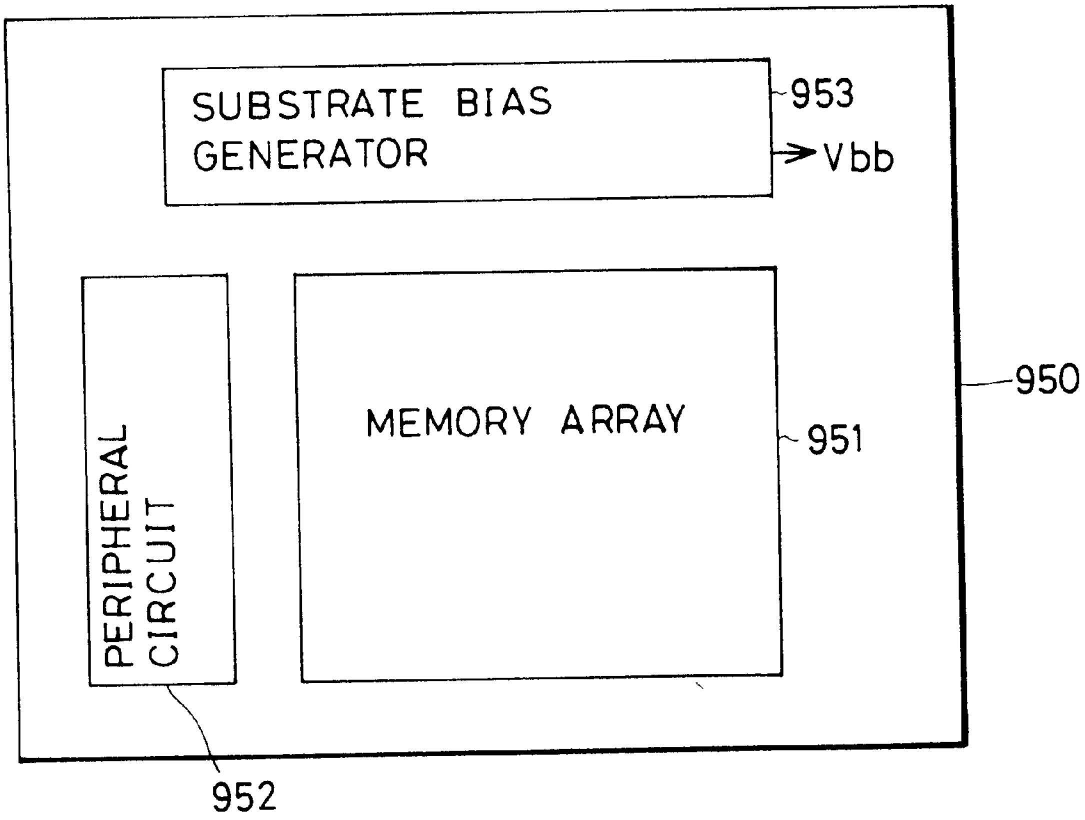
FIG. 5 schematically shows a whole structure of conventional semiconductor memory device having an on chip substrate bias generating circuit.
Figure 6:
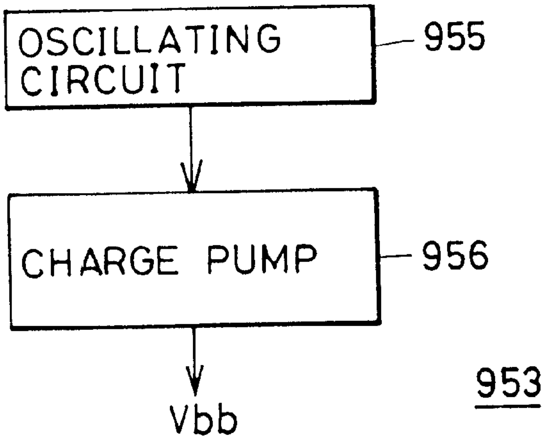
FIG. 6 shows specific structure of the substrate bias generating circuit shown in FIG. 5.
Figure 7:
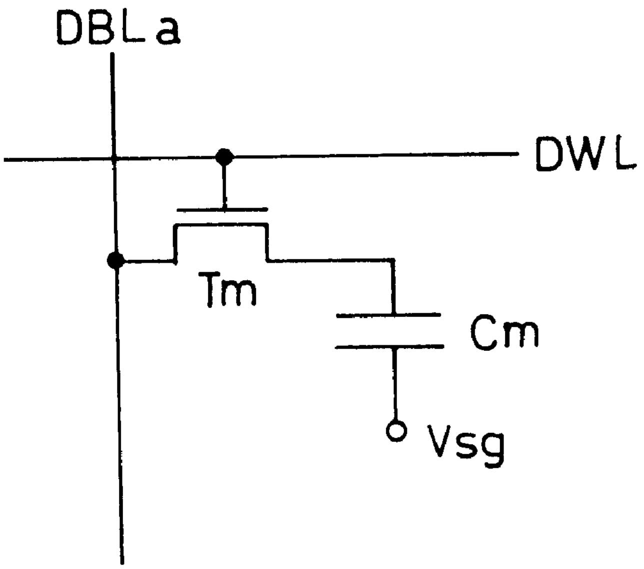
FIG. 7 shows a structure of a general DRAM memory cell.
Figure 8:
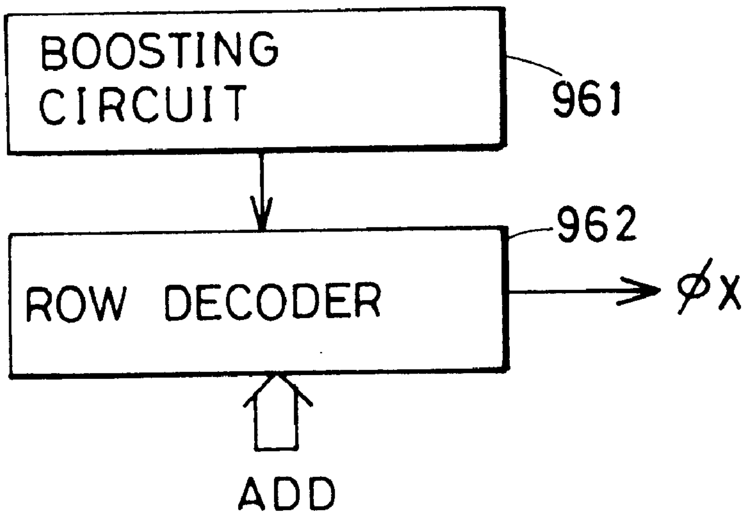
FIG. 8 shows a conventional circuit structure for generating a boosted word line driving signal.

One memory mat MM includes two activation sections AS. One word line is selected in one activation section. Different from the structure shown in FIG. 5, one word line is divided into two and allotted to respective activation sections in the structure of FIG. 17. Namely, selection of one word line in one memory mat MM is equivalent to selection of one word line in each activation section AS.

The semiconductor device (CDRAM) further comprises 4 DRAM row decoders DRD1, DRD2, DRD3 and DRD4 for selecting one word line from each of four DRAM memory mats MM1 to MM4. Therefore, in the CDRAM shown in FIG. 17, 4 word lines are selected at one time. DRAM row decoder DRD1 selects one row from corresponding activation sections AS of the memory mats MM1 and MM2. DRAM row decoder DRD2 selects one row from lower activation sections AS of memory mats MM1 and MM2. DRAM row decoders DRD3 and DRD4 select one row from upper activation sections AS of DRAM memory mats MM3 and MM4 and from lower activation sections AS of this memory mat, respectively.

The CDRAM further comprises DRAM column decoders DCD for selecting two columns (bit line pairs) from each of the column blocks of memory mats MM1 to MM4 of the DRAM. Column selection signal from the DRAM column decoder DCD is transmitted to a column selection line CSL shown in FIG. 12. A column selection line CSL extends to be shared by the upper and lower activation sections AS. Therefore, in the structure shown in FIG. 17, 4 columns are selected from one column block (in FIG. 17, a block including 8 memory blocks MBs divided in the column direction), by the column selection signal from DRAM column decoder DCD.

Columns selected by column decoder DCD are connected to corresponding global I/O line pairs GIO. Two pairs of global I/O lines GIO extend commonly in the column direction in each column block in one activation section. Connection between the global I/O line pair GIO and local I/O line pair LIO in each column block will be described in detail later.

CDRAM shown in FIG. 17 further includes SRAM array blocks SMAL SMA4 each formed of SRAM cells having the capacity of 4K bit. Row decoders SRD1 and SRD2 for SRAM are provided at a middle portion between 2 SRAM array blocks to be shared by two SRAM array blocks. SRAM row decoder SRD1 is commonly used by SRAM array blocks SMAL and SMA3. SRAM row decoder SRD2 is commonly used by SRAM array blocks SMA2 and SMA4. Details of the structure of SRAM array block SMA will be described in detail later.

The CDRAM includes 4 input/output buffer circuits IOB1, IOB2, IOB3 and IOB4 for carrying out input/output of data 4 bits by 4 bits. Input/output buffer circuits IOB1 to IOB4 are connected to blocks SCDA of sense amplifiers and column decoders for SRAM, through common data buses (internal data buses), respectively. In the structure shown in FIG. 17, input/output of data are shown to be carried out through the sense amplifier and column decoder block SCDA for the SRAM. However, input/output of data may be carried out through the portion of bi-directional transfer gates BTG.

In operation, one word line is selected in each activation section. Only a row block including the selected word line is activated. Other row blocks are maintained at the pre-charge state. In the selected row block, only a small block UMB (or LMB) including the selected word line is connected to the sense amplifier DSA and column selecting gate CSG for DRAM, and the other small memory block LMB (or UMB) in the selected block is separated from sense amplifier DSA and column selecting gate CSG for DRAM. Therefore, as a whole, activation (charge/discharge) of ⅛ bit lines is effected. By this partial activation operation, power consumption associated with charging/discharging of the bit line can be reduced. In addition, by dividing one memory block MB into an upper memory block UMB and a lower memory block LMB and by arranging a sense amplifier DSA at the center, the bit line can be made shorter, the ratio Cb/Cs of bit line capacitance Cb to memory capacitor capacitance Cs can be reduced, and sufficient reading voltage can be obtained at high speed.

In each activation section AS, sensing operation in 4 small blocks UMB (or LMB) in the row direction is carried out. In each activation section AS, two pairs of bit lines are selected in one column block by a column selection signal from DRAM column decoder DCD. Global I/O line pair GIO extends in the column direction to be shared by column blocks in each activation section AS. Two pairs of bit lines are selected from each column block in each activation section AS and connected to corresponding two pairs of global I/O lines GIO. 4 pairs of global I/O lines GIO are connected to one bidirectional transfer gate BTG. 4 bi-directional transfer gates BTG are provided for one memory mat MM. Therefore, 16 pairs of global I/O lines GIO can be connected to SRAM bit line pairs SBL of the corresponding SRAM array from one memory mat MM. Layout of the global I/O lines will be described.

Figure 18:
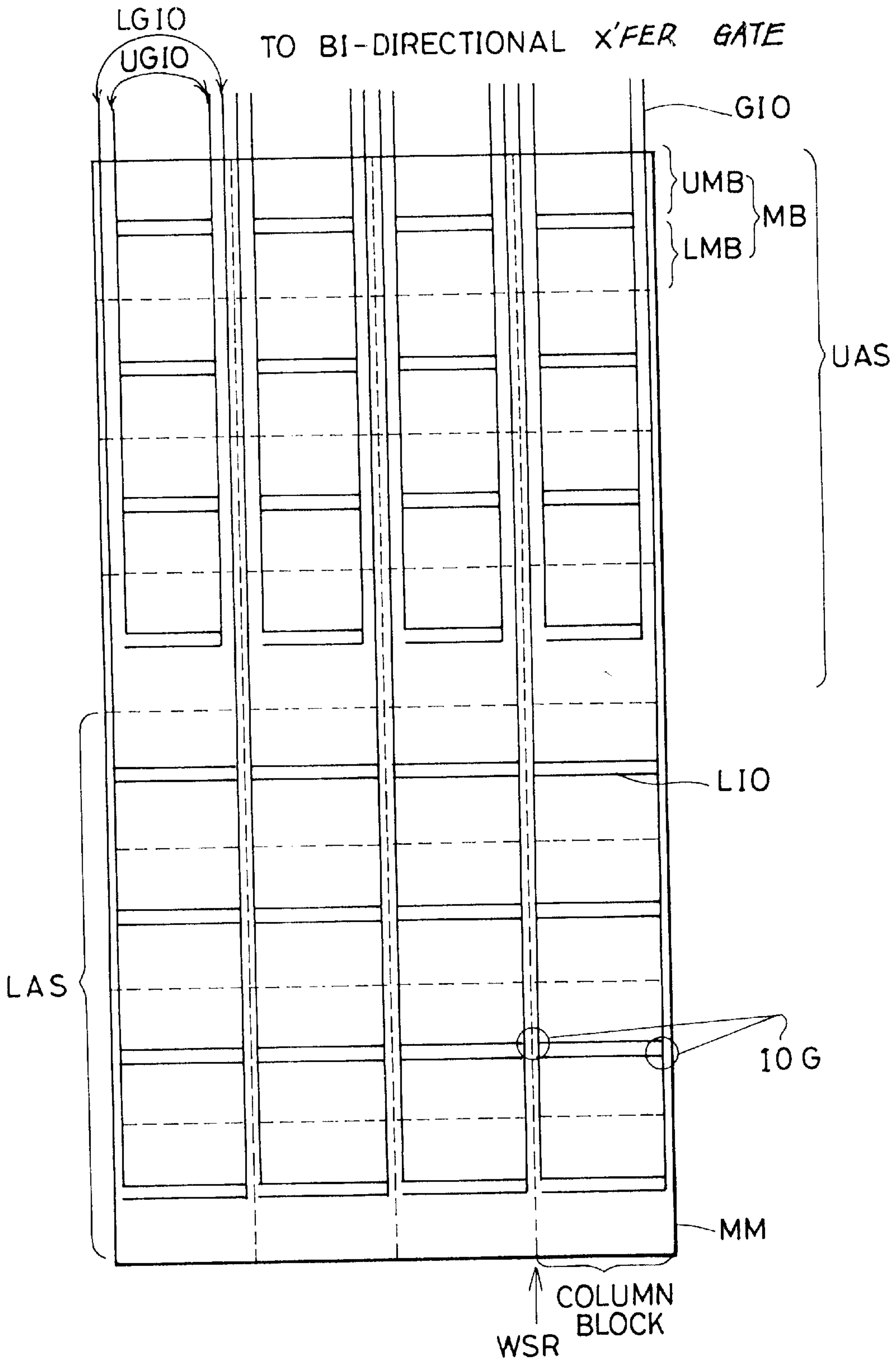
FIG. 18 shows an arrangement of a global I/O line and a local I/O line in the semiconductor memory device shown in FIG. 17.

FIG. 18 shows arrangement of global I/O lines for one memory mat. Referring to FIG. 18, the global I/O line pair GIO includes an upper global I/O line pair UGIO provided for an upper activation section UAS and a lower global I/O line pair LGIO provided for a lower activation section LAS. The upper global I/O line pair UGIO and the lower global I/O line pair LGIO are arranged in parallel. Lower global I/O line pair GIO passes through upper activation section UAS but is not connected to local I/O line pair LIO in the upper activation section UAS. Global I/O line pair GIO and local I/O line pair LIO are connected through an IO gate IOG which is a block selecting switch. Only an IO gate IOG provided in the row block including the selected word line is turned on by a block selecting signal ϕBA and connects the corresponding local I/O line pair LIO to the corresponding global I/O line pair GIO.

Since DRAM sense amplifier DSA and column selecting gate CSG are arranged at the central portion in the column direction of the memory block MB, local I/O line pair LIO is arranged along the row direction at the central portion in the column direction of memory block MB.

A word line shunt region WSR is provided in the column direction between adjacent column blocks. A word line shunt region WSR is used to provide a contact between a word line formed of polysilicon having relatively high resistance and an aluminum interconnection having low resistance. The word line shunt region will be described briefly.

Figure 19:
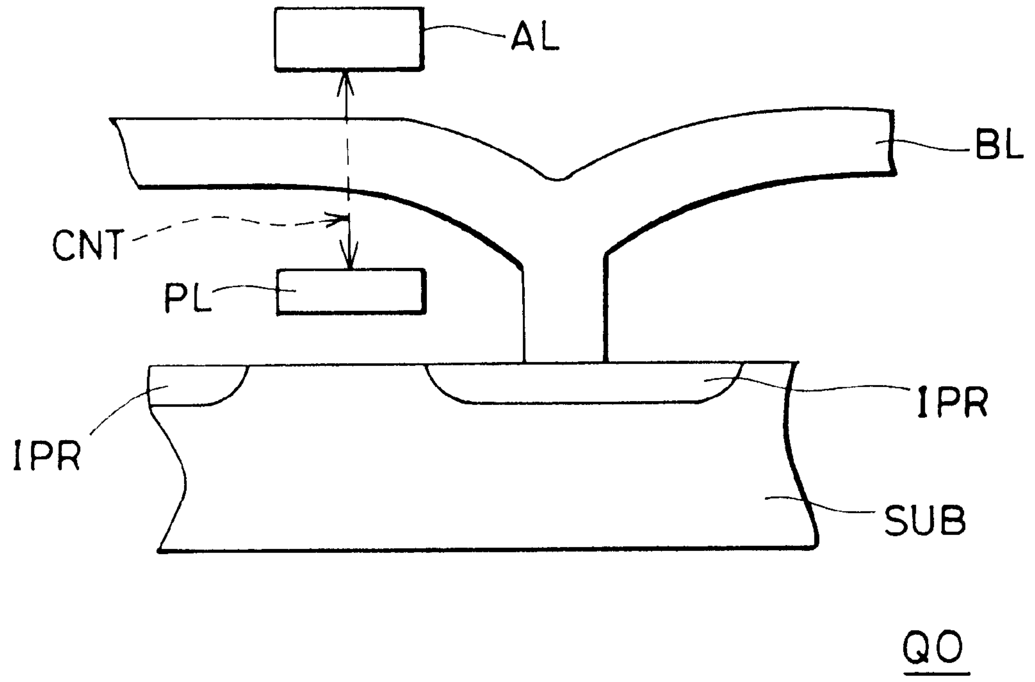
FIG. 19 is a cross sectional view of a memory cell transistor potion included in the DRAM cell.

FIG. 19 schematically shows a cross sectional structure of a selecting transistor Q0 (see FIG. 13) included in a DRAM cell. Referring to FIG. 19, the selecting transistor Q0 includes impurity regions IPR formed at a surface of a semiconductor substrate SUB, a bit line BL connected to one impurity region IPR, and a polysilicon layer PL formed on the surface of the semiconductor substrate between the two impurity regions IPR. When a word line driving signal DWL (the signal line and the signal transmitted thereon are represented by the same reference character) is transmitted to the polysilicon layer PL, a channel is formed at the surface of the semiconductor substrate between the impurity regions IPR, and the selecting transistor Q0 is turned on. Polysilicon has relatively high resistance. If word line DWL has high resistance, a signal delay is generated due to the resistance of polysilicon. In order to lower the resistance of the word line DWL, an aluminum interconnection AL having low resistance is provide in parallel to the polysilicon layer PL. By periodically connecting the aluminum interconnection AL and the polysilicon layer PL at appropriate intervals, the resistance of the word line DWL can be reduced. Aluminum interconnection AL is formed above the bit line BL. Therefore, a region for providing contact between polysilicon layer PL and aluminum interconnection AL must be provided at a region where there is no bit line BL (/BL), that is, a region where memory cell is not arranged. For this purpose, a word line shunt region is provided between column blocks. The manner of connection is shown in FIG. 20.

Figure 20:
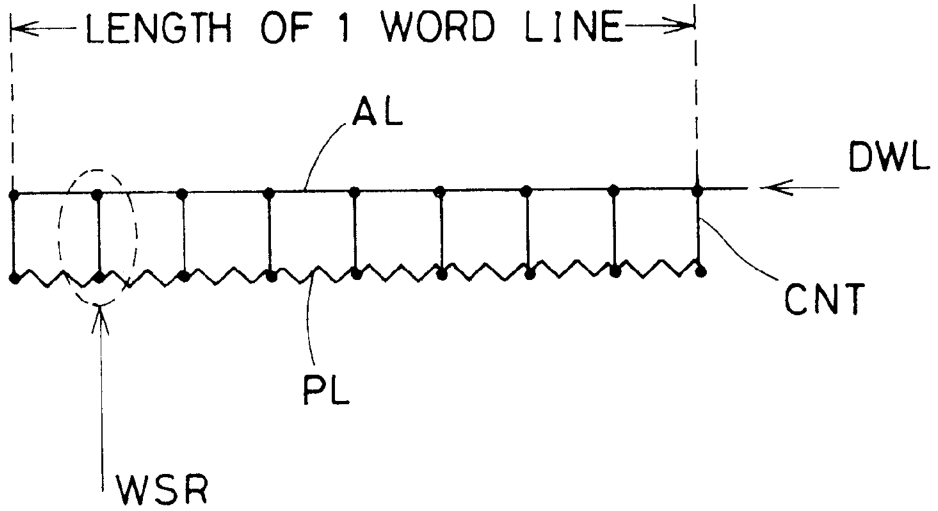
FIG. 20 shows a relation between a word line shunt region and a polysilicon word line lined with aluminum.

Referring to FIG. 20, aluminum interconnection AL having low resistance is provided in parallel to polysilicon layer PL having relatively high resistance serving as a word line. Word line driving signal DWL is transmitted to aluminum interconnection AL. Aluminum interconnection AL and polysilicon layer PL are periodically connected to each other by a contact layer CNT in word line shunt region WSR. By periodically providing contacts between aluminum interconnection AL and polysilicon layer PL through contact region CNT, the resistance of polysilicon layer PL can be effectively reduced. Therefore, even if a word line is very long, the word line driving signal WL can be transmitted to the terminal end of the word line at high speed.

Figure 21:
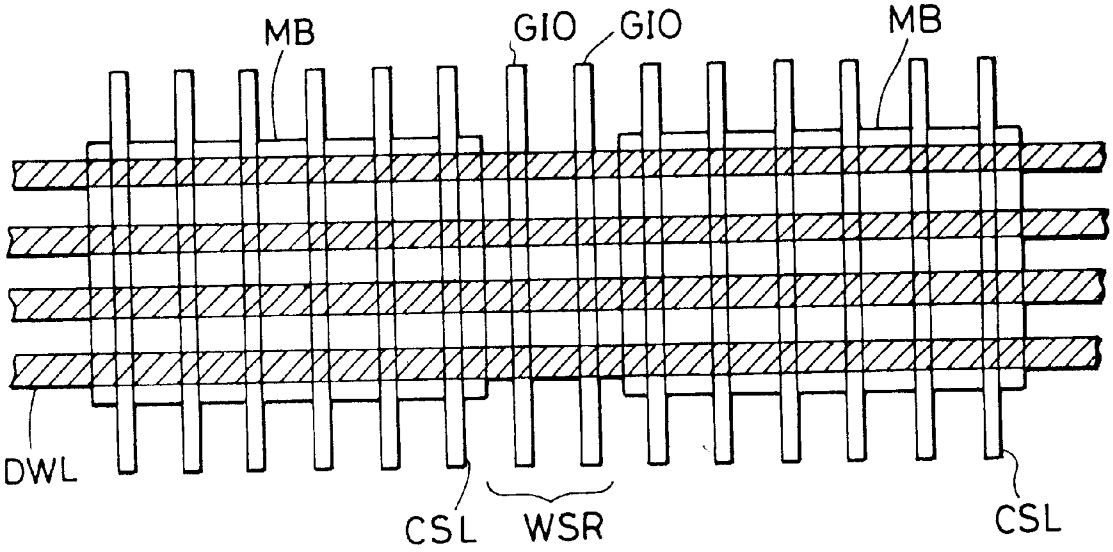
FIG. 21 is a plan view showing a layout of the global I/O line, column selecting lines and DRAM word lines in the semiconductor memory device in accordance with the present invention.

FIG. 21 schematically shows a layout of global I/O lines and column selecting lines CSL. In FIG. 21, layout of these lines for two memory blocks MB only is shown. In FIG. 21, global I/O line pair GIO is arranged in word line shunt region WSR. DRAM word lines DWL are arranged in a direction orthogonally crossing the global I/O line pair GIO. In FIG. 21, aluminum interconnection AL and polysilicon layer are arranged in parallel to each other, and in this plan view, they are overlapped with each other. Therefore, they are shown as the same word lines DWL. Column selecting lines CSL for transmitting column selection signal from DRAM column decoder are arranged in a direction orthogonally crossing DRAM word lines DWL.

Although the bit line pairs DBL of DRAM are not shown in this layout, the bit line pairs are arranged in parallel to column selecting lines CSL. Aluminum interconnection AL (see FIG. 20) for DRAM word lines DWL is formed by a first layer aluminum interconnection. Column selecting lines CSl are formed by a second layer aluminum interconnection. Global I/O lines are formed by the same aluminum interconnection as the column selecting lines CSL. By providing global I/O line pair GIO in word line shunt region WSR, chip area is not increased even if I/O lines for connecting DRAM array and bi-directional transfer gates are adapted to have hierarchical structure of local I/O lines and global I/O lines.

Figure 22:
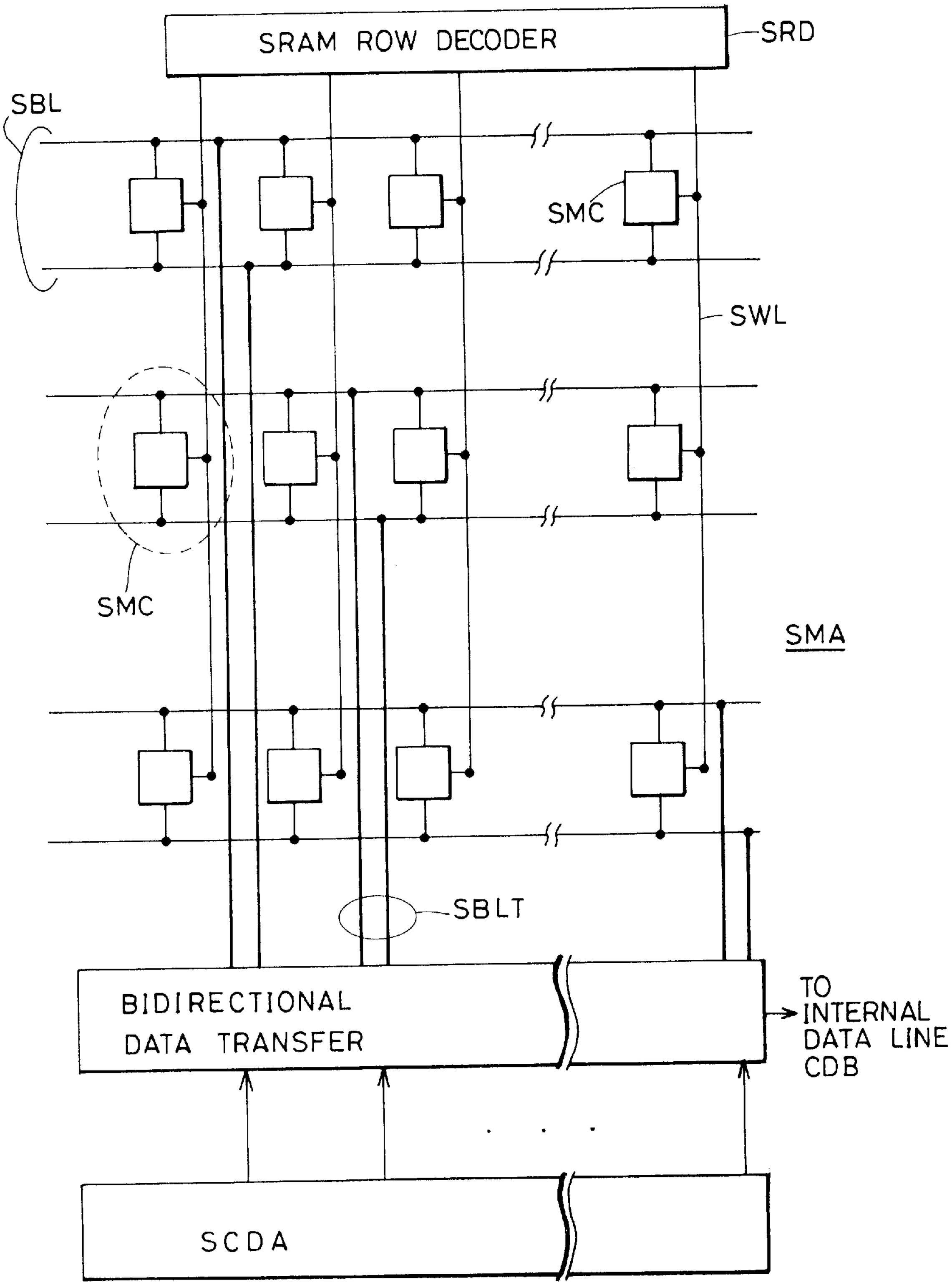
FIG. 22 shows a structure of one block of the SRAM array shown in FIG. 17.

FIG. 22 schematically shows a structure of SRAM array block SMA shown in FIG. 11. Referring to FIG. 22, a SRAM array block SMA includes 16 pairs of bit lines SBL and 256 SRAM word lines SWL. SRAM cells SMC are arranged at crossings of SRAM bit line pairs SBL and SRAM word lines SWL. As shown in FIG. 17, in order to have the SRAM array block SMA accordant with a rectangular chip layout, SRAM bit line pairs SBL are arranged in the row direction of DRAM array and SRAM word lines SWL are arranged in column direction of DRAM array. SRAM word lines SWL are connected to SRAM row decoder SRD.

SRAM bit line pairs SBL must be connected to global I/O line pair GIO through bi-directional transfer gate BTG. Therefore, SRAM bit line pairs SBL must be connected to bi-directional transfer gate BTG on the lower side as viewed in FIG. 22 (or upper side of FIG. 22: determined by the arrangement of the memory array). For this purpose, in the structure shown in FIG. 22, SRAM bit line taking lines SBLT are arranged in parallel to SRAM word lines SWL. The number of SRAM bit line taking lines SBLT is the same as the number of bit line pairs SBL of the SRAM array block SMA, and the taking lines are connected to corresponding SRAM bit line pairs SBL. If SRAM bit line taking lines SBLT are formed by the same interconnection layer as SRAM word lines SWL, SRAM bit line taking lines SBLT can be implemented easily without additionally providing interconnection layer formed by additional step of manufacturing. The SRAM row decoder SRD decodes a row address for SRAM to select one of the 256 SRAM word lines SWL. 16 bits of SRAM cells SMC connected to the selected SRAM word line SWL are connected to corresponding SRAM bit line pair SBL and to SRAM bit line taking line SBLT. In data transfer, the bit line taking lines SBLT are connected to global I/O line pair GIO through bi-directional transfer gate BTG.

By employing such a layout as shown in FIGS. 18 and 22, a structure as shown in FIG. 17 can be realized, in which DRAM arrays are arranged divided into upper and lower portions as viewed in the figure, SRAM arrays are collectively arranged between the upper and lower DRAM array blocks, and input/output buffer circuits IOB1 to IOB4 are provided near SRAM arrays formed at the central portion of the semiconductor memory device (chip). Such structure having SRAM arrays collectively or concentratedly formed at the central portion of the chip and input/output of data are effected near the central portion of the chip is advantageous for CDRAM as will be described in the following.

High speed access to the cache register is the first and most important characteristic of CDRAM. Arrangement of the SRAM array serving as the cache register near the input/output buffer for inputting/outputting data to and from an outside of the device results in shorter signal lines, which enables high speed input/output of data, and thus meets the demand of high speed accessing.

By collectively arranging SRAM arrays at the central portion, address lines for selecting SRAM cells can be made shorter. If an address line is made shorter, interconnection resistance and parasitic capacitance of the address line can be reduced, SRAM cells can be selected at high speed, and therefore it is suitable for high speed accessing to the cache register.

In the architecture shown in FIG. 17, interconnections connecting the DRAM array and SRAM array may be longer, lowering possibly speed of data transfer between the DRAM array and SRAM array. However, data transfer is carried out between DRAM array and SRAM array only when a cache miss (miss hit) occurs. In that case, access speed as low as that of the standard DRAM is sufficient, and it is not very much desired to increase this access speed. Therefore, this is not a problem in practical use.

[Pin Arrangement]

Figure 23:
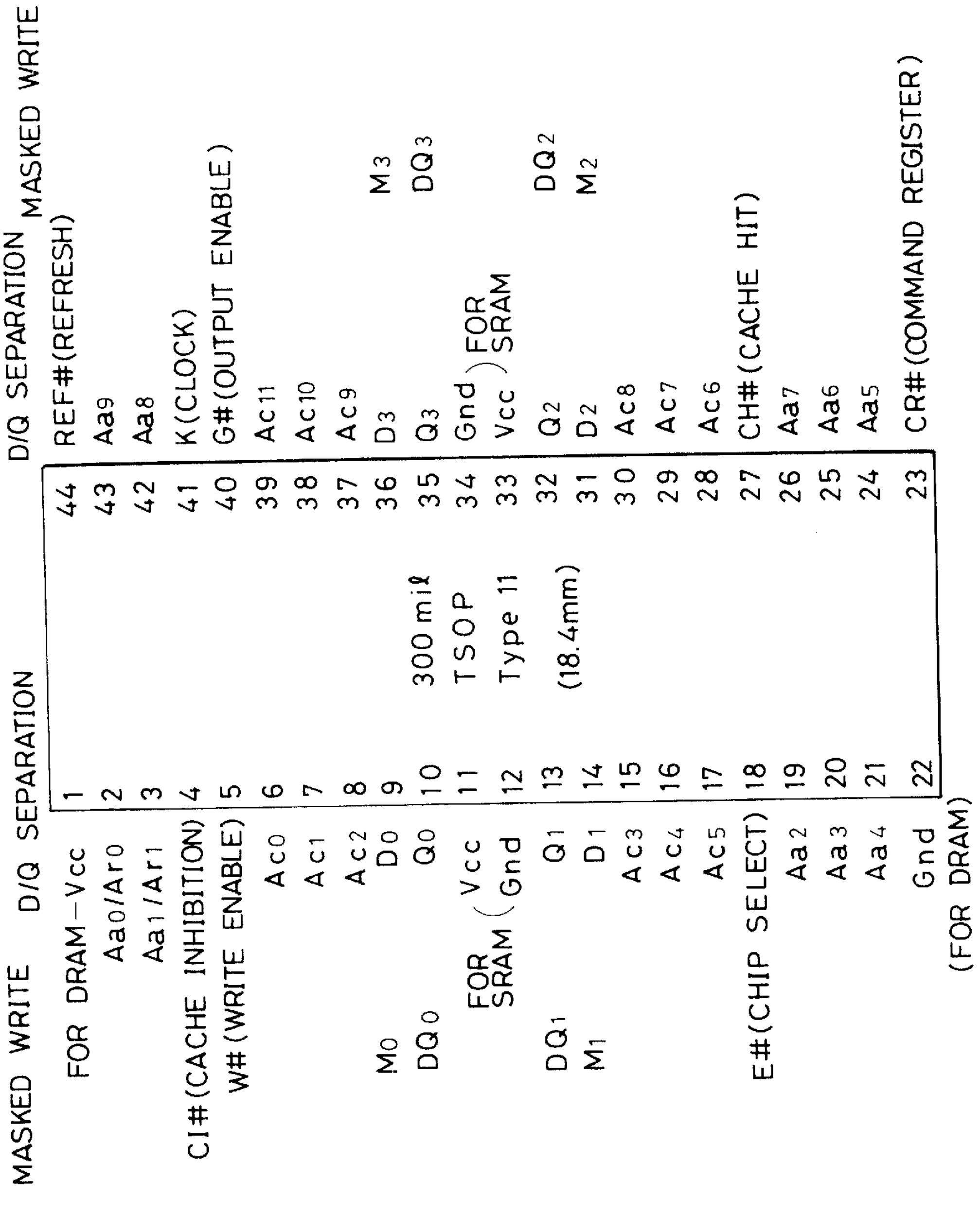
FIG. 23 shows one example of pin arrangement of a package containing the semiconductor memory device of FIG. 18.

FIG. 23 shows one example of pin arrangement of a package housing the CDRAM in accordance with the present invention. The SDRAM is housed in a 300 mil TSOP (Thin Small Outline Package) of type II with lead pitch of 0.8 mm, chip length of 18.4 mm and 44 pins. The CDRAM has two data input/output methods, that is, D/Q separation and masked write. D/Q separation is a method of inputting/outputting write data D and output data Q through separate pins. Masked writing is an operation mode in which write data D and read data Q are output through the same pin terminal, and writing of external data can be masked.

In order to effectively supply the supply voltage to CDRAM and to facilitate layout of power supply interconnection, three pins are provided for each of the supply potential Vcc and Gnd. More specifically, external supply potential Vcc is supplied to pins of the pin numbers 1, 11 and 33. The supply potential Vcc supplied to the pins 1, 11 and 33 may have the same voltage values as the operational supply potential Vcc. Alternatively, the external supply potential Vcc supplied to the pins 1, 11 and 33 may be lowered in the device to supply the operational supply potential. The ground potential Gnd is supplied to the pins of the numbers 12, 22 and 34. Power pins of pin numbers 11, 12, 33 and 34 are employed for SRAM and power pins of pin numbers 1 and 22 are employed for DRAM.

Addresses Ac0 to Ac11 for SRAM are applied to the pins having the numbers 6 to 8, 15 to 17, 28 to 30 and 37 to 39. Addresses Aa0 Aa9 for DRAM are applied to pin terminals having the numbers 2, 3, 19 to 21, 24 to 26 and 42 and 43. Command addresses Ar0 and Ar1 for designating a special mode, which will be described later, are also applied to the pins of the pin numbers 2 and 3. A cache inhibiting signal CI# indicating cache access inhibition is applied to a pin terminal of the number 4. When the cache inhibition signal CI# is set to "L", access to the SRAM array is inhibited, and direct access (array access) to the DRAM array is allowed. A write enable signal W# indicating data writing mode is applied to the pin 5. A chip select signal E# indicating that this chip is selected, is applied to a pin of the number 18.

A command register designating signal CR# for designating the special mode is applied to a pin of the pin number 23. When the command register designating signal CR# is "L", command addresses Ar0 and Ar1 applied to the pins of the numbers 2 and 3 are rendered valid, enabling setting of the special mode.

A cache hit signal CH# indicating a cache hit is applied to a pin of the pin number 27. If the cache hit signal CH# is "L", access to the cache (SRAM) is possible. An output enable signal G# indicating an output mode is applied to a pin of the number 40. A clock signal K is applied to the pin of the number 41. A refresh designating signal REF# designating refreshing of the DRAM array is applied to a pin 44. When the refresh designating signal REF# attains to "L", automatic refreshing of the DRAM array inside is carried out in the cycle.

Different data are applied to the pins of the numbers 9, 10, 13, 14, 31, 32, 35 and 36 dependent on the two different operation modes, that is, D/Q separation and masked write. The operation modes of D/Q separation and masked write are set by a command register (which will be described later).

In masked write mode, pins of the numbers 10, 13, 32 and 35 are used as common data input/output terminals for commonly carrying out data input/output. Pins of the numbers 9, 14, 31, 35 and 36 receive masked write designating data M0, M1, M2 and M3 for indicating which data applied to which input/output pins should be masked, respectively.

In D/Q separation mode, pins of the numbers 9, 14, 31 and 36 are used as pins for inputting write data DO, Dl, D2 and D3. Pins of the numbers 10, 13, 32 and 35 are used as data output pins for outputting read data Q0, Q1, Q2 and Q3.

As to SRAM addresses Ac0 to Ac11, row and column addresses are simultaneously applied in non-multiplexed manner. As to the DRAM addressees (array addresses) Aa0 to Aa9, the row addresses and column addresses are applied multiplexed. In the pin arrangement shown in FIG. 17, row address strobe signal/RAS and column address strobe signal/CAS which are normally used in a standard DRAM are not used. In the CDRAM in accordance with the present invention, input of control signals and data are carried out in response to a rising edge of an external clock K.

[Connection Between BTG and Internal Data Line I]

Figure 24:
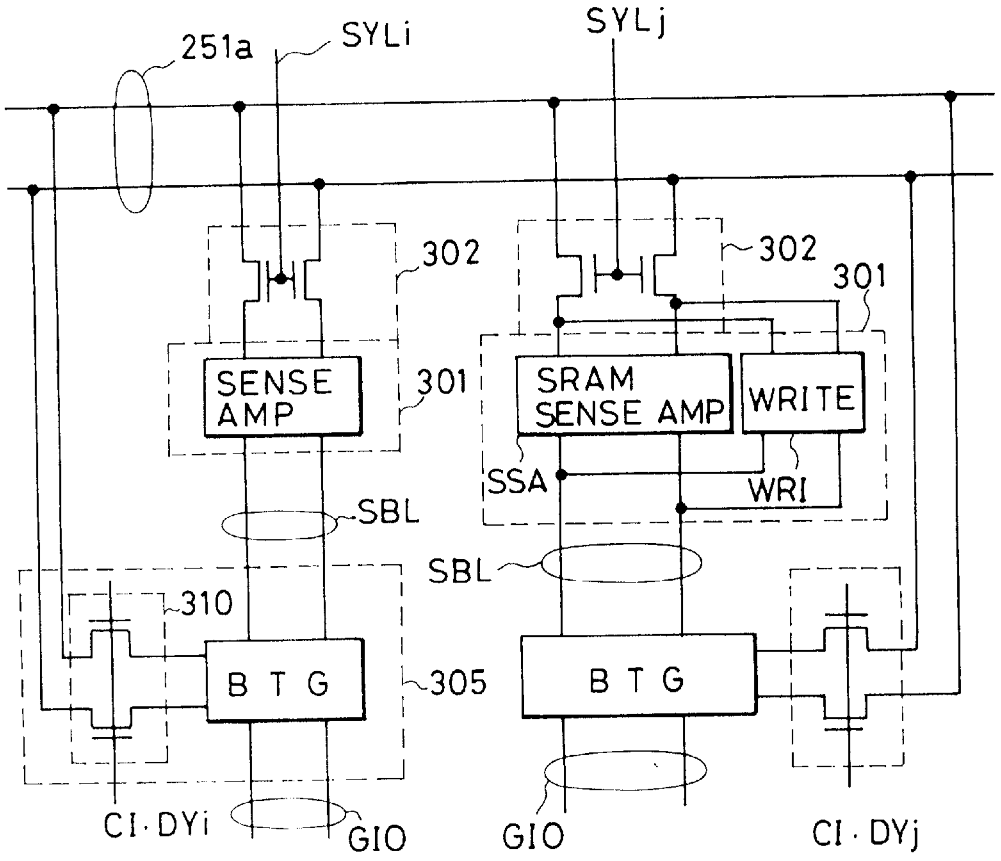
FIG. 24 shows an example of connection between the internal data line and the DRAM array enabling array access to the DRAM array in the semiconductor memory device in accordance with the present invention.

FIG. 24 shows one example of manner of connection of bi-directional transfer gate circuit 210 and internal common data line 251. Referring to FIG. 24, a SRAM input/output gate 301 comprises SRAM sense amplifier SSA and write circuit WRI which is activated in data writing to SRAM array for transmitting data on internal data line 251*a* to a corresponding SRAM bit line pair SBL. SRAM bit line pair SBL is connected through SRAM sense amplifier SSA and SRAM column selecting gate 302 to internal data line 251*a*. A SRAM column selecting signal SYL from SRAM column decoder block 203 is applied to SRAM selecting gate 302. Consequently, a pair of SRAM column bit line pair SBL only is connected to internal data line 251*a*. Internal data line 251 shown in FIG. 11 transfers 4 bits of data, and only an internal data line corresponding to 1 bit is shown in FIG. 24.

The CDRAM further comprises an access switching circuit 310 responsive to a logical product signal between cache inhibiting signal CI and DRAM column selecting signal DY for connecting global I/O line pair GIO to internal data line 251*a* for enabling array access. Access switching circuit 310 and bi-directional transfer gate BTG are included in transfer gate circuit block 305.

The column selecting signal DYI of DRAM is generated by decoding, for example, lower 4 bits of a column address. More specifically, 16 pairs of global I/O lines GIO are provided for one DRAM memory mat (having the capacity of 1M bits). For array accessing, only one pair must be selected therefrom. Therefore, column selecting signal DYi is generated by decoding lower 4 bits of column address for DRAM. The access switching circuit 310 simply connects global I/O line pair GIO to internal data line 251*a*, and connection to corresponding signal lines are carried out in bi-directional transfer gate BTG. A structure in which global I/O line pair GIO is connected to internal data line 251*a* through SRAM sense amplifier SSA may be used to realize array accessing, without providing such an access switching circuit 310. At this time, column selecting signal applied to SRAM selecting gate 302 is a selecting signal based on column address to the DRAM. This is realized by a circuit multiplexing the column selecting signal by the signal CI. This multiplex circuit applies column selecting signal for DRAM to SRAM selecting gate, when the signal CI is active.

In the SRAM, a SRAM sense amplifier SSA is provided for each SRAM bit line pair SBL. However, one SRAM sense amplifier may be provided for the SRAM bit line pairs of 1 block, as in a normal SRAM. However, when the SRAM sense amplifier is provided for each SRAM bit line SBL, output of data can be more surely carried out at high speed. If the SRAM sense amplifier SSA has the same structure as the DRAM sense amplifier, it is not necessary to provide writing circuit WRI.

[Input/Output Circuit]

Figure 25:
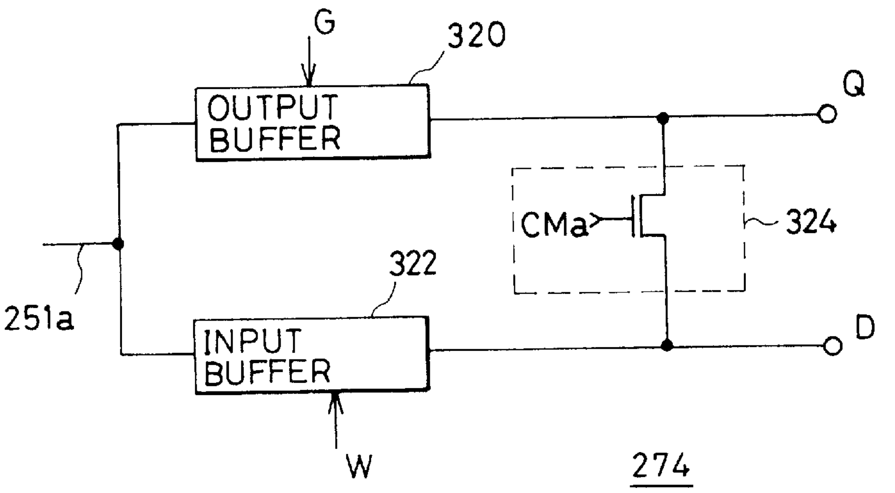
FIG. 25 shows one example of a structure of a data input/output circuit portion for realizing D/Q separation mode and a mask write mode in the semiconductor memory device in accordance with the present invention.

FIG. 25 shows a structure for realizing D/Q separation in input/output circuit 274. Referring to FIG. 25, input/output circuit 274 comprises an output buffer 320 which is activated in response to an internal output enable signal G for generating output data Q from data on internal data line 251*a*; an input buffer 322 which is activated in response to an internal write designating signal W for generating internal write data from external write data D and transmitting the same to internal data line 251; and a switch circuit 324 responsive to a D/Q separation designating bit CMa from command register 270 for short-circuiting an output from output buffer 320 and an input of input buffer 322. D/Q separation designating bit CMa is included in a special mode designating command CM generated from command register 270. If the switch circuit 324 is rendered conductive, input/output of data are carried out through the same pin. If the switch circuit 324 is off, input/output of data are carried out through separate pins. Structure related to data input/output of 1 bit only is shown in FIG. 25 as a representative.

By the above described structure, a CDRAM having the following characteristics can be provided.

(1) The CDRAM in accordance with the present invention has a DRAM memory array serving as a main memory and an SRAM array serving as a cache memory integrated on 1 chip, and these memories are coupled to each other by an internal bus used only for data transfer, which is different from an internal common data bus. Consequently, block transfer between the DRAM array and the SRAM array (cache) can be completed in 1 clock cycle. In the following description, the term "array" refers to the DRAM array. Compared with a conventional cache memory system employing a standard DRAM and a standard SRAM, system performance can be remarkably improved.

(2) The DRAM memory array and the SRAM array can be accessed by separate addresses. Therefore, various mapping methods, for example direct mapping method, set associative method and full associative method can be employed.

(3) The CDRAM operates in synchronization with an external clock K. Compared with a method in which internal clock signals are generated by using an address change detecting circuit, delay of a cycle time derived from address skew or the like can be prevented, realizing accurate control.

(4) Externally applied signals (or data) such as array addresses (addresses for the DRAM) Aa0 to Aa9, cache addresses (addresses for SRAM) Ac0 to Ac11, data input/output D0 to D3 or DQ0 DQ3, a write enable signal W#, a cache hit signal CH#, a chip select signal E#, a refresh signal REF#, a cache inhibition signal CI# and a command register signal CR# are all taken at a rising edge of the external clock K.

(5) Since array addresses are taken in accordance with a multiplex method, the number of pins for array addresses can be reduced, increasing packaging density of the CDRAM.

(6) Addresses of the array and the cache are independent from each other. At a time of a cache hit, access to the cache only is carried out, enabling high speed cache hit accessing.

(7) Data can be read at an arbitrary timing by an output enable signal G# regardless of the timing of the external clock K, so that asynchronous bus control can be done in the system.

(8) By using the command register 270, output specification (transparent, latch, register; these modes are described later) and I/O structure (input/output pin separation, masked write) can be arbitrarily designated by a user. When a register output method is used, output data of an address designated in the previous cycle appears at a rising edge of the external clock K. Such data output mode is suitable for pipeline application. In a latch output method, output data of an address designated in the previous cycle is continuously output at the timing at which invalid data were to be output otherwise. Therefore, invalid data is not output at all, and valid output data only is provided. By this latch output mode, sufficient period of time for the CPU to take output data can be provided.

(9) Data writing operation is started at a rising edge of the external clock K. However, writing is automatically terminated by an internal timer or the like. Therefore, it is not necessary to set completion of writing operation by, for example, an external write enable signal W#, and therefore setting of timings in the system is facilitated.

(10) A refresh designating signal REF# for designating automatic refreshing can be externally applied. Therefore, the DRAM array can be automatically refreshed easily at a desired timing.

(11) As described above, the CDRAM of the present invention can be housed in 300 mil. TSOP package, type II having 44 pins. The TSOP package type II is a very thin rectangular package, which realizes a system having high packaging density.

FIG. 26 summarizes in a table operational modes of CDRAM of the present invention and the states of control signals in designating respective operational modes. An operational mode of CDRAM is set depending on combined states of external control signals E#, CH#, CI#, CR#, W# and REF#. In FIG. 26, "H" indicates a signal potential of a high level, "L" indicates a signal potential of a low level, and "X" indicates "don't care" (arbitrary) state. As shown in FIG. 26, operational modes of CDRAM include a standby mode for setting CDRAM include a standby mode for setting CDRAM in a wait state, an array refresh mode for performing auto refreshing of CDRAM, a mode of data transfer between CPU (central processing unit) and cache (SRAM), a mode of data transfer between CPU and Array, a mode of transferring a data block between the cache and the array and a mode of setting a special mode in a command register. A combination of states of control signals and timing for each operational mode will be described later with reference to waveform diagram.

In FIG. 26, the write enable signal W# is shown as "H/L" for data transfer between CPU and the command register, to indicate that the write enable signal W# can be set to either "H" or "L" each of which state is employed to designate a special mode.

[Command Register]

Operation mode of the CDRAM is set dependent on states of external control signals at a rise of clock signal K. By setting a command in a command register (FIG. 11, 270), a special mode and data input/output pin arrangement can be set.

Figure 28:
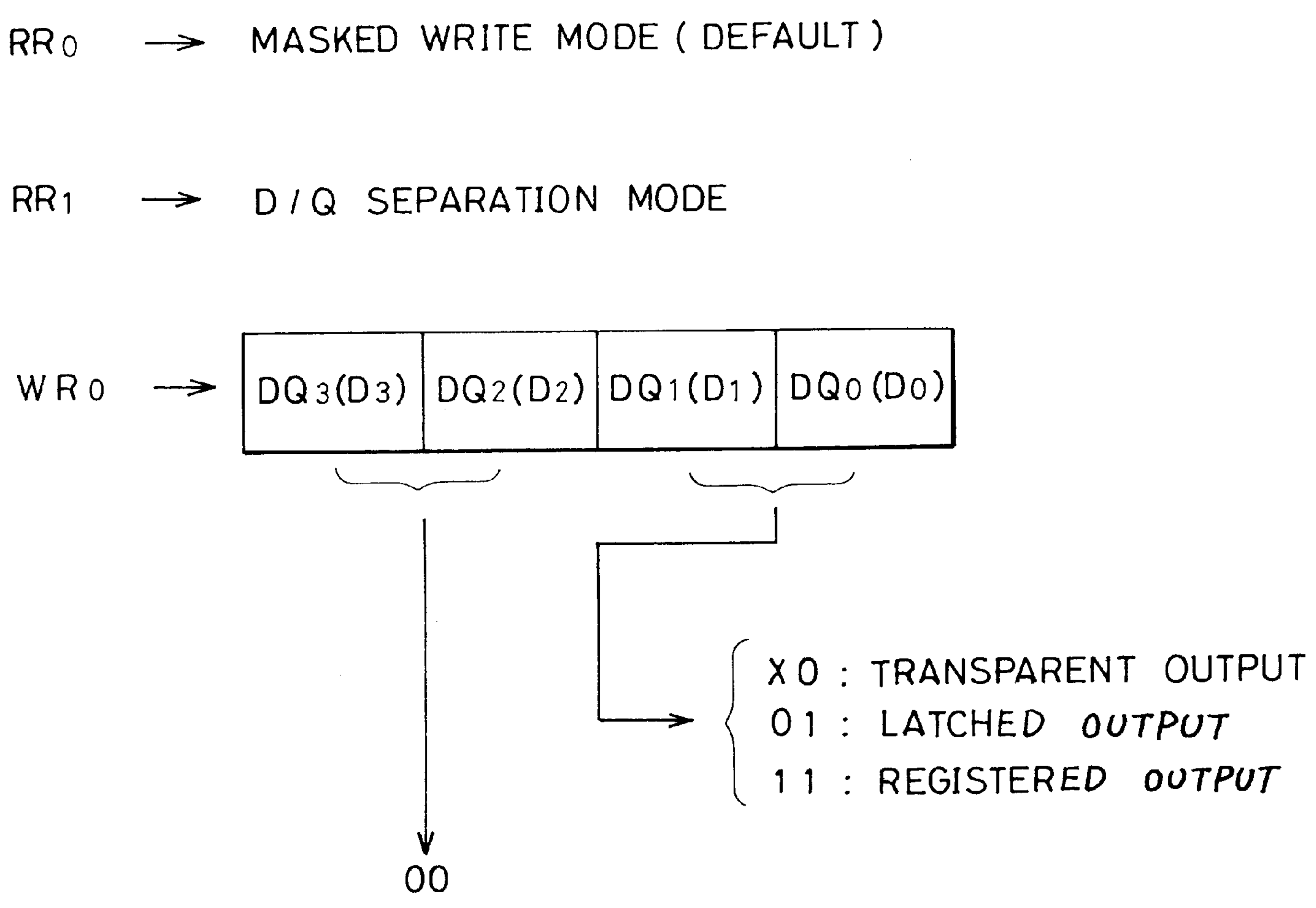
FIG. 28 shows correspondence between a selected command register and a special mode set at that time.

FIGS. 27 and 28 shows the contents in the command register 270 shown in FIG. 11 and a method of selecting the contents. Command register 270 includes 8 registers RR0–RR3 and WR0–WR3. Combination of write enable signal W# and 2 bits of command addresses AR0 and AR1 is used for selecting the register. By setting the external write enable signal W# to "H" at a rising edge of external clock K, any of the registers RR0–RR3 is selected. Register RR0 is selected by setting command addresses Ar0 and Ar1 to "0". Register RR1 is selected by setting command address bit Ar0 to "1" and command address bit Ar1 to "0". Selection of register RR0 means setting of a masked write mode (this masked write mode is also a default). Selection of the register RR1 means setting of D/Q separation mode. When write enable signal W# is set to "L" at a rising edge of external clock K and setting command addresses Ar0 and Ar1 both to "0", then register WR0 is selected. As shown in FIG. 28, this register WR0 sets the output mode to transparent, latched or registered mode, dependent on the combination of data at data input terminals DQ0 (D0) to DQ3 (D3) at that time. Details of the respective output modes will be described later. When register WR0 is selected, input data D2 and D3 (DQ2 and DQ3) are both set to "0". When input data D0 is set to "0" and input data D1 is set to an arbitrary value in this state, transparent output mode is set. When input data D0 is set to "1" and input data D1 is set to "0", latched output mode is selected. When input data D0 and D1 are both set to "1", registered output mode is selected. Other registers are used for arbitrary extended function.

[Connection to External CPU (1): Direct Mapping Cache]

Figure 29:
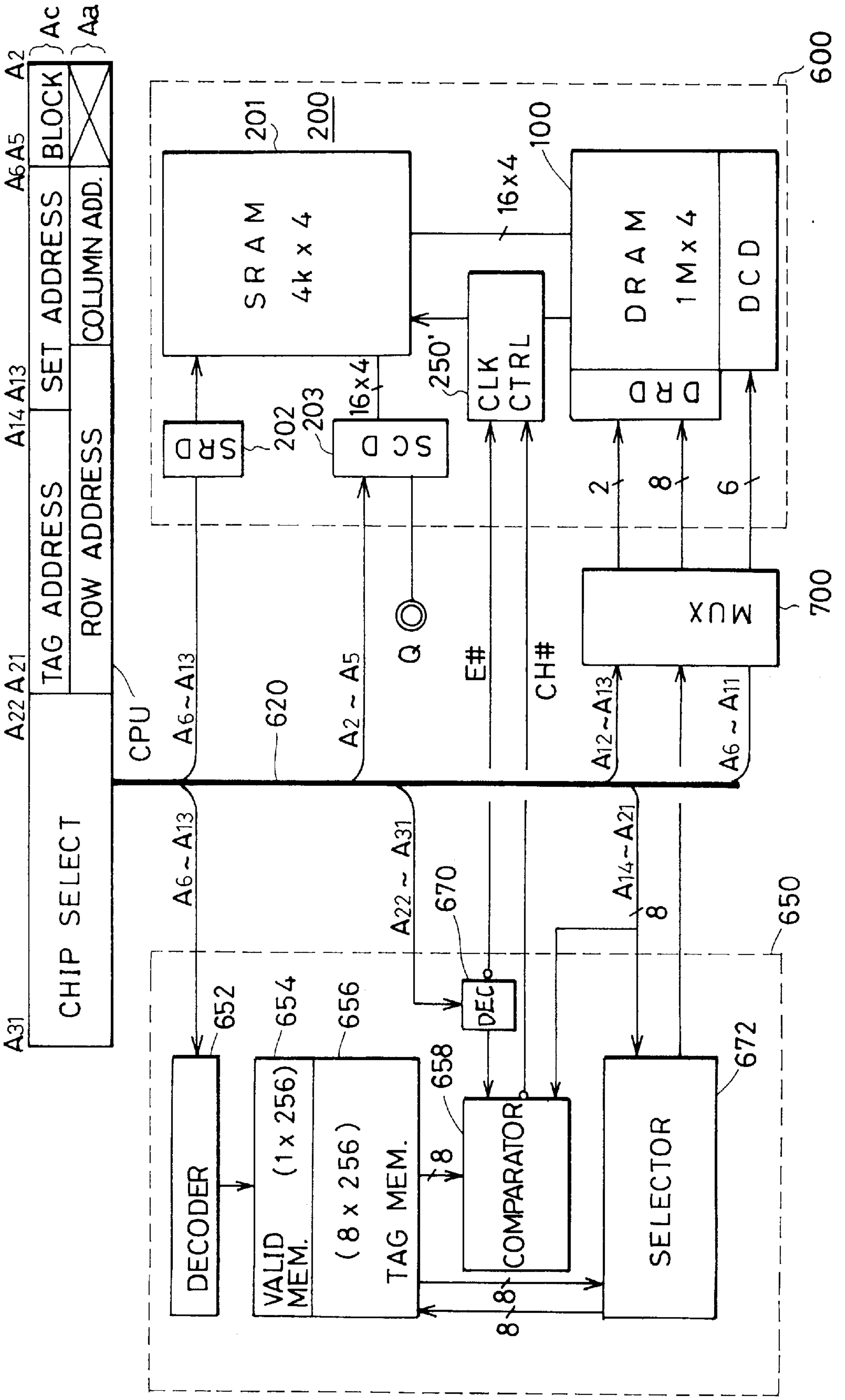
FIG. 29 is a block diagram showing a system structure when a cache system is formed by direct mapping method by using the semiconductor memory device in accordance with the present invention.

FIG. 29 is a block diagram showing a structure of a system when a cache system is formed by a direct mapping method using the CDRAM 600 in accordance with the present invention. Referring to FIG. 29, the cache system comprises, in addition to CDRAM 600, a controller 650 for controlling access to the CDRAM 600, and a CPU for carrying desired data processing by inputting/outputting data to and from the CDRAM 600. FIG. 29 shows only an address structure output from the CPU when cache access is required. The CPU is assumed to have 32 bits. The cache system further includes an address multiplex circuit 700 for multiplexing and applying row and column addresses to the array CDRAM 600. Portions related to cache access only of the CDRAM 600 are shown as representatives. In the direct mapping method, the number of tags is 256, the number of sets is 256, and set size is 16 bits. 1M DRAM has 1024 rows×1024 columns, 4K SRAM has 256 rows×16 bits.

Controller 650 includes a decoder 652 for decoding set addresses A6 to A13 from the CPU, valid bit memory 654 indicating which set is valid in response to an output from decoder 652, and a tag memory 656 for storing tag addresses of data stored in SRAM 200. SRAM 200 has a structure of 4K×4 bits, and there are 256 tags. Therefore, tag memory 656 includes 8 bit×256 structure. Valid bit memory 654 has a structure of 1 bit×256 for indicating which of the 256 set is valid. Decoder 652 decodes set addresses A6 to A13 and makes valid any of the valid bit memory 654.

Controller 650 further includes a decoder 670 receiving addresses A22 to A31 from the CPU as a chip selecting signal for determining whether or not a corresponding CDRAM 600 is designated, a comparator 658 which is activated in response to an output from decoder 670, comparing a tag address from tag memory 656 with tag addresses A14 to A21 from CPU for determining a cache hit/miss, and a selector 672 corresponding to a cache hit/miss for selecting either the tag address from tag memory 656 or tag addresses A14 to A21 from CPU for applying the selected one to the multiplex circuit 700. At a time of a cache miss, selector 672 stores tag address applied from the CPU to a corresponding position of the tag memory 656.

The operation will be briefly described in the following. When access to the CDRAM 600 is requested by the CPU, addresses A2 to A31 are generated on the data bus 620. Addresses A20 to A31 out of 30 bits of addresses on common data bus 620 are used as chip select signals and applied to decoder 670 in controller 650. Decoder 670 decodes addresses A22 to A31 as the chip select signal, and determines whether or not an access to the corresponding CDRAM is requested. If it is determined that an access to the CDRAM 600 is requested, chip select signal E# is generated from decoder 670 and applied to CDRAM 600. A comparator 658 is activated by the chip select signal from decoder 670.

Decoder 652 included in controller 650 takes and decodes addresses A6 to A13 out of addresses transmitted from CPU to address bus 620 as set address. Decoder 652, which has decoded 8 bits of set addresses, sets corresponding bits of the valid bit memory 654 for selecting one set out of 256 sets. An address of 8 bits indicating a tag corresponding to the valid bit of the valid bit memory 654 is read from tag memory 656 and applied to comparator 658. Comparator 658 compares tag address from tag memory 656 with tag addresses A14 to A21 output from CPU. When they match with each other, comparator 658 makes cache hit signal CH# fall to "L" and applies the same to CDRAM 600 so as to indicate a cache hit. If they do not match with each other, comparator 658 generates a cache hit signal CH# of "H" to indicate a cache miss (miss hit).

At a time of a cache hit, the following operation is carried out in the CDRAM 600. The control of operation at this time is carried out by control signals from a control clock buffer 250 and by SRAM array driving circuit 264 (see FIG. 11). SRAM row decoder 202 selects one of 256 sets in response to set addresses A6 to A13 from the CPU. Namely, one row (one in each SRAM array block, 4 rows in total) is selected. Consequently, 16 bits of SRAM cells are selected in each SRAM array block of the SRAM 200. SRAM column decoder SCD 203 decodes block addresses A2 to A5 from CPU, selects 1 bit out of 16 bits of memory cells, and connects the selected one to data input/output terminal. FIG. 29 shows an output data Q at the time of a hit reading.

Operation at a miss hit will be described. At this time, data to which access is requested by the CPU is not stored in the SRAM 200. In controller 650, selector 672 applies a corresponding tag address stored in tag memory 656 to multiplex circuit 700 in response to a miss hit designating signal from comparator 658. At this time, selector 672 has the 8 bits of tag addresses A14 to A21 applied from CPU as new tag addresses stored at corresponding positions in tag memory 656.

In CDRAM 600, a copy back, that is, simultaneous transfer of 16 bits from SRAM 200 to DRAM 100 is carried out in this cycle. Data of 16 bits×4 selected by SRAM row decoder SRD 202 in accordance with set addresses A6 to A13 from the CPU in SRAM 200 are stored at corresponding positions of DRAM cell of 16 bits×4 which have been selected by row and column selecting operation in the DRAM 100 in accordance with 8 bits of tag address output from selector 672 and in accordance with addresses A6 to A13 output from the CPU.

In the next operation cycle, CDRAM 600 selects 16 bits×4 DRAM cells in DRAM 100 in accordance with addresses A6 to A21 output from the CPU, and writes the data of 16 bits×4 to corresponding 16 bits×4 memory cells of SRAM 200 which has been selected by SRAM row decoder SRD in accordance with address A6 to A13 from CPU. This data transfer may be carried out in accordance with another high speed transfer mode.

As described above, for the SRAM, address bits A2 to A5 are used as block addresses, address bits A6 to A13 are used as set addresses, address bits A14 to A21 are used as tag addresses. For the DRAM, address bits A6 to A11 are used as column addresses, and address bits A12 to A21 are used as row addresses. Consequently, a direct mapping method can be realized between DRAM 100 and SRAM 200.

[Connection to CPU II:4 Way Set Associative]

Figure 30:
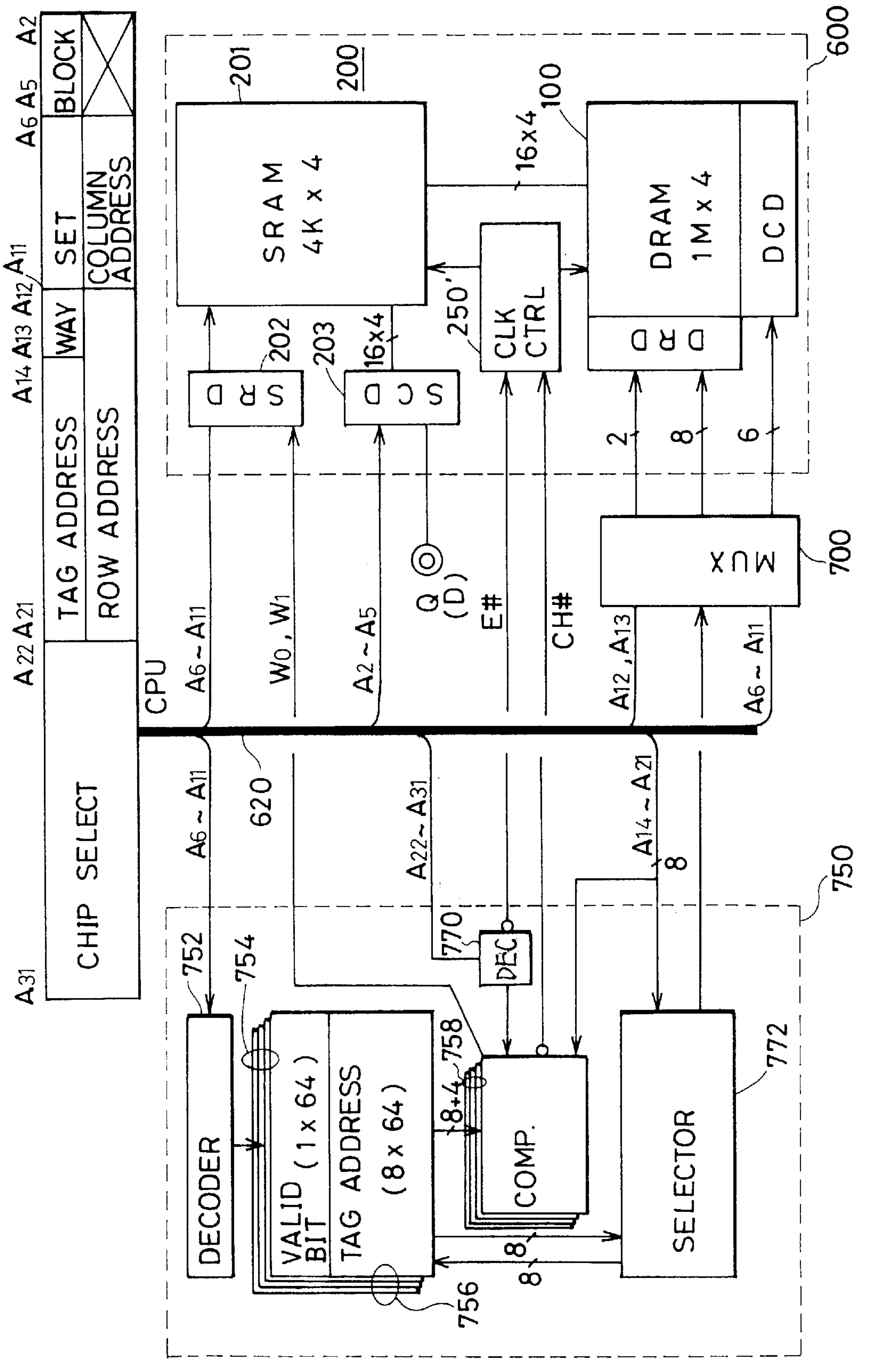
FIG. 30 is a block diagram showing a system structure when the cache system is formed by 4 way set associative mapping method by using the semiconductor memory device in accordance with the present invention.

FIG. 30 is a block diagram showing a system structure of 4 way set associative method using the CDRAM of the present invention. CDRAM 600 has the same structure as that shown in FIG. 29, which includes SRAM 200, DRAM 100 and a clock control circuit 256'. Clock control circuit 256' includes control clock buffer 250, SRAM array driving circuit 264 and DRAM array driving circuit 260 shown in FIG. 11. For simplicity, circuit structures for controlling data input/output are omitted.

Controller 750 includes a decoder 752, a valid bit memory 754, a tag address memory 756, a comparator 758, a decoder 770 and a selector 772. For correspondence to 4 ways, valid bit memory 754 includes 4 memory frames each having 1 bit×64 structure. Tag address memory 756 also has 4 memory planes each having 8 bits×64 structure. Similarly, 4 comparators 758 are provided for selecting one of 4 ways, that is, one comparator is provided for each memory plane of the tag address memory 756. In 4 ways set associative method, 256 rows of SRAM 200 are divided into 4 ways, and therefore the number of sets is 64.

Addresses having the following structures are transmitted from CPU to address bus 620. Addresses A22 to A31 are addresses for selecting chips, addresses A14 to A21 are tag address, addresses A12 and A13 are way addresses, addresses A6 to A11 are set addresses, and addresses A2 to A5 are block addresses. Addresses A6 to A11 and addresses A12 to A21 are used as column addresses and row addresses for the DRAM 100, respectively. Multiplex circuit 700 is provided for DRAM 100 of CDRAM 600 for multiplexing the row and column addresses. The operation will be described.

Addresses A6 to A11 from CPU are applied as set addresses to decoder 752. Addresses A22 to A31 are applied as chip select addresses to decoder 770. Decoder 752 decodes the set addresses A6 to A11 and sets valid bits related to corresponding set to valid state, in valid bit memory 754. Consequently, 1 set (4 ways) is selected. Decoder 770 decodes chip select addresses A22 to A31 to determine whether or not there is an access request to CDRAM 600. If an access to CDRAM 600 is requested, decoder 770 sets chip select signal E# to an active state, that is, "L", and activates comparator 758. Comparator 758 reads corresponding 4 way tag addresses from tag address memory 756 referring to valid bits in valid bit memory 754, and compares the read tag addresses with addresses A14 to A21 from the CPU. If a matching is found, comparator 758 outputs way addresses W0 and W1 indicating the way in which the matching is found, and makes cache hit signal CH# fall to "L" so as to indicate a cache hit. If there is not a match in comparator 758, cache hit signal CH# is set to "H" to indicate a miss hit.

When a cache hit occurs, way addresses W0 and W1 from controller 750 and addresses A6 to A11 from the CPU are applied as row addresses to SRAM row decoder 202, and 16 bits×4 SRAM cells are selected in SRAM array 201. Block addresses A2 to A5 as column addresses are decoded by SRAM column decoder 203. Out of selected 26 bits×4 SRAM cells, 1 bit×4 are selected to be connected to a data output terminal Q (or data input terminal D).

In case of a miss hit, selector 772 selects one of the 4 way tag addresses to select a region in which tag address is to be rewritten in accordance with LRU (Least-Recently Used)

logic. The tag address selected by selector 772 is applied as an array address to DRAM row decoder DRD in DRAM 100 through multiplex circuit 700. Selector 772 replaces the tag address which is to be rewritten by address A14 to A21 applied from the CPU.

In CDRAM 600, the first cycle is a copy back mode. In copy back mode, way addresses W0 and W1 indicating ways to be rewritten, are output under the control of selector 772. In SRAM 200, addresses A6 to A11 from CPU and way addresses W0 and W1 from controller 750 are decoded, and 16 bits×4 SRAM cells are selected. In DRAM 100, 16 bits×4 DRAM cells are selected in accordance with 8 bits of tag addresses output from selector 772 and to addresses A6 to A13 output from the CPU. Thereafter, data are transferred from selected 16 bits×4 SRAM cells to selected 16 bits×4 DRAM cells.

In the next operation cycle, 16 bits×4 DRAM cells are selected in DRAM 100 in accordance with addresses A6 to A21 from the CPU. Data of the newly selected 16 bits×4 DRAM cells are simultaneously transferred to 16 bits×4 SRAM cells which have been selected in accordance with addresses A6 to A11 and the way addresses W0 and W1. The data transfer may be carried out in accordance with a high speed transfer mode in which data are first transferred from DRAM to SRAM while latching the data from SRAM and then the latched data are transferred to DRAM.

By the above described structure, either direct mapping method or set associative method can be realized without changing internal structure of CDRAM 600. Although not shown, full associative mapping method is also possible. In that case, in controller 750, a tag address memory for storing SRAM cache address and a corresponding address of the DRAM 100 is necessary. Relation between signal timings in various operation cycles and state transition in CDRAM will be described.

[Correspondence Between External Signals and Operation Cycles]

As described above, control signals except output enable signal G# and addresses Aa and Ac are latched at a rising edge of external clock signal K. The states of respective signals are arbitrarily (D.C) except set up time and hold time are necessary before and after a rising edge of the external clock K. In accordance with the external clock synchronizing method, it is not necessary to take cycle time margin derived from skew of address signals and the like into consideration, and the cycle time can be reduced. Thus, a CDRAM operating at high speed can be provided.

Output enable signal G# controls state of outputs from output buffer and output register included in input/output circuit 274 shown in FIG. 11. When output enable signal G# is at “H”, output data is in a high impedance state (Hi-Z). When output enable signal G# attains to active state, that is, “L”, data is output. The operation modes of CDRAM are as shown in a table of FIG. 26. The respective operation modes together with the timings thereof will be described.

In the standby state, chip select signal E# and refresh designating signal REF# are both set to “H” at a rising edge of external clock signal K, and remaining control signals CH#, CI#, CR# and W# are at arbitrary states. In the standby state, memory operation is not carried out at all in CDRAM.

No. 1: cache hit write cycle

Figure 31:
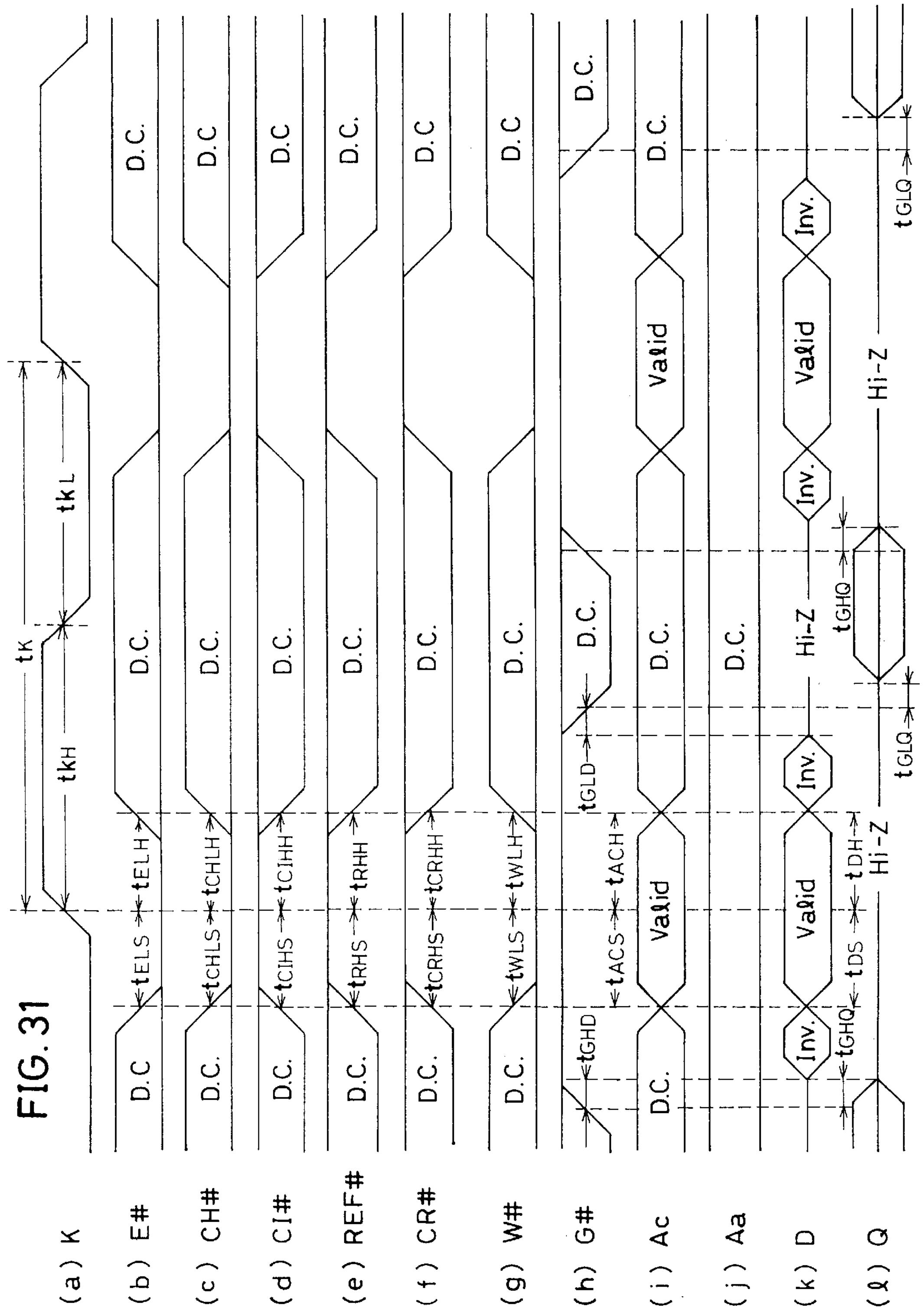
FIG. 31 is a diagram of signal waveforms showing timings of control signals in a cache hit write cycle of the semiconductor memory device in accordance with the present invention.

FIG. 31 shows timings of various signals in cache hit write cycle. External clock signal K has a cycle time tk. Cycle time tk includes an H pulse width tKH at which external clock signal K is at “H”, and a L pulse width tKL at which external clock signal K is at “L”. A cache hit write cycle is a cycle for writing data to SRAM cache. When this state is selected, chip select signal E# is set to “L”, cache hit signal CH# is set to “L”, cache hit inhibition signal CI# is set to “H”, command register signal CR# is set to “H”, write enable signal W# is set to “L” and output enable signal G# is set to “H” at a rising edge of external clock signal K.

At this state, an address for SRAM 200 is latched as valid, and access to SRAM is carried out in accordance with the address Ac for the SRAM. At this time, an address Aa for the DRAM is arbitrary (D.C). At a rising edge of the external clock signal K, input data D is made valid, and valid write data is written to SRAM cell selected by the SRAM address Ac. Since access to the cache memory SRAM is at high speed, writing is completed in 1 clock cycle of external clock signal K as shown in FIG. 31. Namely, time required for cache hit writing is the clock cycle time tK.

Although output data Q changes in response to an arbitrary state of output enable signal G# in FIG. 31, this means that output data appears corresponding to the “H” and “L” levels of the output enable signal G#. FIG. 31 shows set up times and hold times of respective control signals and address signals. The set up time is necessary for setting surely the control signal or addresses at an established state by the time of the rising edge of external clock signal K. The hold time is necessary for ensuring operation by holding the signal for a constant time period from a rising edge of the external clock signal K. The set up time and the hold time will be described briefly.

Chip select signal E# includes a set up time tELS which is necessary when it is set to “L”, a set up time tEHS which is necessary when it is set to “H”, a hold time tELH necessary when it changes to “L”, and a hold time tEHH which is necessary when it changes to “H”.

To the cache hit signal CH#, a set up time tCHLS which is necessary when it change to “L”, a set up time tCHS which is necessary when it is changed to “H”, a hold time tCHLH which is necessary when it is changed to “L” and a hold time tCHHH which is necessary when it is changed to “H” are set.

Cache inhibition signal CI# includes set up times tCILS and tCIHS which are necessary when it is changed to “L” and to “H”, respectively, and hold times tCILH and tCIHH which are necessary when it is changed to “L” and to “H”, respectively.

The command register signal CR# includes set up times tCRLS and tCRHS which are necessary when it is changed to “L” and to “H”, respectively, and hold times tCRLH and tCRHH which are necessary when it is changed to “L” and “H”.

Refresh signal REF# includes set up times tRLS and tRHS which are necessary when it is changed to “L” and to “H”, respectively, and hold times tRLH and tRHH which are necessary when it is changed to “L” and to “H”, respectively.

Write enable signal W# includes set up times tWLS and tWHS which are necessary when it is changed to “L” and “H”, respectively, and hold times tWLH and tWHH which are necessary when it is changed to “L” and “H”, respectively. The address Ac for SRAM includes a set up time tACS which is necessary for determining the state thereof as valid, and a hold time tACH which is necessary when it is valid.

The address Aa for DRAM includes a set up time tAAS which is necessary to a rising edge of external clock signal K at which it is determined valid, and a hold time tAAH which is necessary after it is determined to be valid.

As to write data D, a set up time tDS required for valid data, and a hold time tDH required for valid data are necessary.

As to output enable signal G#, time tGHD necessary from the time at which output is disabled to the time when data input pin is activated, a delay time tGLD which is necessary from the time at which data input pin is set to the high impedance state to the time when signal G# is changed to "L", time tGLQ which is necessary from the time when it is changed to "L" to the time when the output pin is activated, and time tGHQ which is necessary from the time when it is changed to "H" to the time when the output pin is set to the high impedance state are set.

As to access time, an access time tGLA from the time when output enable signal G# attains to "L" to an output of valid data, access time tKLA from the time when external clock signal K attains to "L" to an output of valid data, an access time tKHA from the time when external clock signal K attains to "H" to the output of valid data, an access time tKHAR from the time when external clock signal K attains to "H" in registered output mode to the output of valid data, and an array access time tKHAA necessary from the time when external clock signal K attains to "H" to the time when DRAM is accessed and valid data are output are set.

Referring to FIG. 31, after a lapse of tGHD from a rising edge of output enable signal G#, the write data D is regarded as invalid.

The cycle time of the CDRAM of the present invention is set to 10 nS to 20 nS, as an example. Array access time tKHAA is set to 70 to 80 ns. Various set up times and hold times are set to several nano seconds.

No. 2T: Cache hit read cycle (transparent output mode)

Figure 32:
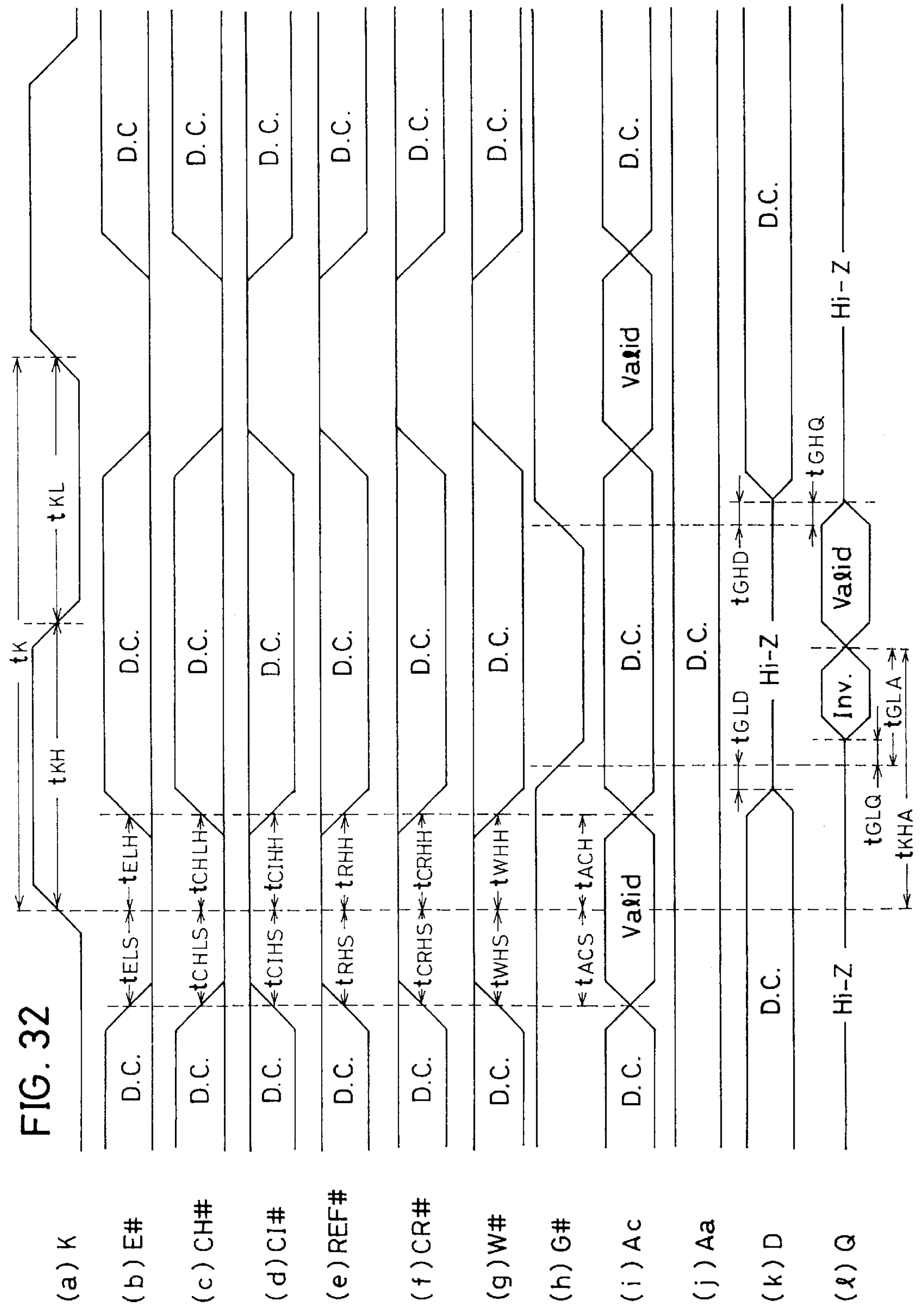
FIG. 32 is a diagram of signal waveforms showing timings of various external signals for effecting a cache hit read cycle in a transparent output mode of the semiconductor memory device in accordance with the present invention.

FIG. 32 shows timings of cache hit read cycle in the transparent output mode. As described above, the output mode includes transparent output mode, latch output mode and register output mode. Designation of the output mode is carried out by the command register. Referring to FIG. 32, when a cache hit read cycle is set, chip select signal E# and cache designating signal CH# are both set to "L" at a rising edge of the external clock signal K, and cache inhibition signal CI#, refresh designating signal REF#, command register signal CR# and write enable signal W# are set to "H".

In this state, an address Ac for the SRAM is made valid at the rising edge of the external clock signal k, and a SRAM cell is selected in accordance with this valid address Ac. In transparent output mode, data of the SRAM cell designated by the valid address Ac is output in this clock cycle. In transparent output mode, valid output data Q is output either after a lapse of tKHA from the rising edge of the external clock K or after a lapse of time tGLA from a falling edge of output enable signal G#. Data is output at a later timing of the both.

When output enable signal G# falls to "L" before the time tKHA, invalid data is continuously output until the time tKHA has lapsed. In the cache hit read cycle, write data is set to high impedance state (Hi-Z), and the address Aa from the DRAM may be set to any state, since it is not used.

No. 2L: Cache hit read cycle (latched output mode)

Figure 33:
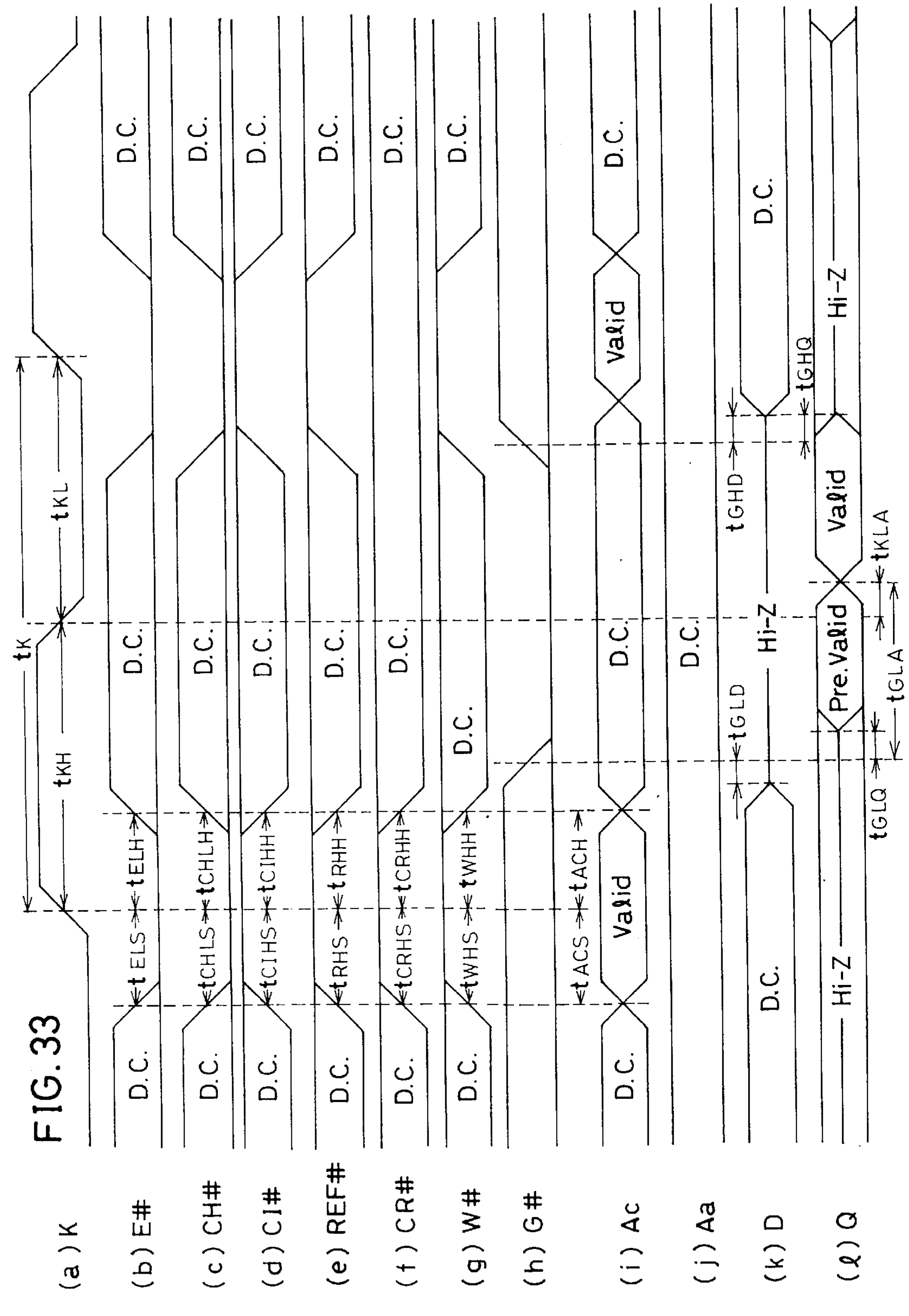
FIG. 33 is a diagram of signal waveforms showing timings of various external signals when the semiconductor memory device in accordance with the present invention is operated in a cache hit read cycle of the latch output mode.

FIG. 33 shows timings in cache hit read cycle of latched output mode. The difference between latched output mode and transparent output mode is that when output enable signal G# falls to "L" before the access time tKHA, data of the SRAM cell which has been selected in the previous cycle (Pre.Valid) is output at first in the latch output mode. Other signal timings are the same as those in transparent output mode shown in FIG. 32. In the latch output mode, invalid data (INV) is not output. Valid data only are output.

No. 2R: Cache hit read cycle (registered output mode)

Figure 34:
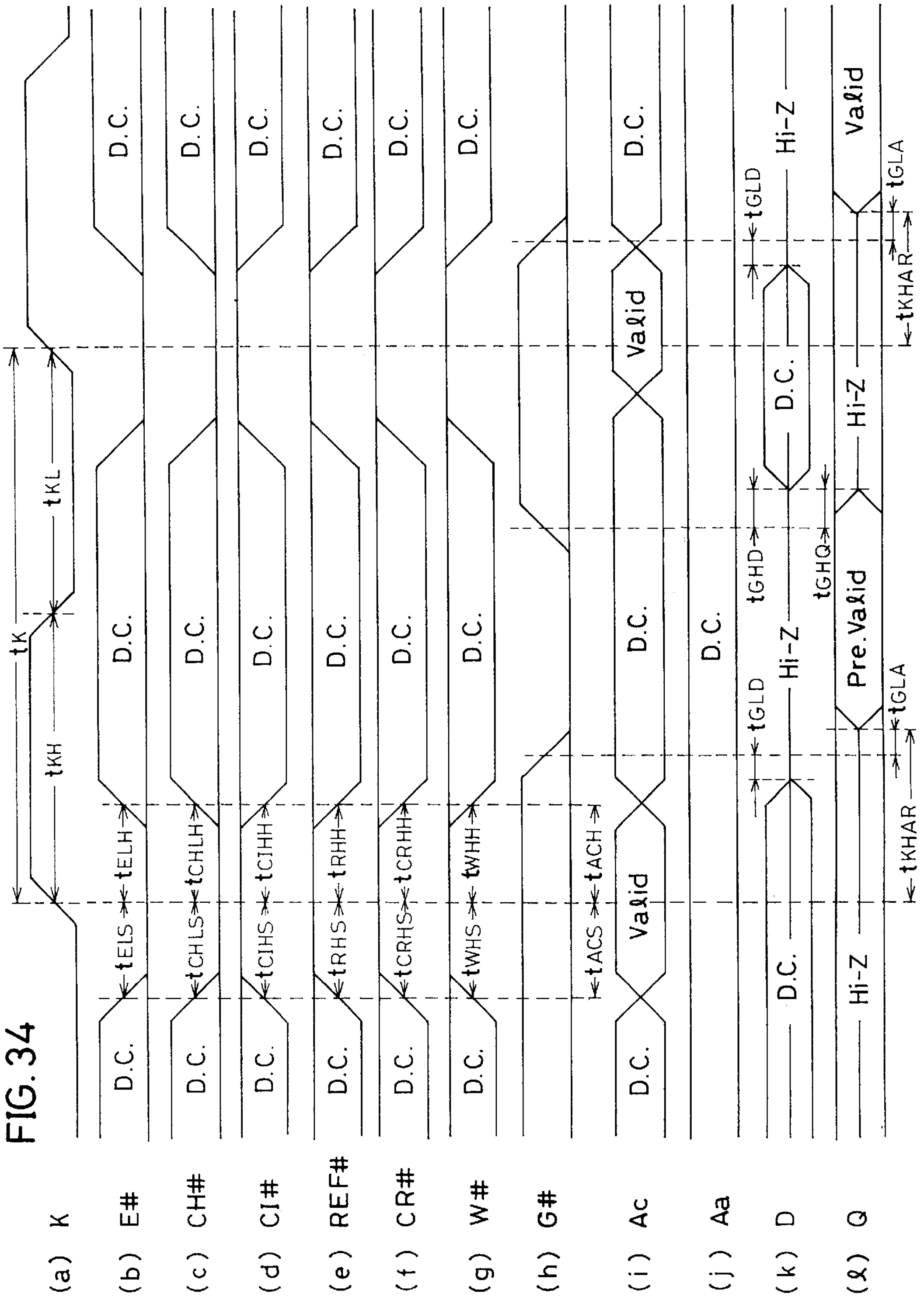
FIG. 34 is a diagram of signal waveforms showing timings of various external signals for operating the semiconductor memory device in accordance with the present invention in a cache hit read cycle in the register output mode.

FIG. 34 is a timing diagram of the cache hit read cycle in registered output mode. Timings of external control signals in the cache hit read cycle of the register output mode are the same as those in the transparent output mode and in the latched output mode shown in FIGS. 32 and 33. In the register output mode, valid data of the previous cycle (Pre.Valid) is output at a later timing out of the timings after the lapse of tKHAR from the rising edge of external clock signal K and after a lapse of time tGLA from a falling edge of output enable signal G#. In register output mode, invalid data is not output. Register output mode is suitable for pipeline operation.

Switching of the above described output modes is realized by controlling operation of an output register included in input/output circuit 274 shown in FIG. 11.

No. 3: Copy back cycle

Figure 35:
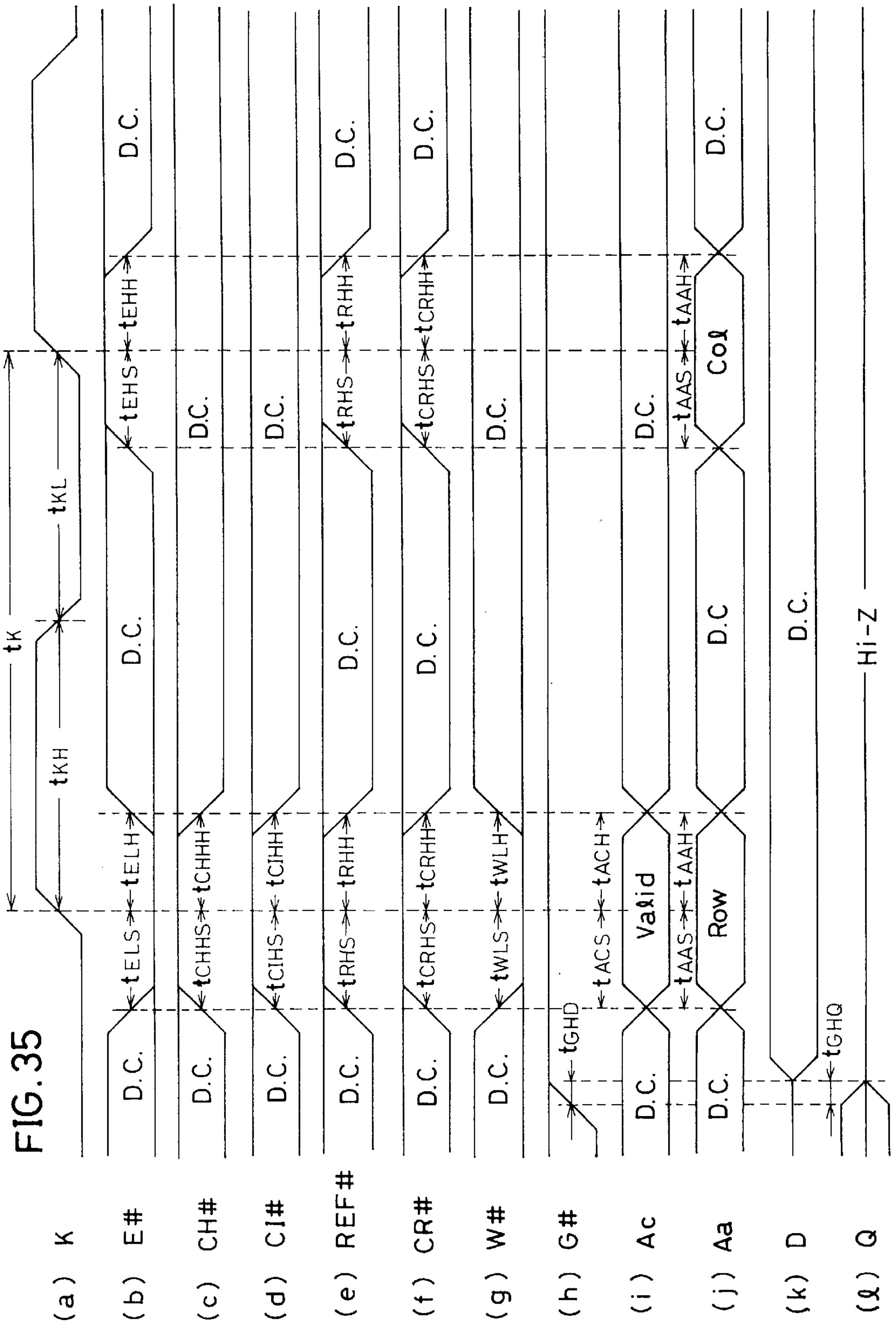
FIG. 35 is a diagram of signal waveforms showing timings of various external signals for operating the semiconductor memory device in accordance with the present invention in a copy back cycle.

FIG. 35 shows timings of various signals in copy back cycle. The copy back cycle is a cycle for transferring data from cache (SRAM) to array (DRAM), and it is carried out as a first cycle at a time of a miss hit. In the copy back cycle, chip select signal E# and write enable signal W# are both set to "L", and cache hit signal CH#, cache inhibition signal CI#, refresh designating signal REF#, command register signal CR# and output enable signal G# are set to "H" at a rising edge of external clock signal K. In the copy back cycle, an array address Aa must be input to DRAM for selecting the memory cell. A row address (Row) and the column address (Col) are multiplexed and applied as the array address Aa. An array row address is latched at a first rising edge of external clock signal K, and an array column address is latched at a second rising edge of external clock signal K. At the second rising edge of external clock signal K, cache hit designating signal CH#, cache inhibition signal CI#, write enable signal W# and cache address (address to SRAM) Ac may be at arbitrary states.

Write enable signal W# has been set to "L" at the first rising edge of external clock signal K, and external input data D changes from high impedance state to an arbitrary state. External output data Q is set to high impedance state, since output enable signal G# is at "OH".

No. 4: Block transfer cycle

Figure 36:
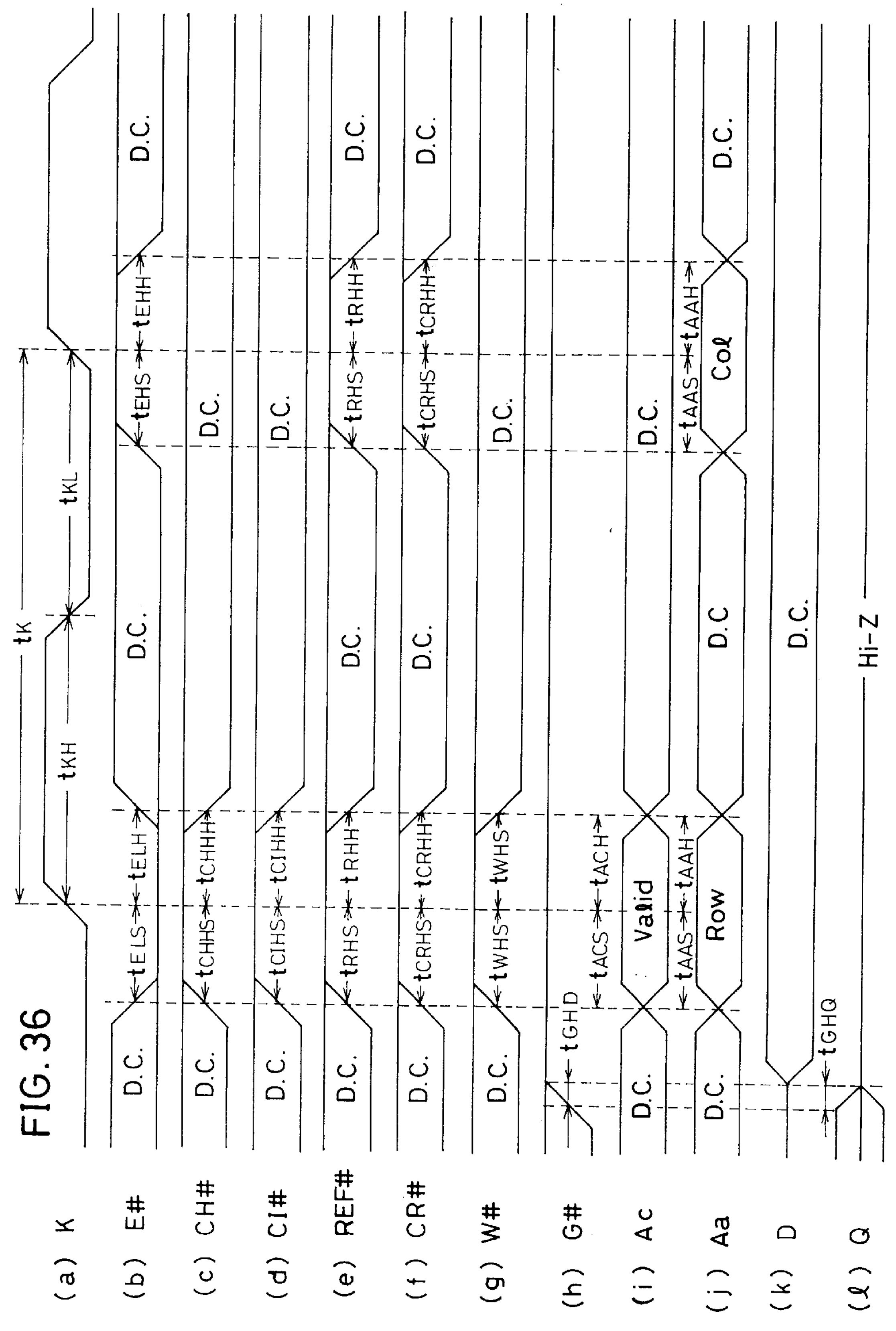
FIG. 36 is a diagram of signal waveforms showing timings of various external signals for operating the semiconductor memory device in accordance with the present invention in a block transfer cycle.

In block transfer cycle shown in FIG. 36, data block are transferred at one time from the array to the cache (SRAM) before, after or simultaneously with copy back operation. Timing conditions which are the same as in the copy back cycle shown in FIG. 35 are satisfied in the block transfer cycle, except that write enable signal W# is set to "H" at a first rising edge of the external clock signal K.

More specifically, when write enable signal W# is set to "L" at the first rising edge of external clock signal K at a cache miss (miss hit), the copy cycle is started. If write enable signal W# is set to "H", block transfer cycle from the array to the cache is set.

No. 5: Array write cycle

Figure 37:
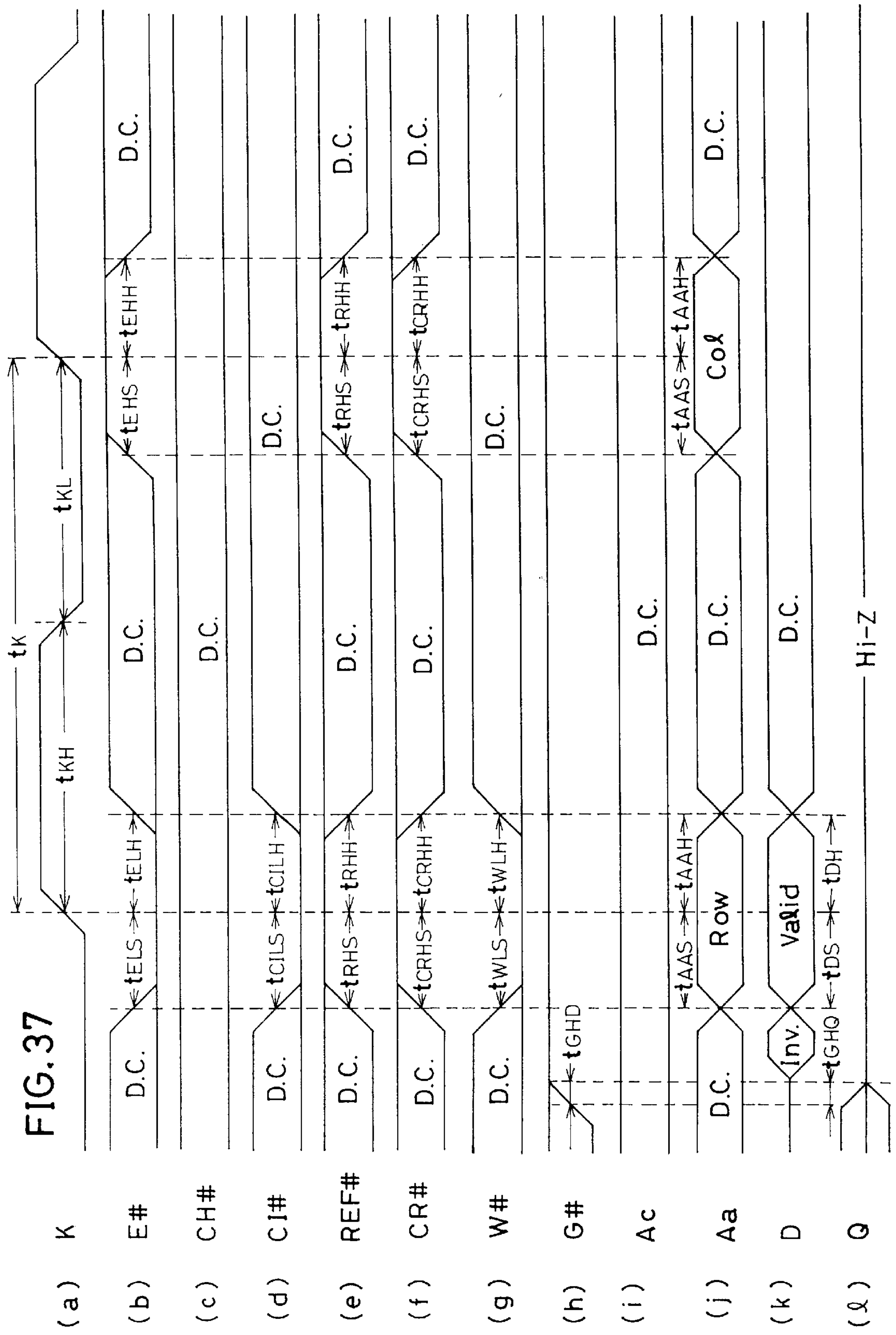
FIG. 37 is a diagram of signal waveforms showing timings of various external signals for setting an array write cycle of the semiconductor memory device in accordance with the present invention.

The array write cycle shown in FIG. 37 is a cycle for setting a mode in which CPU directly accesses to the array for writing data. A DRAM cell in the array is selected by array address Aa. At this time, data may be written through access switching circuit 310 of bi-directional transfer gate circuit 305 as shown in FIG. 24. Alternatively, data may be written through SRAM bit line pair SBL, the bi-directional transfer gate BTG and global I/O line pair GIO without providing access switching circuit 310. If the structure is adapted to write data through SRAM bit line pair SBL in SRAM array, lower bits of array address Aa may be applied to column decoder SCD of SRAM as a block address. A column selecting signal may be applied from DRAM column decoder to SRAM selecting gate.

Array write cycle is designated by setting chip select signal E#, cache inhibition signal CI# and write enable signal W# to "L" and by setting refresh designating signal REF# and output enable signal G# to "H" at the first writing edge of external clock signal K, as shown in FIG. 37. Cache designating signal CH# may be at an arbitrary state. In array write cycle, array address Aa is latched as a row address (row) at the first rising edge of external clock signal K, and array address Aa is latched as a column address (Col) at the second rising edge external clock signal K. Since the cache is not accessed at this time, address Ac for the cache may be at an arbitrary state. External write data D is latched at the first rising edge of external clock signal K. External output data Q is set to high impedance state.

In the cache system shown in FIGS. 29 and 30, only 16 bits of addresses are applied to DRAM 100, and column selecting operation in blocks is carried out in accordance with the block address in SRAM. FIGS. 29 and 30 show a structure at a cache system and the figures do not show the structure of the array access. However, the structure may use 4 bits of block addresses as column selecting addresses for DRAM 100, when cache inhibition signal CI# attains to "L" at array accessing.

No. 6: Array read cycle

Figure 38:
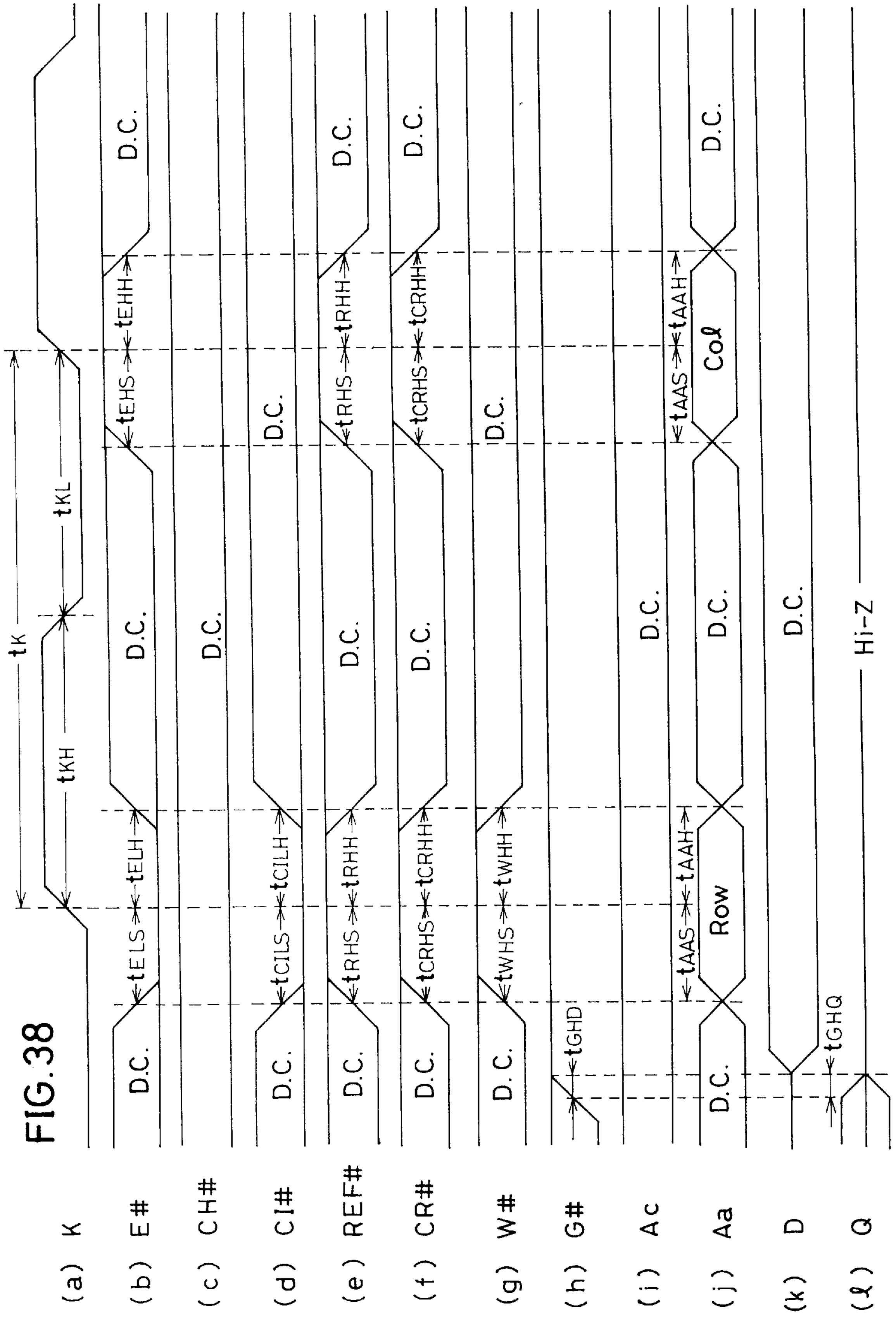
FIG. 38 is a diagram of signal waveforms showing timings of various external control signals when an array read cycle is set in the semiconductor memory device in accordance with the present invention.

Array read cycle shown in FIG. 38 is a cycle for setting a mode in which CPU directly accesses to the array for reading data. Array read cycle is designated by setting chip select signal E# and cache inhibition signal CI# to "L" and by setting refresh designating signal REF#, command register signal CR#, write enable signal W# and output enable signal G# to "H" at the first rising edge of external clock signal K. At the second rising edge of external clock signal K, chip select signal E#, refresh designating signal REF# and command register signal CR# are set to "H", and cache inhibition signal CI# and write enable signal W may be at an arbitrary state. The cache hit designating signal CH# may be at an arbitrary state in array read cycle. Output enable signal G# is maintained at "H".

Array address Aa is latched as a row address at the first rising edge of external clock signal K, and array address Aa is latched as a column address at the second rising edge of the external clock signal K. External input data D may be at an arbitrary state, and external output data Q is set to high impedance state. Array access cycles (array write cycle and array read cycle) are set by setting cache signal CI# to "L" at the first rising edge of the external clock signal K. The array access cycles are cycles for setting modes in which CPU directly accesses to the array. Data reading/writing are not actually carried out in the array write cycle and array read cycle.

In operations such as copy back operation, block transfer operation and array access operation which require reading/writing of data in the array, selection of a word line in the DRAM array, detection and amplification of data in the selected cell by sense amplifiers, restore operation of data, and RAS precharge are necessary. Therefore, these operations requiring reading/writing of data in the array takes several clock cycles. When we represent the cycle time of the DRAM by tA and the cycle time of the external clock signal K as tK, external clock cycles of m=ta/tK is necessary for the array access. m cycles correspond to a wait time for the CPU. Timings when the CPU is kept in a waiting state in reading/writing data and in selecting cells in the array will be described.

No. 7: Array active cycle

Figure 39:
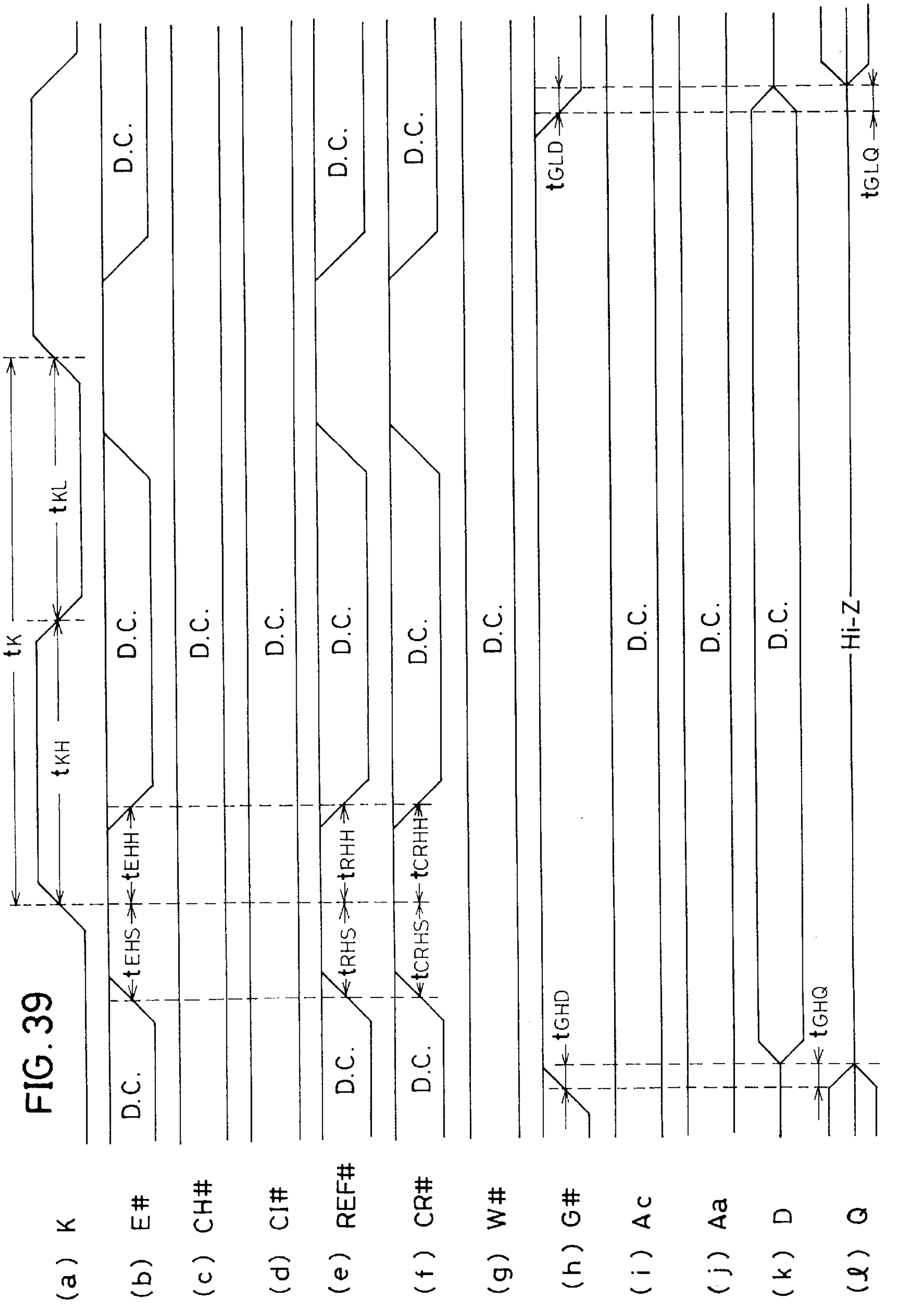
FIG. 39 is a diagram of signal waveforms showing timings of various external control signals for operating the semiconductor memory device in accordance with the present invention in an array active cycle.

In array active cycle shown in FIG. 39, row selecting operation, column selecting operation and data writing/reading are carried out in accordance with the applied array address Aa. In array active cycle, chip select signal E#, refresh designating signal REF# and command register signal CR# are set to "H" at a rising edge of external clocks signal K, and output enable signal G# is fixed at "H" for this cycle. Cache hit signal CH#, cache inhibition signal CI# and write enable signal W# may be at an arbitrary state. External input data D may be at an arbitrary state and external output data Q is set at high impedance state in array active cycle.

No. 7QT: Array active cycle accompanied with transparent output mode

Figure 40:
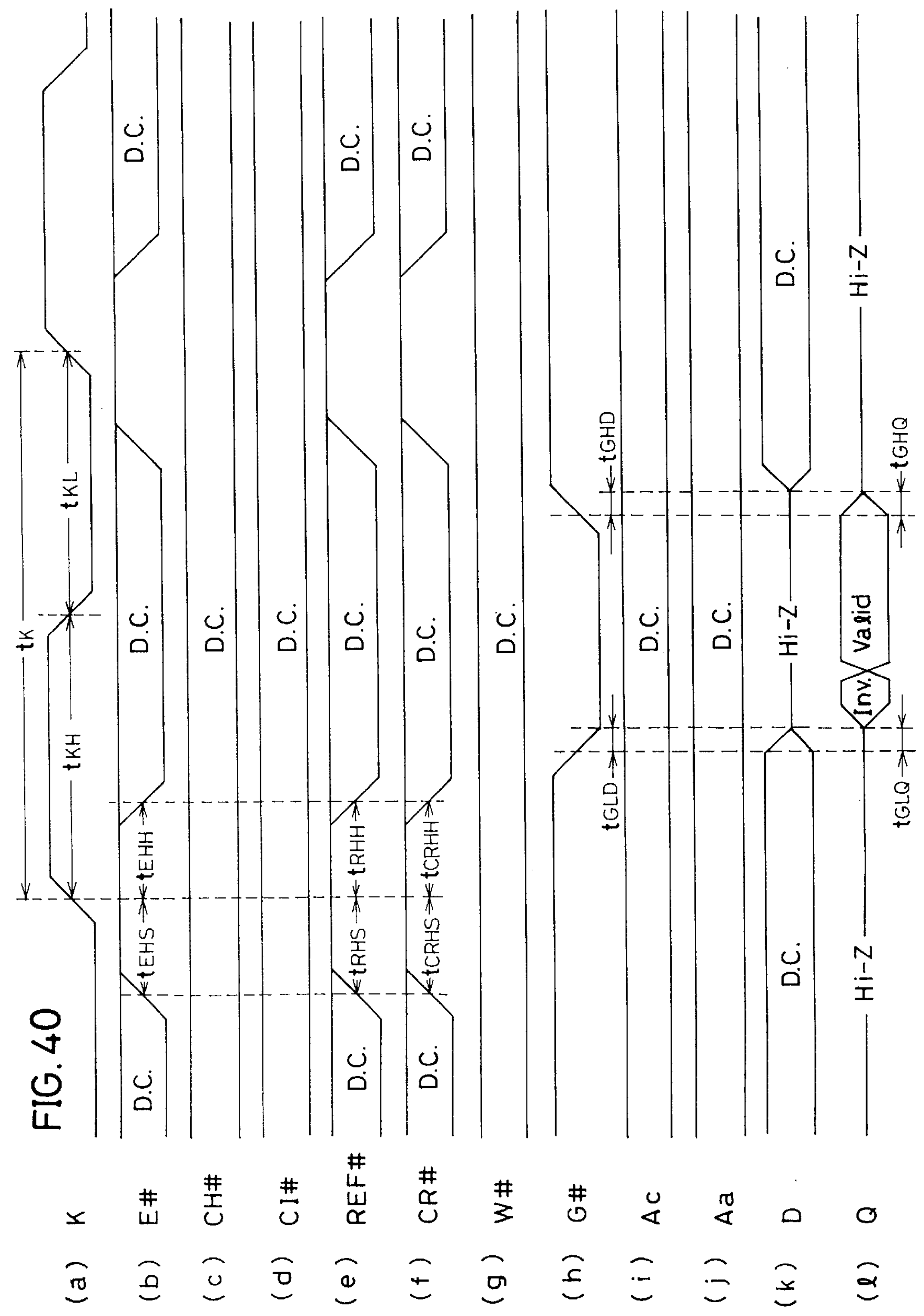
FIG. 40 is a diagram of signal waveforms showing timings of various external signals for operating the semiconductor memory device in accordance with the present invention in the array active cycle of the transparent output mode.

Control signals E#, CH#, CI#, REF#, CR# and W# are set in the same manner as in the array active cycle shown in FIG. 39, for designating the array active cycle in the transparent output mode shown in FIG. 40. In the array active cycle in transparent output mode, when the output enable signal G# is set to "L", an output buffer is activated and valid data are output. In array active cycle of the transparent output mode, data of the DRAM cell corresponding to the array address Aa set in array read cycle shown in FIG. 38 is output.

No. 7QL: Array active cycle in latched output mode

Figure 41:
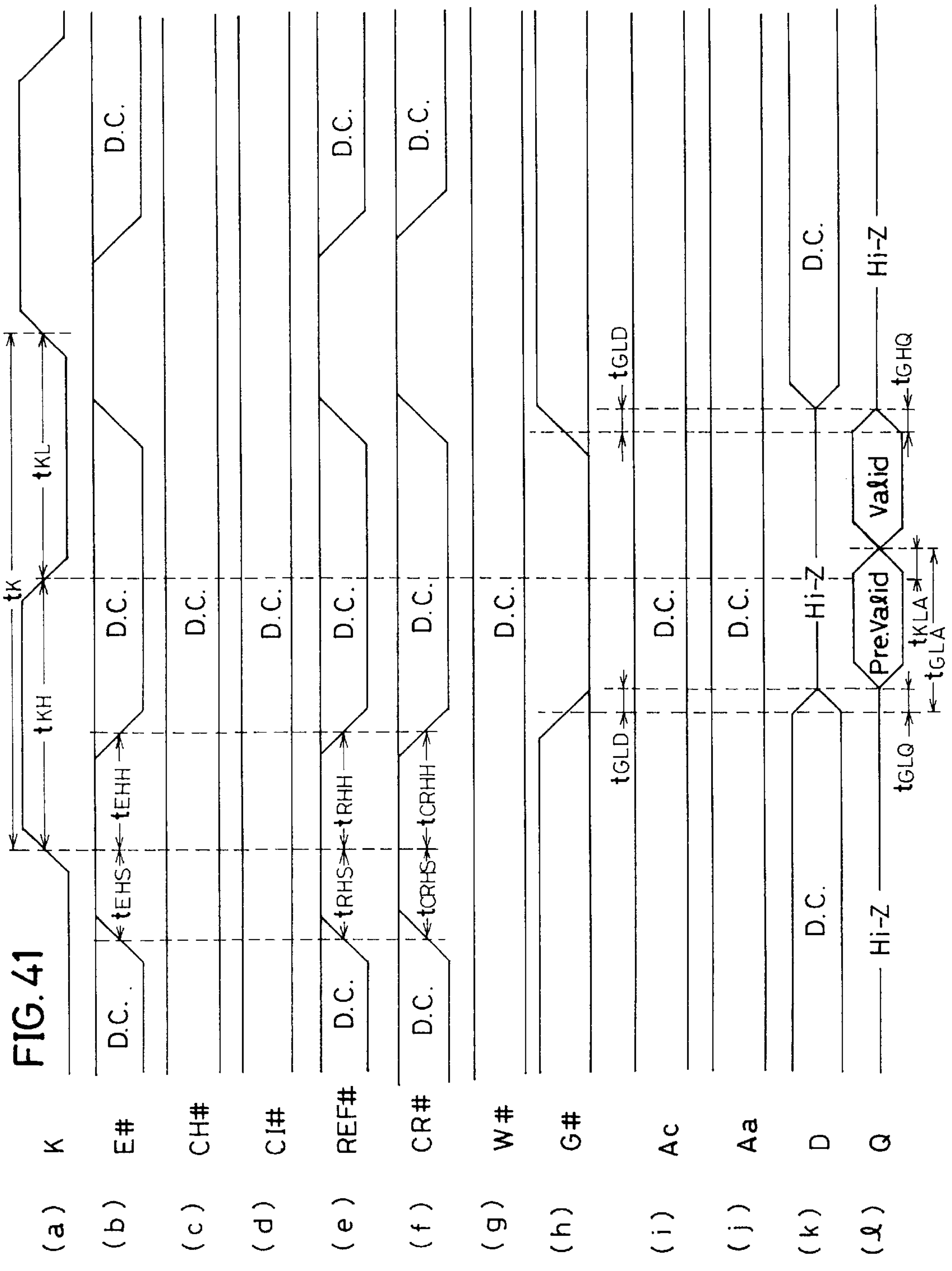
FIG. 41 is a diagram of signal waveforms showing timings of various external signals for operating the semiconductor memory device of the present invention in an array active cycle accompanied with the latch output mode.

Timings of control signals in array active cycle of the latched output mode shown in FIG. 41 are the same as those shown in FIG. 40. Data (latched in an output register) read in the previous access cycle (either a cache access cycle or array access cycle) is output at first, then data read in the present array access cycle is output.

No. 7QR: Array active cycle in registered output mode.

Figure 42:
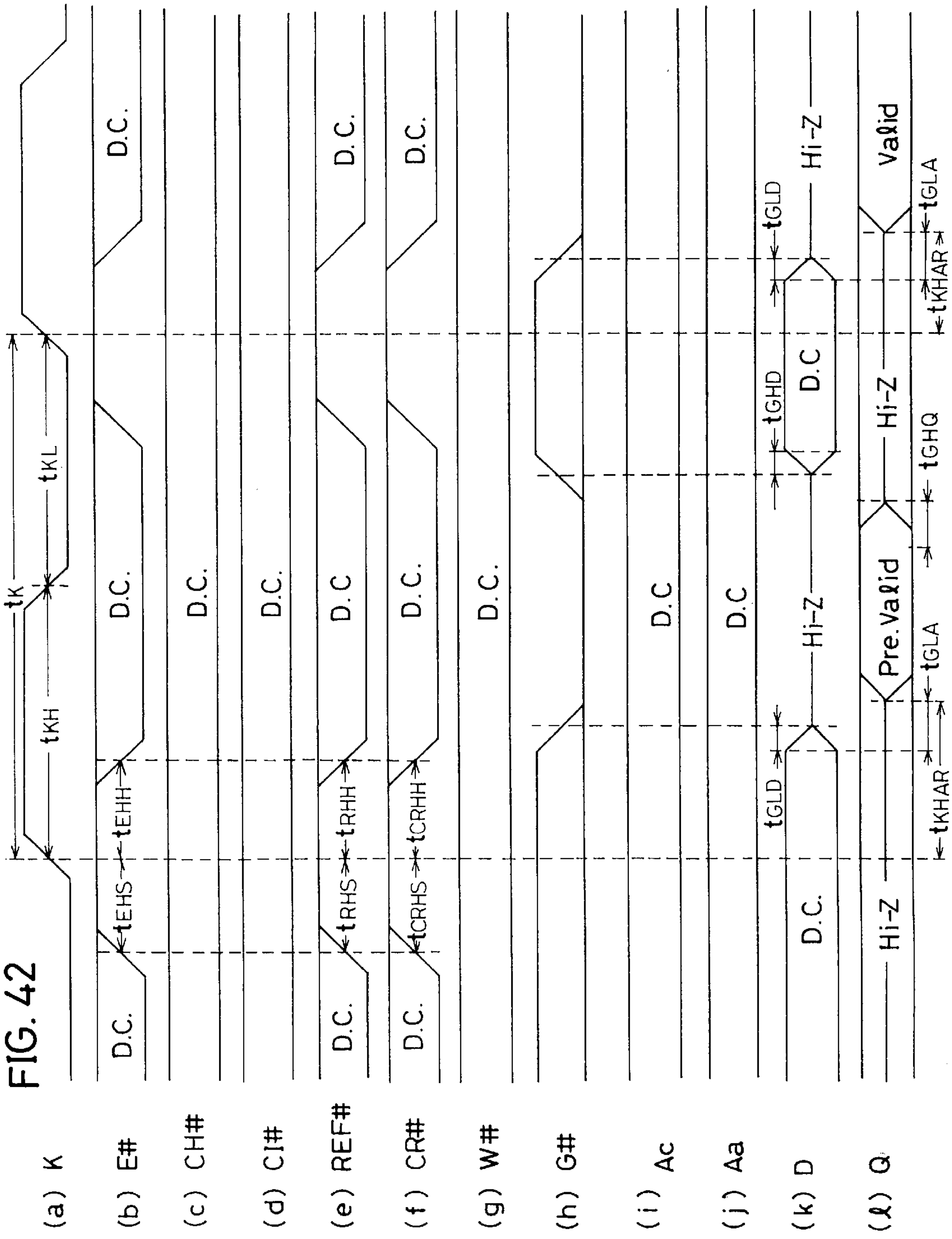
FIG. 42 is a diagram of signal waveforms showing timings of various external signals for operating the semiconductor memory device in accordance with the present invention in the array active cycle accompanied with the register output mode.

States of control signals in the array active cycle in registered output mode shown in FIG. 42 are the same as those shown in FIGS. 40 and 41. In the array active cycle of the registered output mode, when output enable signal G# which has been maintained at "H" is set to "L", external write data D is set to the high impedance state, and data read in the previous access cycle is output in the present cycle. In the registered output mode array access cycle, when output enable signal G# falls from "H" to "L" at the next clock cycle, data read in the present array access cycle is output.

By combining cycles shown in FIGS. 38 to 42, output data Q in accordance with external addresses can be provided from the array.

Figure 43:
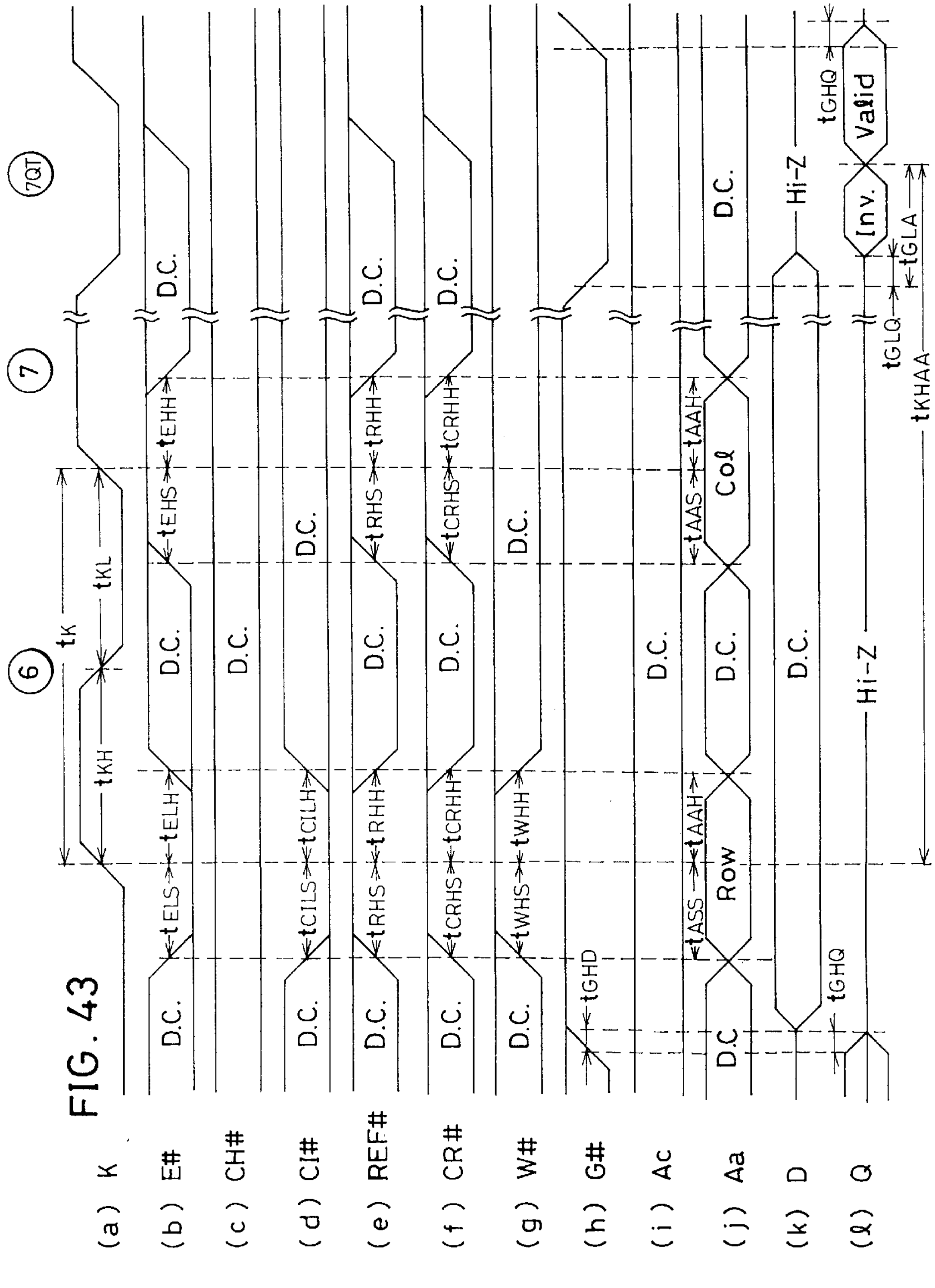
FIG. 43 is a diagram of signal waveforms showing timings of various external signals for operating the semiconductor memory device in accordance with the present invention in the array read cycle of the transparent output mode.

FIG. 43 shows the cycles executed when data are read from the array in transparent output mode. In FIG. 43, numerals in circles at the upper portion of the timing diagram correspond to numbers allotted to the above description of respective cycles.

In array reading operation in the transparent output mode, the array read cycle (No. 6) shown in FIG. 38 is executed. By this cycle No. 6, the array address Aa is successively taken as the row address and the column address at the rising edges of the external clock signal K. Thereafter, the array active cycle shown in FIG. 39 is carried out for a prescribed number of times, for selecting rows and columns in the DRAM array. Finally, the cycle No. 7 shown in FIG. 40 is executed, and by making output enable signal G# fall to "L", invalid data is output, and then valid data is output. In this case, access time tKHAA is approximately the same as the access time in a normal DRAM.

Figure 44:
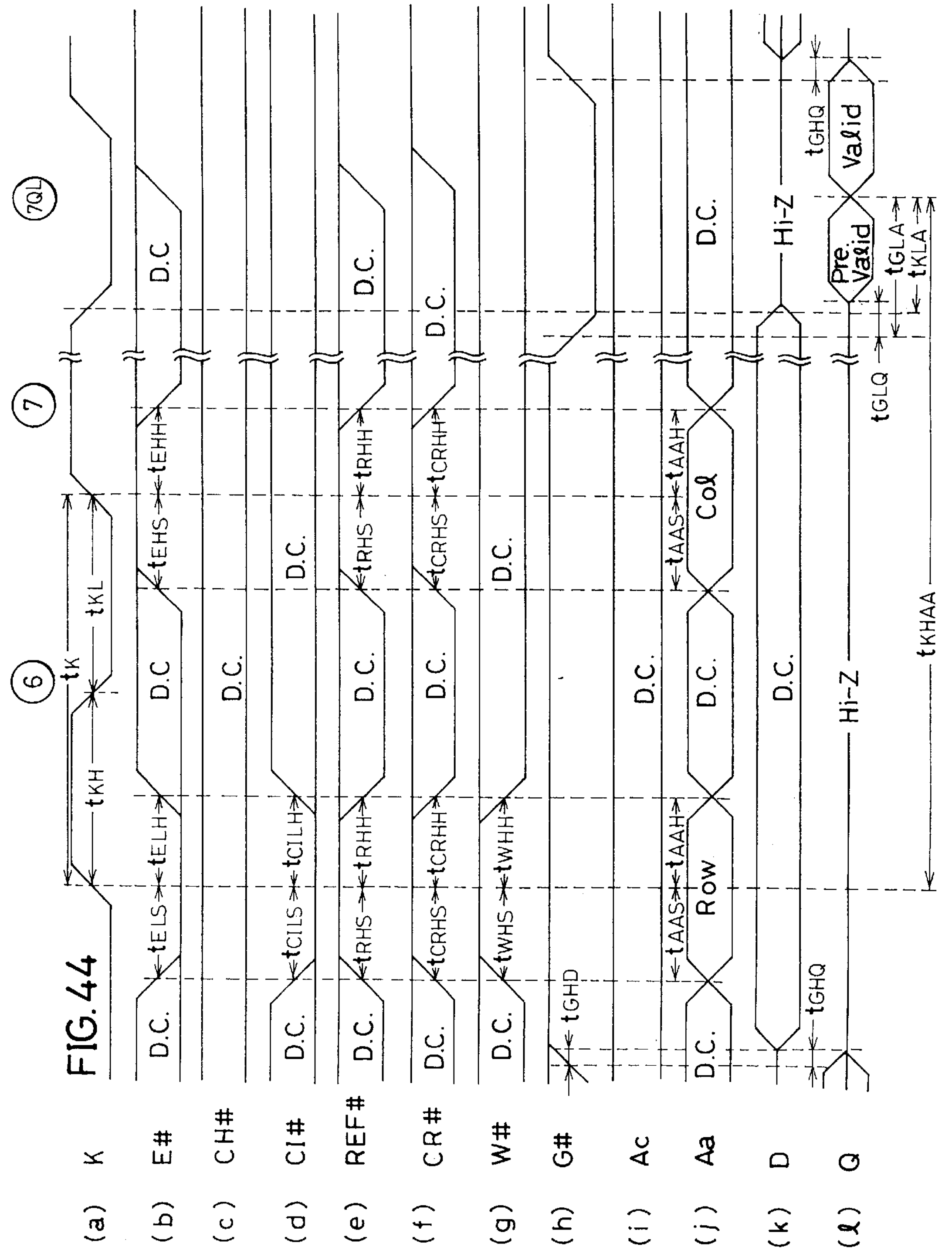
FIG. 44 is a diagram of signal waveforms showing timings of various external signals for operating the semiconductor memory device in accordance with the present invention in the array read cycle of the latch output mode.

FIG. 44 shows the cycles carried out when data are read from the array in the latched output mode. In the array reading operation in the latched output mode also, at first the array read cycle (No. 6) shown in FIG. 38 is executed, as in the array reading operation in the transparent output mode shown in FIG. 43, and mode for reading data from the array is set. After the array address Aa has been latched by this array read cycle (cycle No. 6), array active cycle shown in FIG. 39 (cycle No. 7) is carried out for a prescribed number of times. After the array active cycle (cycle No. 7), an array active cycle in the latched output mode (cycle No. 7QL) shown in FIG. 41 is executed. When output enable signal G# which has been set at "H" falls to "L" in this cycle No. 7QL, data read by the previous access is output, and then data of the memory cell to which access is requested in the present array read cycle is output. The access time tKHAA at this time corresponds to the time required from the first rising edge of the external clock signal K to the output of memory cell data (valid) to which access is requested in the present array access cycle.

Figure 45:
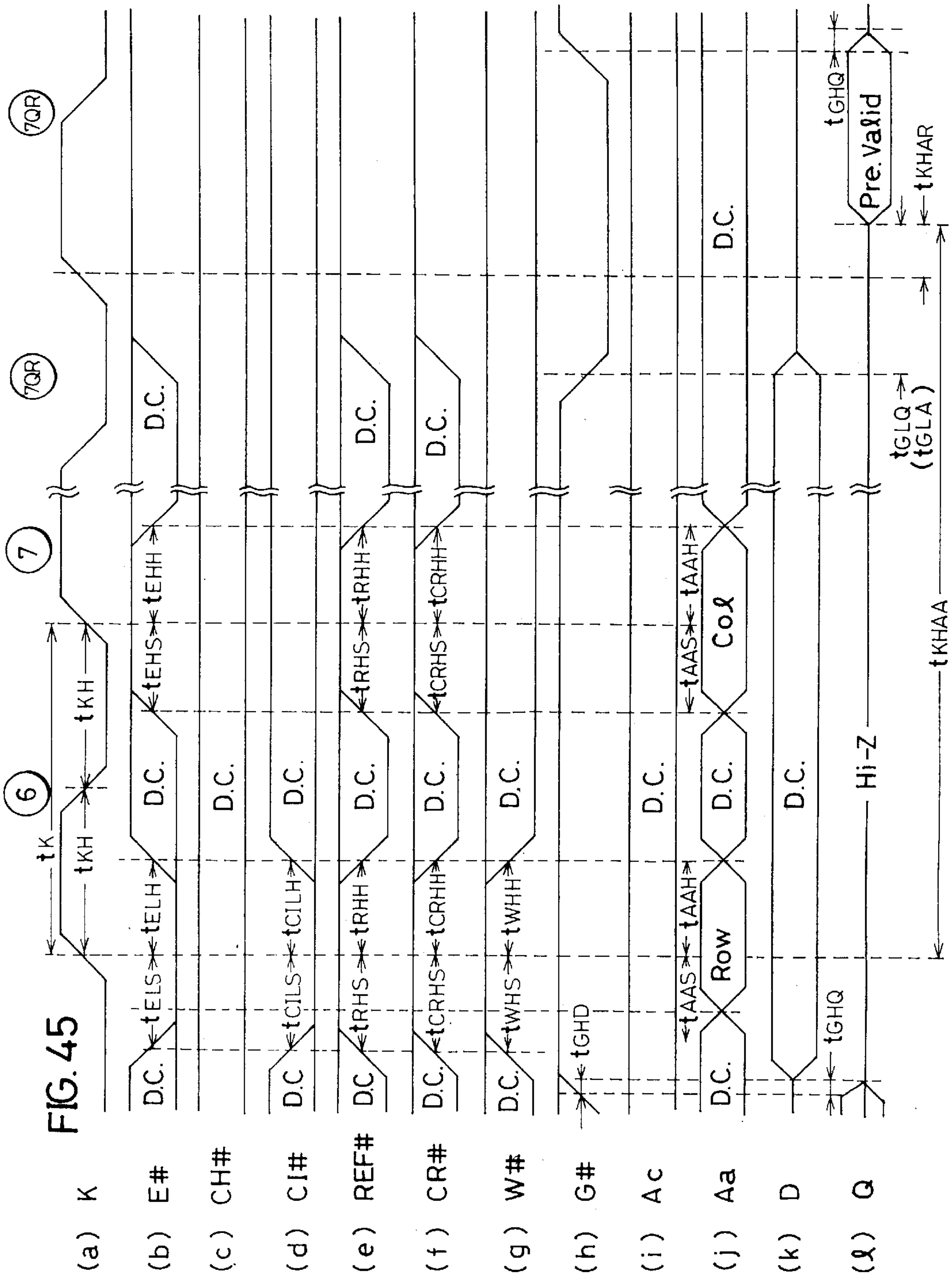
FIG. 45 is a diagram of signal waveforms showing timings of various external signals for operating the semiconductor memory device in accordance with the present invention in the array read cycle of the register output mode.

FIG. 45 shows cycles carried out when data are read from the array in registered output mode. Referring to FIG. 45, first the cycle No. 6 is executed and array read mode is set. At a rising edge of external clock signal K, the array address Aa is time divisionally latched as the row address and the column address. Thereafter, the array active cycle of cycle No. 7 is carried out for a prescribed number of times, and then the array active cycle of cycle No. 7QR is executed. In this cycle No. 7QR is executed. In this cycle No. 7QR, after a time lapse of tQHA or tGLA which is later after the rise of the external clock signal K and after the fall of the output enable signal G# to "L", data read in the previous cycle is output as the output data Q. The access time tKHAA is the time from the first rising edge of the external clock signal K to the output of valid data in cycle No. 6.

The DRAM cells must be refreshed periodically. Setting of the refresh operation is done by an external refresh designating signal REF#. In the refreshing operation, a refresh address is generated from a refresh address counter (see counter circuit 293 of FIG. 11) in response to refresh designating signal REF# in the CDRAM, and DRAM cells are automatically refreshed in accordance with the refresh address. DRAMs having such automatic refreshing function have been known in the field of DRAMs. Timings of signals for refreshing will be described.

No. 8: Refresh cycle

Figure 46:
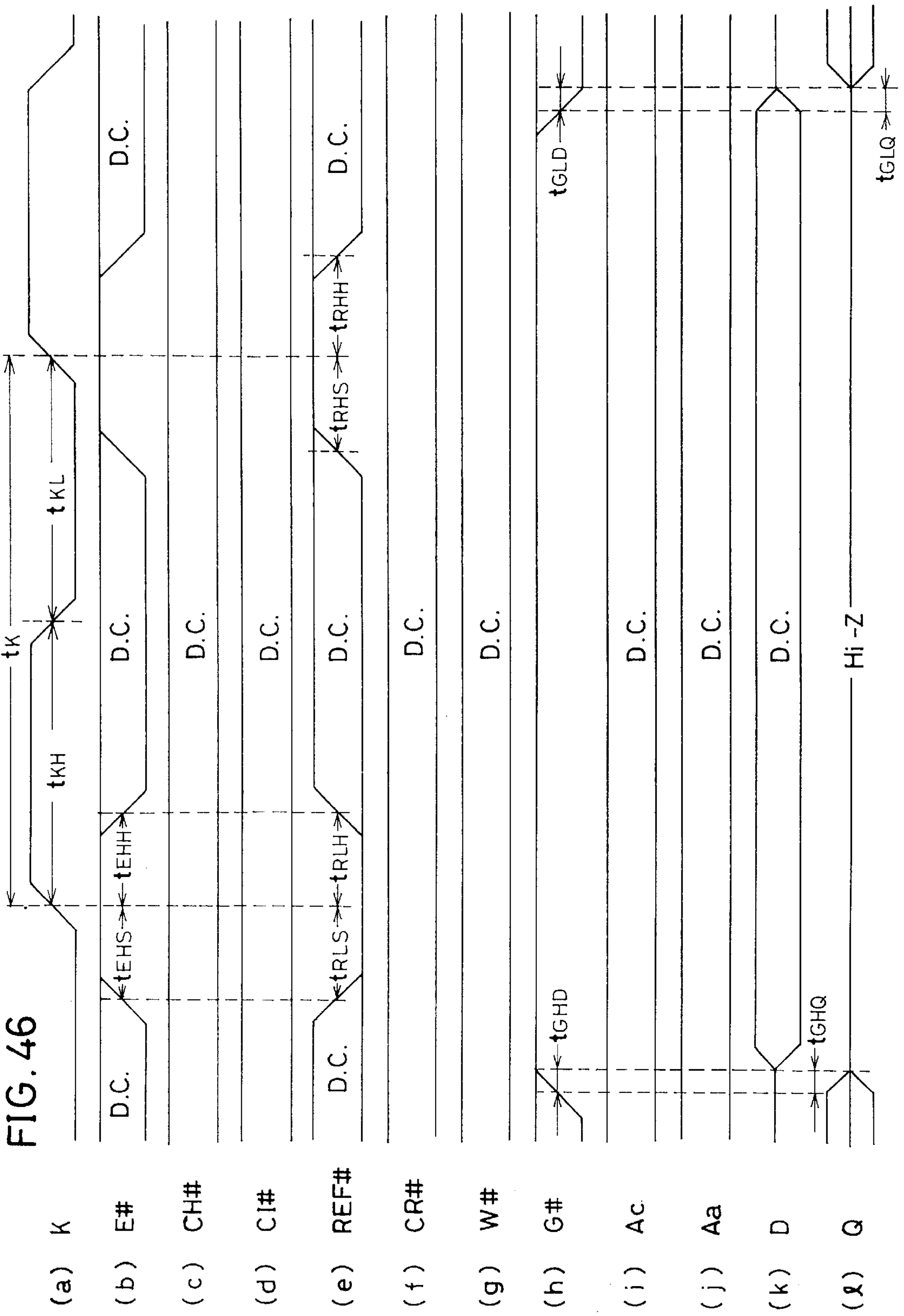
FIG. 46 is a diagram of signal waveforms showing timings of various external signals for effecting a refresh cycle of the semiconductor memory device of the present invention.

FIG. 46 shows signal timings of the refresh cycle. As shown in FIG. 46, refresh mode of the DRAM is set by setting chip select signal E# and refresh designating signal REF# to "H" and "L" at a rising edge of external clock signal K as shown in FIG. 46. When chip select signal E# is set to "H" and refresh designating signal REF# is set to "H" at a rising edge of the external clock signal K, refreshing of the DRAM is stopped. In the refresh cycle, other control signals CH#, CI#, CR# and W# may be at arbitrary states, and an output enable signal G# is set to "H". Therefore, the cache address Ac and array address Aa may be at arbitrary states. External input data D also may be set at an arbitrary state. External output data Q is set to a high impedance state.

Refreshing operation is effected only to the DRAM. Refreshing is not necessary in the SRAM. Therefore, cache can be accessed during the refreshing operation.

Timings when refreshing operation and access to the cache are simultaneously carried out will be described in the following.

No. 8W: Refresh cycle with cache hit writing

Figure 47:
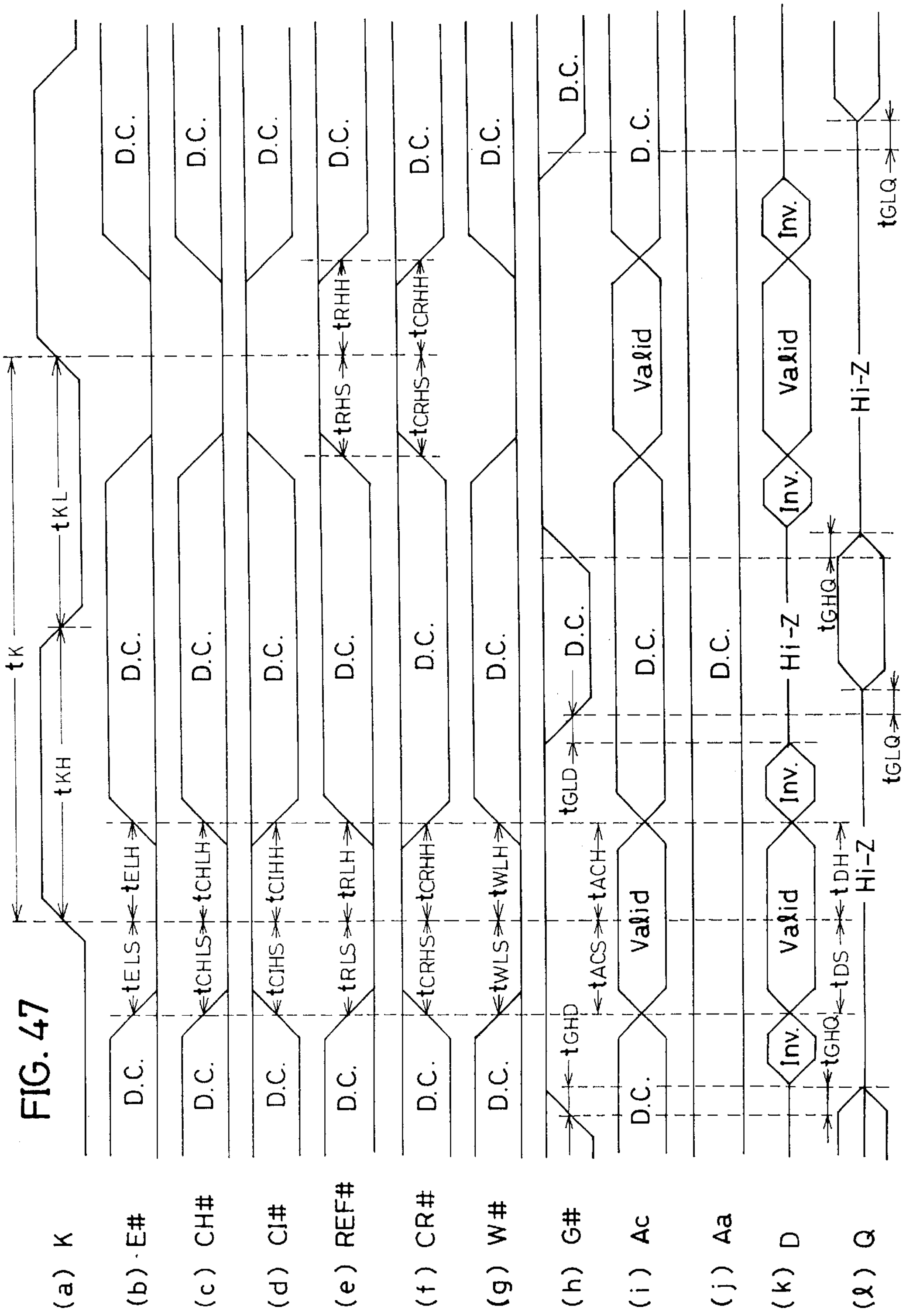
FIG. 47 is a diagram of signal waveforms showing timings of various external signals for effecting the refresh cycle together with the cache hit writing in the semiconductor memory device in accordance with the present invention.

In cycle No. 8W, in parallel to refreshing of the DRAM, writing of data to a corresponding SRAM cell is carried out when a cache hit occurs. Setting of the refresh cycle with the cache hit writing is set by setting chip select signal E#, cache hit signal CH#, refresh designating signal REF# and write enable signal W# to "L" and by setting cache inhibition signal CI# and output enable signal G# to "H" at a rising edge of external clock signal K as shown in FIG. 47. Thus a cache hit write cycle is set and refresh cycle is set. In the cache (SRAM), external write data D is taken and written to a corresponding SRAM cell position at a rising edge of external clock signal K, in response to active states of the cache hit designating signal CH# and write enable signal W#. In the DRAM, an internal refresh address counter is started by the refresh designating signal REF#, and refreshing operation is carried out in accordance with a refresh address from the counter.

When refresh designating signal REF# is set to "H" at a rising edge of external clock signal K, the cache hit write cycle (cycle No. 1) shown in FIG. 31 only is carried out, and refreshing operation of the DRAM is stopped.

No. 8RT: Refresh cycle with cache hit reading in transparent output mode.

Figure 48:
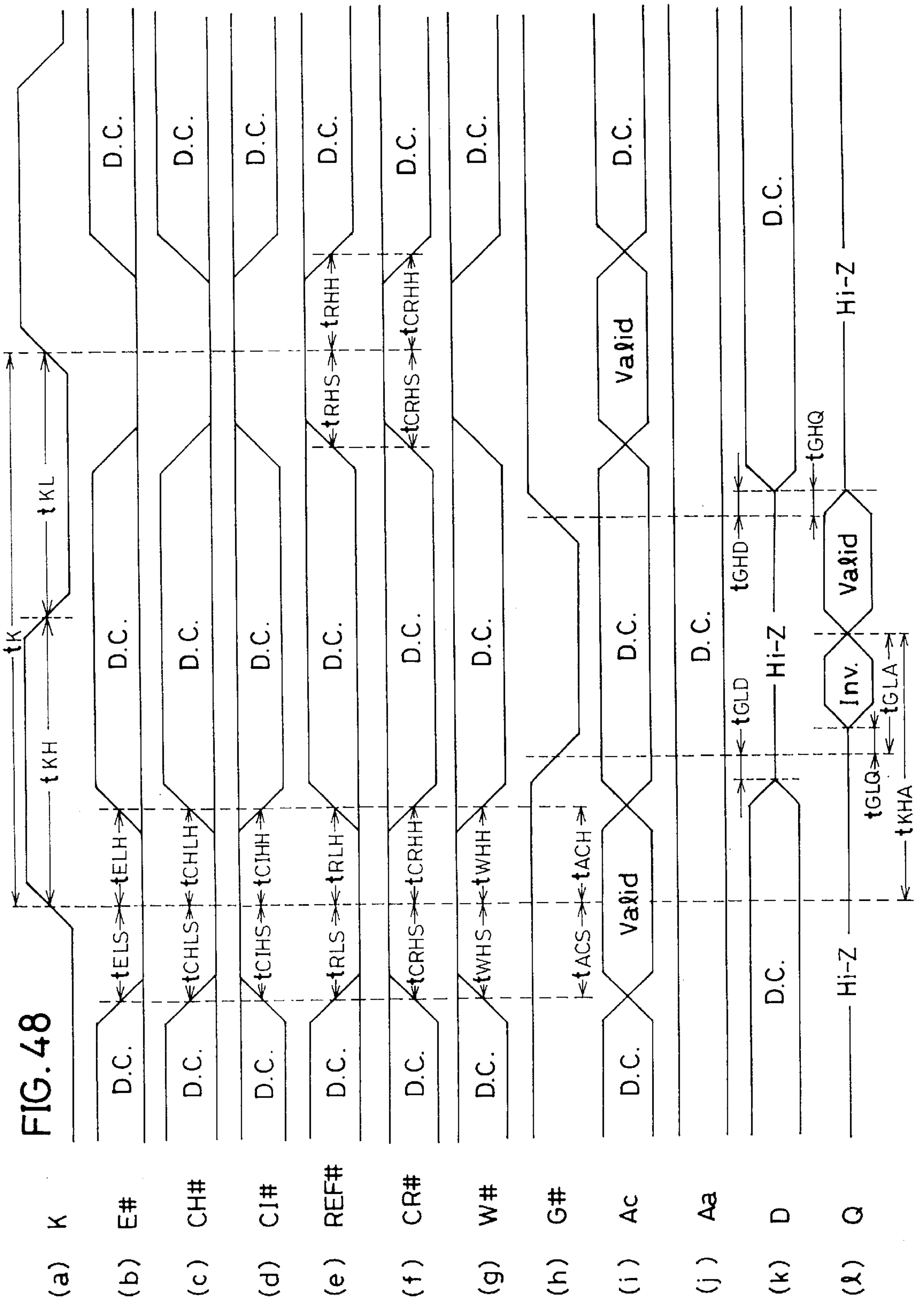
FIG. 48 is a diagram of signal waveforms showing timings of various external signals for effecting the refresh cycle together with the cache hit reading in the transparent output mode in the semiconductor memory device in accordance with the present invention.

In cycle No. 8RT, cache hit reading is carried out in accordance with the transparent output mode, and DRAM is automatically refreshed. The cycle No. 8 is set by setting the chip select signal E#, cache hit signal CH# and refresh designating signal REF# to "L" to a rising edge of external clock signal K, and by setting cache inhibition signal CI#, command register signal CR# and write enable signal W# to "H" as shown in FIG. 48. In SRAM cache, cache address Ac is taken and a corresponding SRAM cell is selected at a rising edge of external clock signal K in response to the designation of cache hit reading. When output enable signal G# falls to "L", valid output data Q is output after a lapse of a prescribed time period.

In the DRAM, automatic refreshing is carried out in response to refresh designating signal REF#. When refresh designating signal REF# is set to "H" at a rising edge of external clock signal K in refresh cycle with cache hit reading, automatic refreshing carried out in response to refresh designating signal REF# is stopped. Therefore, in this case, cache hit read cycle in the transparent output mode which is the same as the cycle No. 2T is carried out.

No. 8RL: Refresh cycle with cache hit read in latched output mode.

Figure 49:
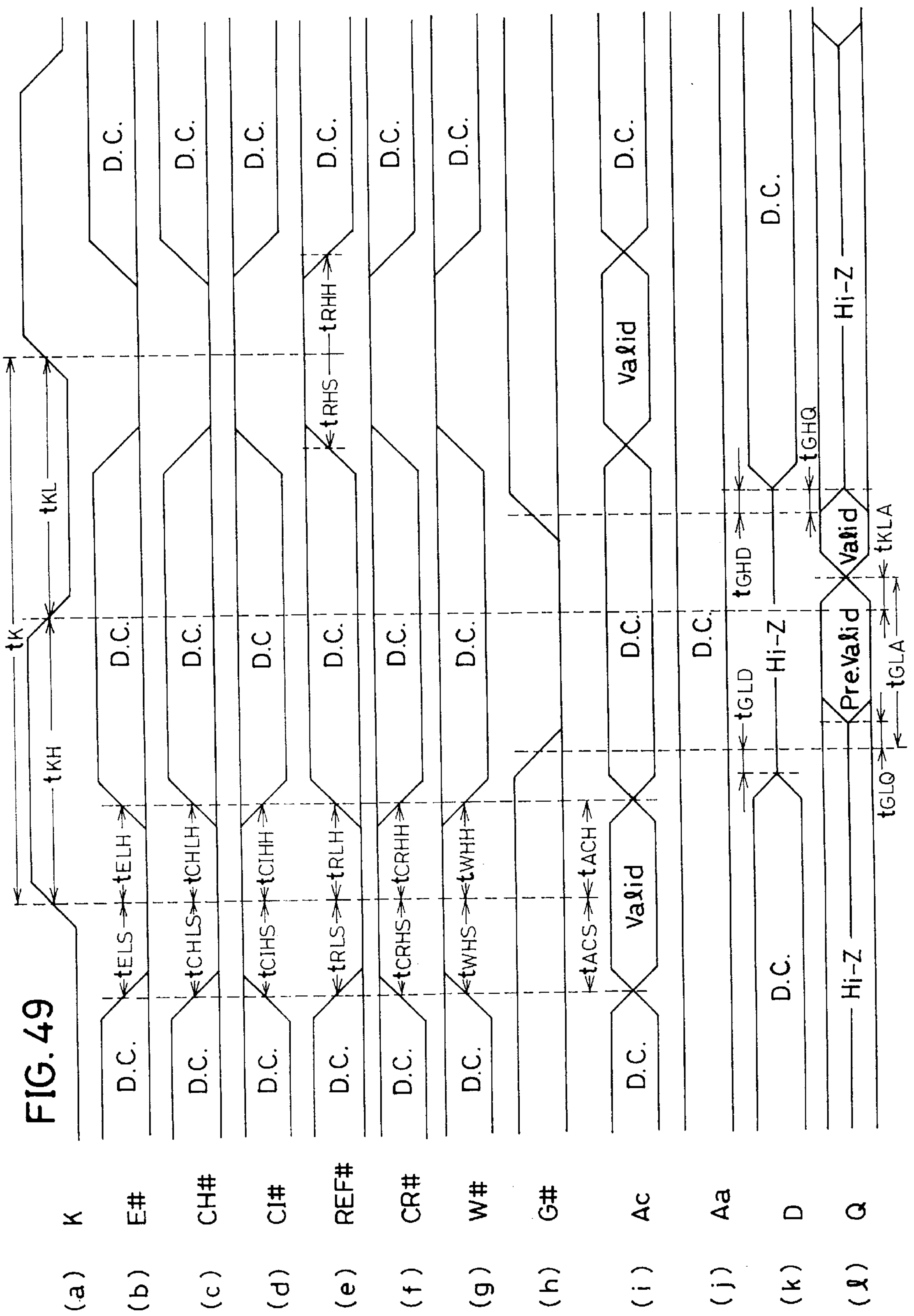
FIG. 49 is a diagram of signal waveforms showing timings of various external signals for effecting the refresh cycle together with the cache hit reading in the latch output mode in the semiconductor memory device in accordance with the present invention.

In cycle No. 8RL shown in FIG. 49, cache hit reading in latched output mode is carried out together with automatic refreshing of the DRAM. Timing conditions of various control signals are the same as those shown in FIGS. 47 and 48. In the latched output mode, when a cache hit occurs, output enable signal G# falls to "L", then data access in the previous cycle is output, and successively data accessed in the present cycle is output.

No. 8RR: Refresh cycle with cache hit read cycle in registered output mode.

Figure 50:
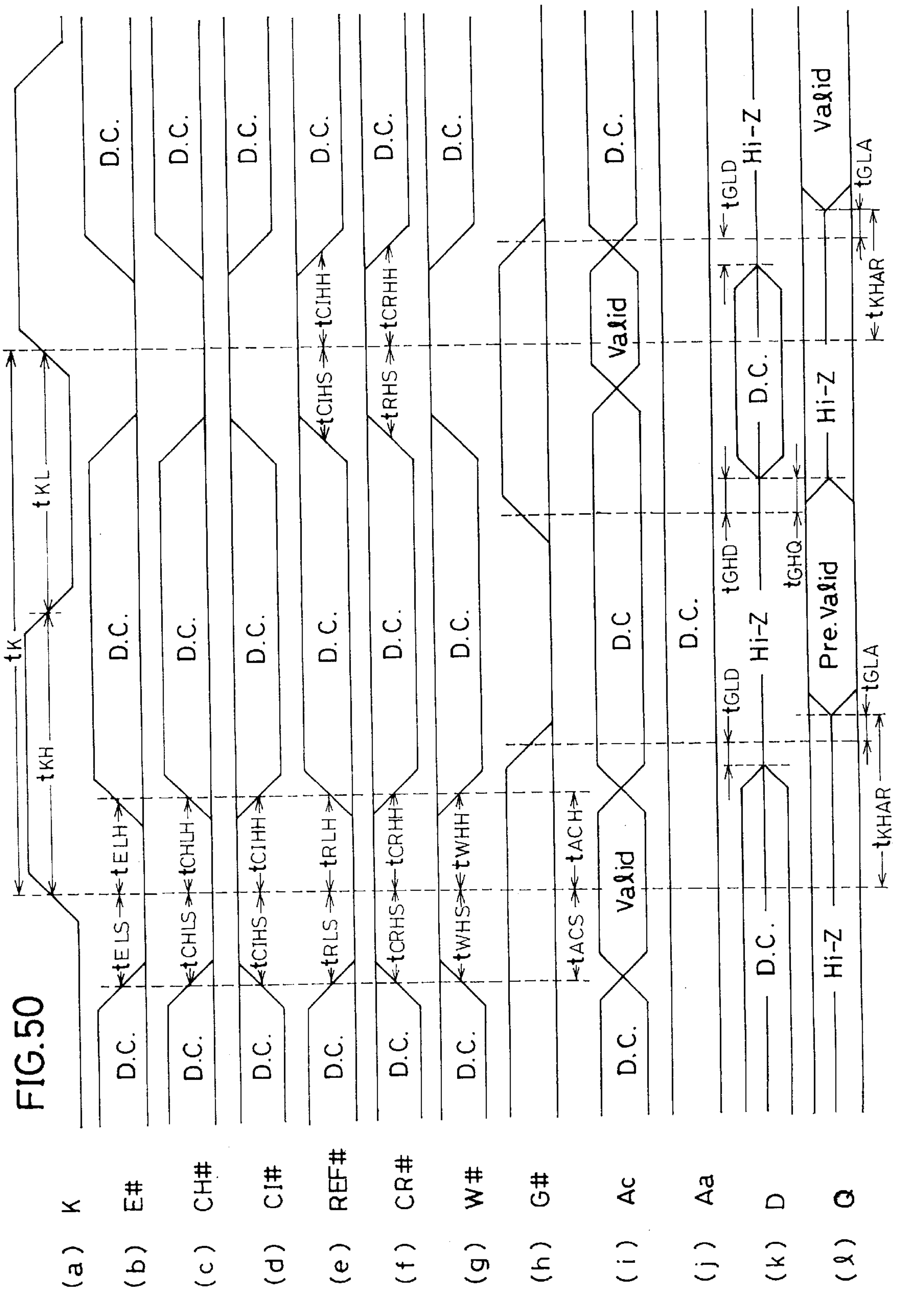
FIG. 50 is a diagram of signal waveforms showing timings of various external signals for effecting the refresh cycle together with the cache hit reading in the register output mode in the semiconductor memory device in accordance with the present invention.

In cycle No. 8RR shown in FIG. 50, data reading is carried out in accordance with the cache hit read cycle in the registered output mode, and the DRAM is automatically refreshed. Timing conditions of various control signals are the same as those shown in FIGS. 48 and 49, and hit reading and automatic refreshing are carried out. In this cycle No. 8RR, when output enable signal G# falls to "L", output data selected in the previous cycle is output. Thereafter, output enable signal G# is once raised to "H", and thereafter output enable signal G# is set to "L", in the next clock cycle, when the data of the SRAM cell selected in the present cycle is output.

The transparent output mode, latched output mode, registered output mode, masked write mode and D/Q separation mode of the CDRAM can be realized by setting commands for setting desired special function in the command register. Operation cycle for setting commands in the command register will be described in the following.

No. 9: Command register set cycle.

Figure 51:
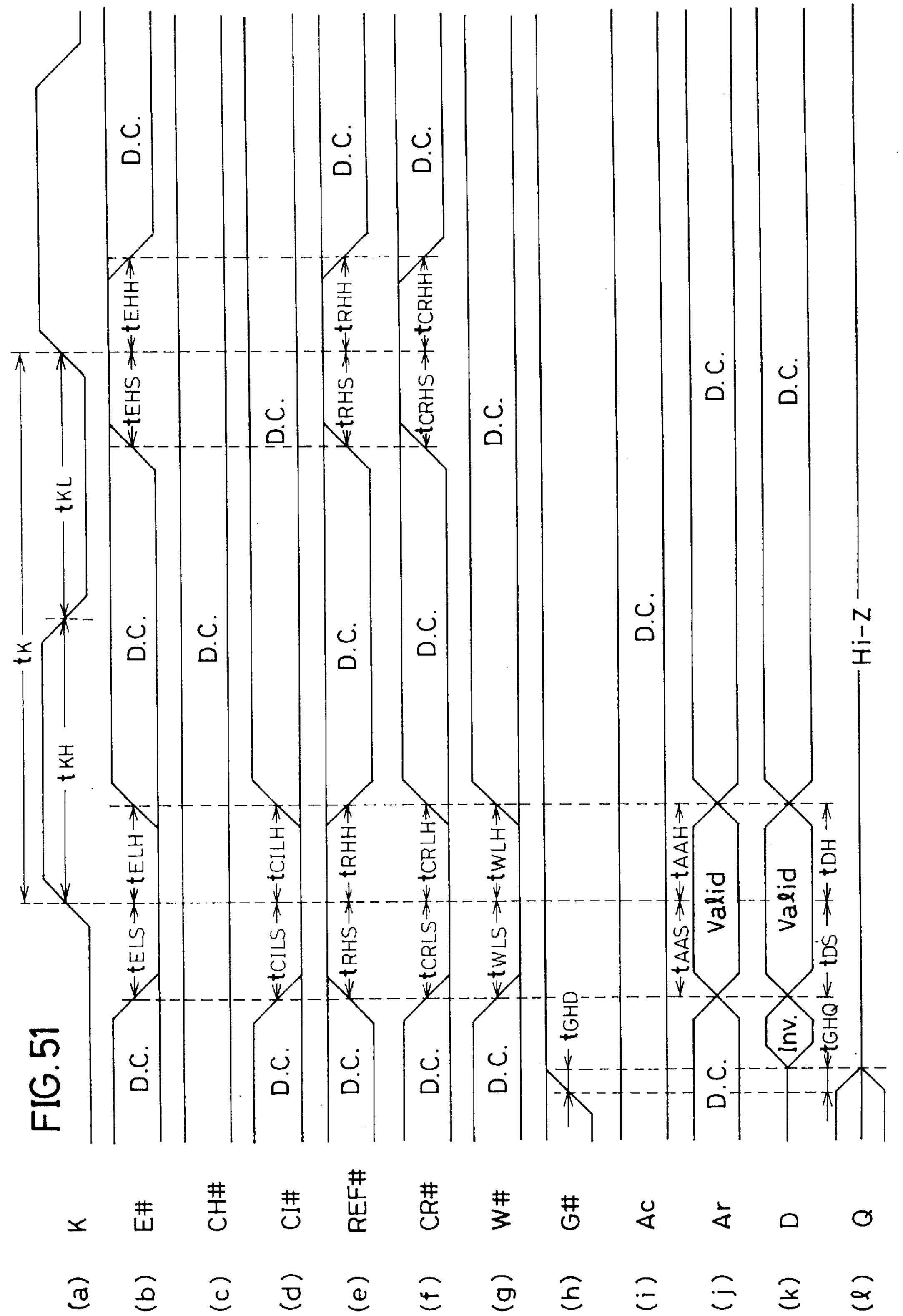
FIG. 51 is a diagram of signal waveforms showing timings of various external signals for setting command registers in the semiconductor memory device of the present invention.

FIG. 51 shows timings of various signals in command register set cycle (cycle No. 9). The command registers set cycle is realized by setting chip select signal E#, cache inhibition signal CI#, command register signal CR# and write enable signal W# to "L" at a rising edge of external clock signal K. At this time, any one of four registers WR0 to WR3 of the command registers is selected as shown in FIG. 27. Command register WR0 is selected in setting the output mode, and content of the output mode is selected dependent on the combination of the input data D at that time. Therefore, at a rising edge of the external clock signal K, a command address Ar and an external write data D are regarded as valid and latched. When 2 bits Ar0 and Ar1 of the command address AR are both 0 ("L"), the command register WR0 is selected. When upper 2 bits D2 (DQ2) and D3 (DQ3) of 4 bits of external write data D are "0" ("L") and the least significant bit D0 (DQ0) is "0" of 4 bits of external write data D, the transparent output mode is set.

The latched output mode is selected by setting external write data D0 and D1 to "1" ("H") and "0", respectively and by setting remaining 2 bits of external write data D2 and D3 to "0" at a rising edge of external clock signal K. The registered output mode is selected by setting command addresses Ar0 and Ar1 to "0", setting external write data D0 and D1 (DQ0 and DQ1) both to "1" and by setting external write data D2 and D3 (DQ2 and DQ3) both "0" at a rising edge of external clock signal K. In the structure of the command registers shown in FIG. 27, 8 registers are provided, enabling setting of 8 different special modes. The command register RR0 for setting the masked write mode, and the register RR1 for setting D/Q separation mode are selected by setting write enable signal W# to "H" at the timing shown in FIG. 51. Dependent on the value of the command address Ar at this time, a desired mode can be selected.

[State Transition]

Figure 52A:
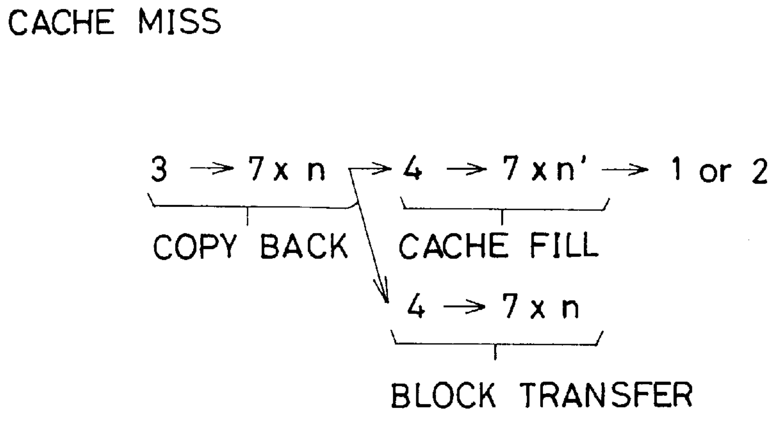
FIGS. 52A and 52B show state transition at a cache miss in the semiconductor memory device in accordance with the present invention.
Figure 52B:
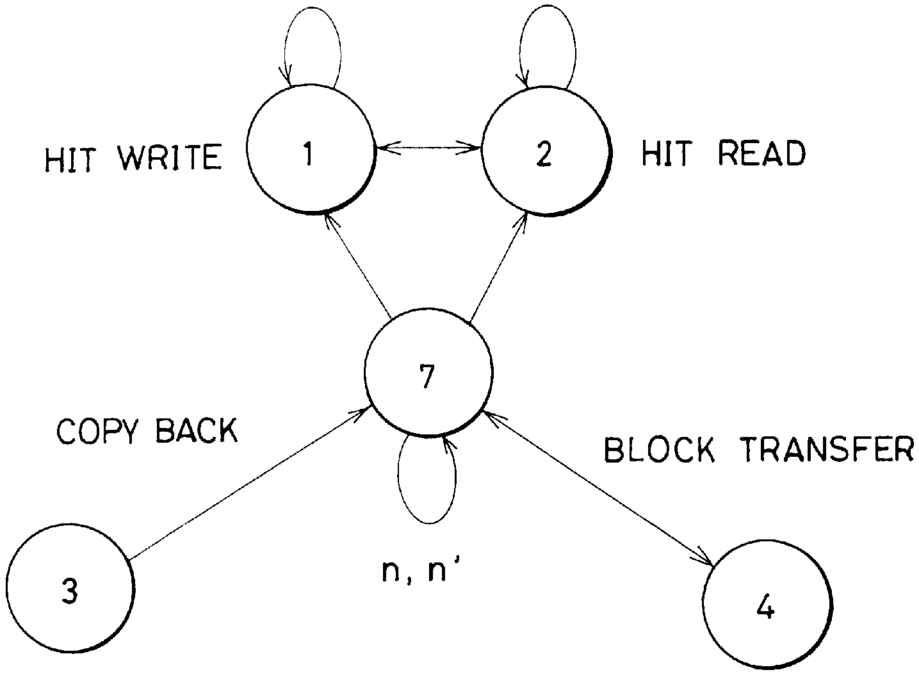

FIG. 52 shows state transition of the CDRAM at a time of a cache miss (miss hit). FIG. 52A shows a flow of state transition, and FIG. 52B shows state transition between respective cycles.

In FIG. 52, the cycles are denoted by cycle numbers. A case in which "copy back" operation and "block transfer" operation are successively carried out is shown as an example.

Referring to FIG. 52, when a cache miss occurs, a copy back cycle (cycle No. 3) shown in FIG. 35 is carried out at first. Consequently, data transfer mode from the SRAM to DRAM is set. Thereafter, array access cycle (cycle No. 7) shown in FIG. 39 is repeated for n (n=(ta/tk)−1) times. The reference character ta represents cycle time of the DRAM, and tk represents cycle time of the external clock K. By repeating cycle No. 7 for n times, collective transfer of data blocks from SRAM to DRAM is completed. Thereafter, block transfer cycle (cycle No. 4) shown in FIG. 38 is carried out. Consequently, data transfer mode from DRAM to SRAM is set. By repeating cycle No. 7 for n times successive to the cycle No. 4, transfer of data blocks from DRAM to SRAM is carried out. Thereafter, the DRAM is ready for receiving next access. This state is referred to as a block transfer mode. From this time on, the CPU can access to SRAM or DRAM.

When array active cycle (cycle No. 7) is repeated for n' (n'=(ta/2·tK)−1) times successive to the cycle No. 4, restore operation to the memory cell and RS precharging are not yet completed in the DRAM, and therefore it cannot be accessed. However, in the SRAM, block data has been already transferred from the DRAM in this state, restore is not necessary, and data on the SRAM bit line pair has been established. Therefore, the CPU can access the SRAM at this state. This state is referred to as a cache fill state. In the cache fill state, the CPU can access only to the SRAM. Either the cache hit write cycle (cycle No. 1) shown in FIG. 31 or cache hit read cycle (cycle No. 2) shown in FIG. 34 is carried out after cache fill. The cache hit read cycle (cycle No. 2) may be carried out in transparent output mode, latch output mode or register output mode. Hit writing can be successively carried out at every clock cycle, and hit read cycle can be successively carried out at every clock cycle. The operation may be switched from the hit read cycle to the hit write cycle. Data transfer may be carried out in accordance with the high speed transfer mode (fast copy back) in which "copy back" and "block transfer" are carried out parallel to each other.

Figures 53A, 53B:
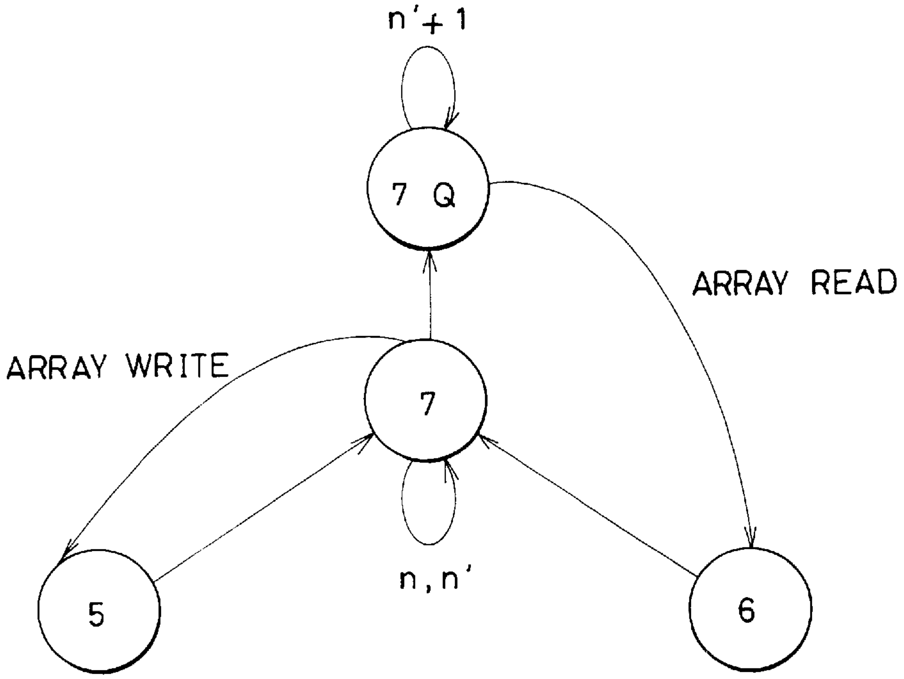
FIGS. 53A and 53B show state transition when the array is active in the semiconductor memory device in accordance with the present invention.

FIG. 53 shows state transition at a time of array accessing. FIG. 53(A) shows a flow of state transition in array access, and FIG. 53(B) shows state transition between respective cycles. Array access includes array writing to write data to the array, and array read for reading data from the array. In array writing, array write cycle (cycle No. 5) shown in FIG. 33 is carried out. Successive to the cycle No. 5, the array active cycle of cycle No. 7 is repeated for n times to write data to the DRAM array.

Figures 54A, 54B:
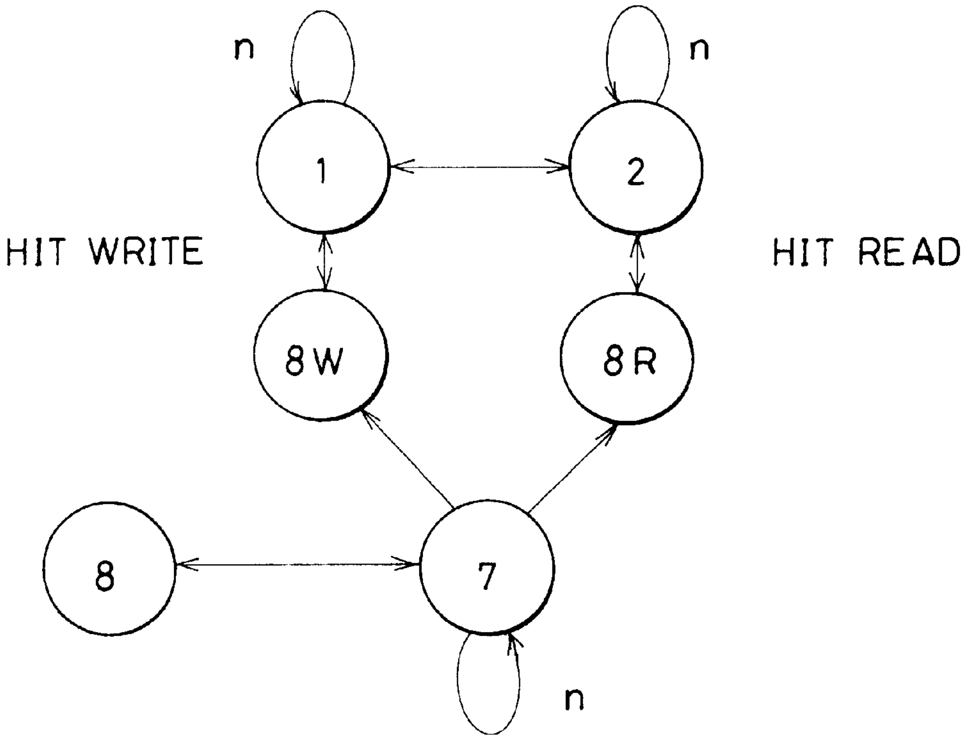
FIGS. 54A and 54B show state transition during refresh operation in the semiconductor memory device in accordance with the present invention.

In array reading, the array read cycle (cycle No. 6) shown in FIG. 38 is carried out, and access to the DRAM is enabled. After the array read cycle (cycle No. 6), the array active cycle shown in FIG. 39 (cycle No. 7) is repeated for n' times. As this state, data cannot be read from DRAM. Subsequent to the cycle No. 7, the array active cycle for data output (cycle No. 7Q) shown in FIGS. 40 and 42 is repeated for n'+1 times. The cycle No. 7Q may be the array active cycle for transparent output, array active cycle with latch output, or array active cycle with register output. By setting output enable signal G# to "L" at the last cycle of the cycle No. 7Q, data can be read from the array. The cycle times of the array writing and array reading seem to be different from each other. However, n=n'+1, and therefore reading/writing of data from and to the array can be carried out in the same clock cycle. After the array writing operation or array reading operation, array writing or array reading can be successively carried out. FIG. 54 shows state transition at a time of refreshing. FIG. 54(A) is a flow of state transition of the refreshing operation, and FIG. 54(B) shows state transition between respective cycles at the time of refreshing.

In normal refreshing in which automatic refreshing of DRAM only is carried out and access to SRAM is not carried out, first the refresh cycle (cycle No. 8) shown in FIG. 46 is carried out. Thereafter, the array active cycle (cycle No. 7) shown in FIG. 39 is repeated for n times. Consequently, one automatic refreshing operation in accordance with the refresh address from the refresh counter contained in the CDRAM is completed.

In refreshing with hit writing, the refresh cycle with cache hit writing shown in FIG. 47 (cycle No. 8W) is carried out at first. Then, automatic refreshing of the DRAM is carried out for the succeeding n clock cycles. During this period, the cache hit write cycle shown in FIG. 26 can be executed by the CPU for n times.

In refresh cycle with hit reading, the refresh cycle with cache hit reading shown in FIGS. 48 to 50 (cycle No. 8R) is carried out. Consequently, automatic refreshing of the DRAM is started, and automatic refreshing is carried out for n clock cycles in the DRAM. CPU can execute hit reading during n clock cycles. The output mode of the cycle No. 8R may be transparent output mode, latched output mode or registered output mode.

Various structures and operations of CDRAMs to which the present invention is applied have been described in the foregoing. However, the structure of the CDRAM is not limited to those of the above embodiments. The capacity is not limited to a 4M bit CDRAM, that is, 4M bit DRAM and 16K bit SRAM. DRAMs and SRAMs having arbitrary storage capacity may be used. The array lay out thereof may be modified in accordance with the shapes of the packages.

As described above, the CDRAM in accordance with an embodiment of the present invention shown in FIG. 11 operates in synchronization with an externally applied clock signal K. The clock signal K is a signal generated repeatedly in a prescribed period, such as a system clock. The clock signal is constantly generated no matter whether the CDRAM is accessed or not. The present invention has a simple circuit structure in which an oscillating circuit such as a ring oscillator is made unnecessary, by utilizing the clock signal K, and it provides an internal voltage generating circuit of low current consumption having small area of occupation.

Figure 55:
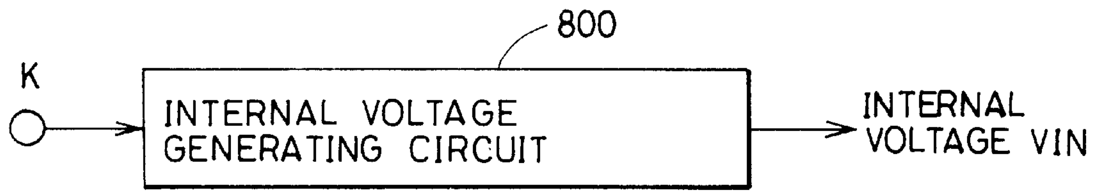
FIG. 55 is a block diagram showing relation of input and output signals of an internal voltage generating circuit in accordance with one embodiment of the present invention.

FIG. 55 is a block diagram showing the internal voltage generating circuit. The internal voltage generating circuit 800 shown in FIG. 55 corresponds to the internal voltage generating circuit 800 shown in FIG. 11. Internal clock signal K from clock buffer 254 (see FIG. 11) is applied to internal voltage generating circuit 800. However, external clock signal may be directly received through an external pin terminal without using clock buffer 254 (see FIG. 11). Internal voltage generating circuit 800 generates a desired internal voltage VIN in response to the clock signal K.

Figure 56:
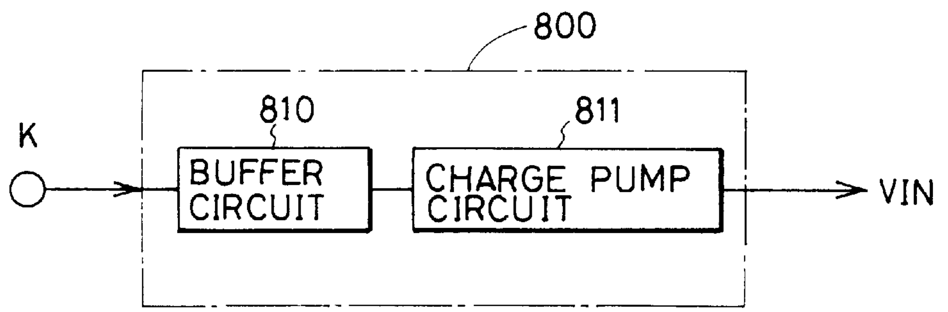
FIG. 56 is a block diagram showing an example of a specific structure of an internal voltage generating circuit shown in FIG. 55.

FIG. 56 is a block diagram showing an example of a specific structure of internal voltage generating circuit shown in FIG. 55. Referring to FIG. 56, internal voltage generating circuit 800 includes a buffer circuit 810 for buffering the clock signal K, and a charge pump circuit 811 for generating internal voltage VIN by a charge pump operation in response to the clock signal buffered in the buffer circuit 810. Buffer circuit 810 is necessary when internal voltage generating circuit 800 directly receives the external clock signal K. Therefore, when clock buffer 254 is provided as shown in FIG. 11, buffer circuit 810 is not necessary. Although buffer circuit 810 and charge pump circuit 811 are provided separately in the structure of FIG. 56, a buffer circuit and a charge pump circuit may be regarded as one charge pump circuit.

Figure 57:
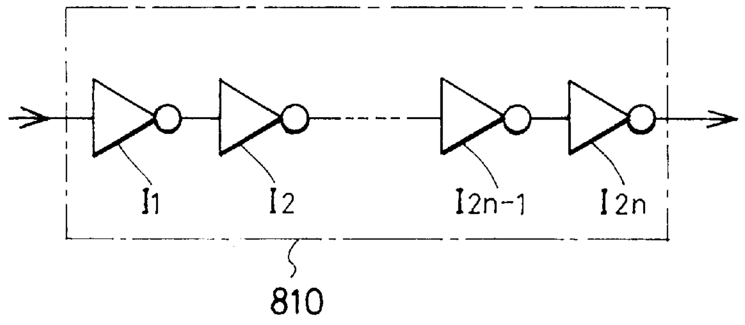
FIG. 57 shows one example of a specific structure of a buffer circuit shown in FIG. 56.

FIG. 57 shows an example of a specific structure of buffer circuit 810 shown in FIG. 56. Referring to FIG. 57, buffer circuit 810 includes an even number of serially (cascade) connected inverter circuits I1 to I2*n*. Since clock signal K is applied constantly, the number of inverter circuits included in buffer circuit 810 may be odd-number. More specifically, charge pump circuit 811 supplies and removes positive charges in response to the rise and fall of the clock signal K. Therefore, when the clock signal K is repeatedly and constantly applied, even if the clock signal K is inverted and applied, the resulting operation is the same. Therefore, the buffer circuit 810 may have a function of inverting and outputting the applied signal.

Figure 58:
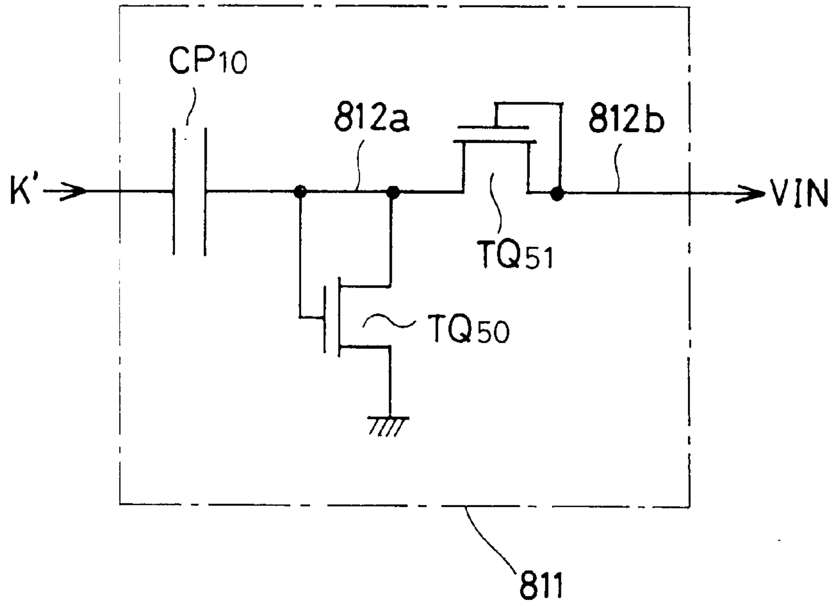
FIG. 58 shows one example of a specific structure of a charge pump circuit shown in FIG. 56.

FIG. 58 shows an example of a specific structure of charge pump circuit 811. Referring to FIG. 58, charge pump circuit 811 includes a capacitance CP10 receiving a buffered clock signal K', an n channel MOS transistor TQ50 diode connected between a node 812*a* and the ground potential, and a transistor TQ51 diode connected between nodes 812*a* and 812*b*. Transistor TQ50 has its gate and one conduction terminal connected to node 812*a*. Transistor TQ51 has its gate and one conduction terminal connected to node 812*b*. An internal voltage VIN such as a substrate bias potential Vbb is generated from node 812*b*. The operation of charge pump circuit 811 will be briefly described.

It is assumed that transistors TQ50 and TQ51 have the threshold value of Vth, and "H" level of the clock signal K' is the supply voltage Vcc. When clock signal K' rises to "H", positive charges are supplied to node 812*a* by charge pump operation of capacitance CP10, and potential of node 812*a* rises. When the potential of node 812*a* rises, transistor TQ50 is turned on, and potential of node 812*a* is clamped at the threshold voltage Vth of transistor TQ50. At this time, transistor TQ51 is off. When clock signal K' falls to "L", charges (positive charges) are removed from node 812*a* by charge pump operation of capacitance CP10, and potential of node 812*a* falls. As the potential of node 812*a* lowers, transistor TQ50 is turned off. When potential difference between the node 812*b* and node 812*a* becomes Vth or higher, transistor TQ51 is turned on and removes positive charges from node 812*b*. This operation is repeated every time clock signal K' is applied, and finally, potential at node 812*b* is stabilized at about $-Vcc+2\cdot Vth$. By the charge pump circuit 811 shown in FIG. 58, a constant negative voltage is generated as an internal voltage. By applying the internal voltage VIN applied through this node 812*b* to the semiconductor substrate (or to a well region), the semiconductor substrate is biased to a prescribed negative potential. Thus a substrate bias generating circuit which does not need an oscillating circuit can be realized. Since an oscillating circuit is not used, current consumed by the oscillating circuit can be saved, and area of occupation for the oscillating circuit can also be saved. Therefore, substrate bias generating circuit of low power consumption having small area of occupation can be provided.

The negative potential applied from charge pump circuit may be applied not as the substrate bias potential but it may be applied to a circuit portion operating at a negative potential.

Figure 59:
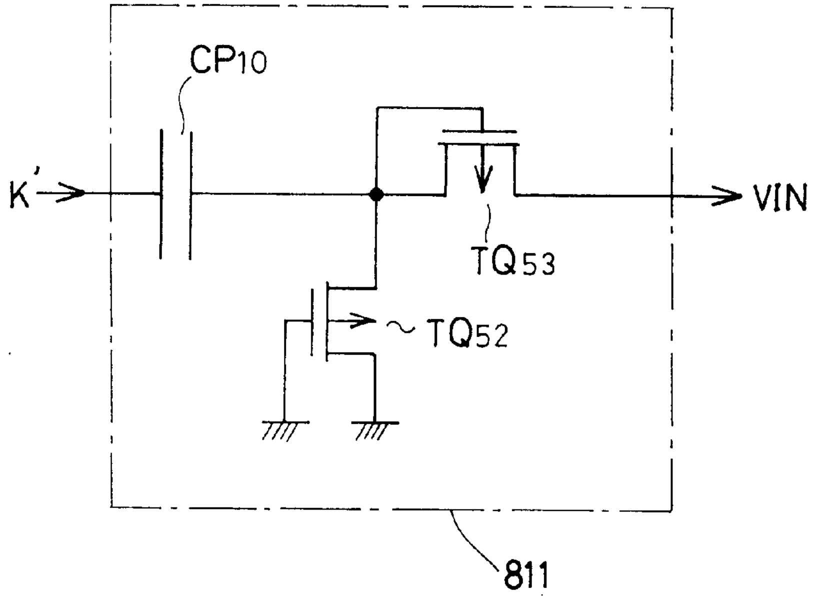
FIG. 59 shows another structure of a charge pump circuit.

FIG. 59 shows another structure of a charge pump circuit 811. Charge pump circuit 811 shown in FIG. 59 includes diode connected p channel MOS transistors TQ52 and TQ53. Operations and functions of transistors TQ52 and TQ53 are the same as those of transistors TQ50 and TQ51 shown in FIG. 58. Therefore, description thereof is not repeated.

Figure 60:
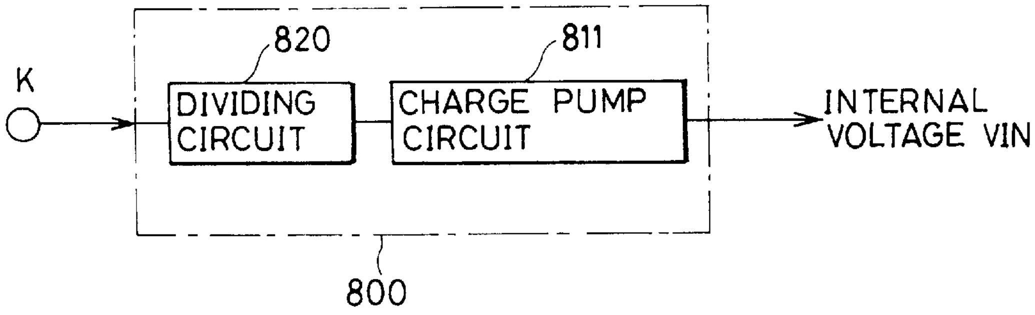
FIG. 60 shows another structure of an internal voltage generating circuit shown in FIG. 55.

FIG. 60 shows another example of an internal data generating circuit. Internal data generating circuit 800 shown in FIG. 60 includes a dividing circuit 820 which frequency-divides an internal or external clock signal K by a prescribed ratio of division, and a charge pump circuit 811 responsive to a signal from the dividing circuit 820 for carrying out charge pump operation to generate an internal voltage VIN. Capability of supplying negative charges (or removal of positive charges) of the charge pump circuit is determined by capacitance value of the capacitors included therein and on frequency of applied clock signal. If the clock signal K has high frequency, charge pump circuit has higher capability of supplying negative charges, so that a predetermined bias voltage is faster provided stably at the level at which negative charge injection by the charge pump circuit 81 and positive charge injection due to memory operation are balanced with each other.

If capability of supplying negative charges of charge pump circuit 811 is too high, the substrate bias voltage, for example, may be made too low when a memory operation is not performed, and therefore a circuit for controlling level of the internal voltage VIN or a circuit for clamping the internal voltage VIN at a prescribed potential becomes necessary. In such case, extra power is consumed, and extra circuits are required. Therefore, by the dividing circuit 820, frequency of the clock K is reduced to a desired frequency and then it is applied to the charge pump circuit 811. The division ratio of the dividing circuit 820 is determined dependent on the driving capability required for the internal voltage generating circuit, that is, the application of the internal voltage VIN.

Figure 61:
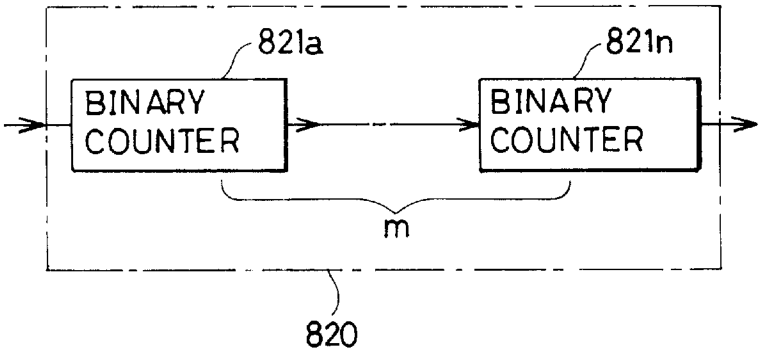
FIG. 61 shows an example of a specific structure of a dividing circuit shown in FIG. 60.

FIG. 61 shows an example of a specific structure of the dividing circuit 820 shown in FIG. 60. Referring to FIG. 61, dividing circuit 820 includes m cascade connected 1 bit binary counters 821*a* to 821*n*. A 1 bit binary counter 821 (each of the counters 821*a* to 821*n*) returns to the initial state at every twice application of a signal. Therefore, one binary counter 821 reduces the period of an applied signal to ½. When m binary counters are connected in series, mth power of the division ratio (1/2) is provided. Therefore, by changing the number of 1 bit binary counters 821, a dividing circuit 821 providing a desired division ratio can be implemented. The dividing circuit 820 may have one 1 bit binary counter 821.

Instead of a 1 bit binary counter, other circuit structure may be employed for the dividing circuit 820. Any structure dividing an applied signal may be used. Dependent on use, a structure for multiplexing the frequency of clock signal K to apply the same to the charge pump circuit 811 may be used.

Figure 62:
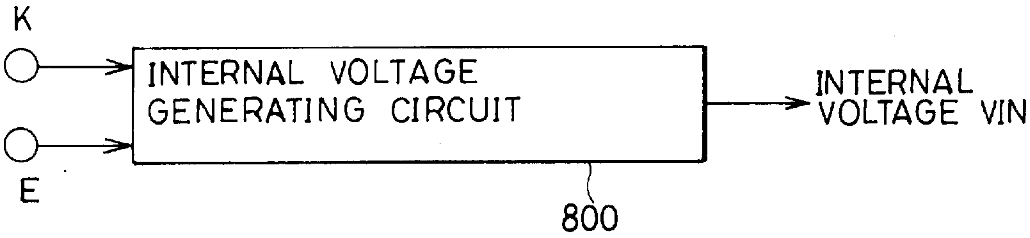
FIG. 62 is a block diagram showing another relation between input and output signals of the internal voltage generating circuit.

FIG. 62 shows another structure of internal voltage generating circuit. Internal voltage generating circuit 800 shown in FIG. 62 generates an internal voltage VIN in response to a clock signal K and to a chip select signal E. When chip select signal E is inactive, the semiconductor memory device is at a standby state (non-selected state). By switching the capability of supplying negative or positive charges of the internal voltage generating circuit 800 dependent on the selected/non selected state of the semiconductor memory device, power consumption is reduced.

Figure 63:
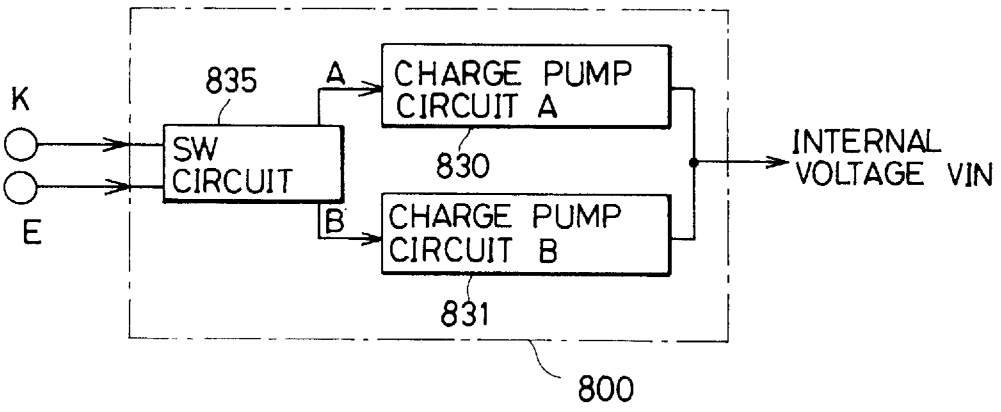
FIG. 63 shows one example of a specific structure of the internal voltage generating circuit shown in FIG. 62.

FIG. 63 is a block diagram showing an example of a specific structure of internal voltage generating circuit 800 shown in FIG. 62. Referring to FIG. 63, internal voltage generating circuit 800 includes a first charge pump circuit 830 and a second charge pump circuit 831 having different capabilities. The capabilities of the charge pump circuits 830 and 831 are adjusted by changing capacitance values of the capacitance of the charge pump. Internal voltage generating circuit 800 of FIG. 53 further includes a switch circuit 835 responsive to clock signal K and chip enable signal E for driving either charge pump circuit 830 or charge pump circuit 831. Switch circuit 835 selectively transmits clock signal K to charge pump circuit 830 or 831 in response to active/inactive state of chip select signal E.

Switch circuit 835 may have a structure which transmits clock signal K to one of charge pump circuits 830 and 831 when chip select signal E is active and transmits the clock signal to the other one of charge pump circuits when chip select signal E is inactive for selectively driving the charge pump circuit 830 or 831.

Switch circuit 835 may have a structure which transmits clock signal K to both of charge pump circuits 830 and 831 when chip select signal E is active, and transmits clock signal K to one of the charge pump circuits when chip select signal E is inactive.

Switch circuit 835 controls operation of charge pump circuits 830 and 831 in response to chip select signal E. Other signal may be used as selection control signal applied to switch circuit 835. A structure in which at least a chip select signal for designating selected state/non-selected state of chip or semiconductor memory device is used as one control signal for designating selection control may be used. Clock signal K and chip select signal E may be externally applied or they may be generated after buffering in the device.

Figure 64:
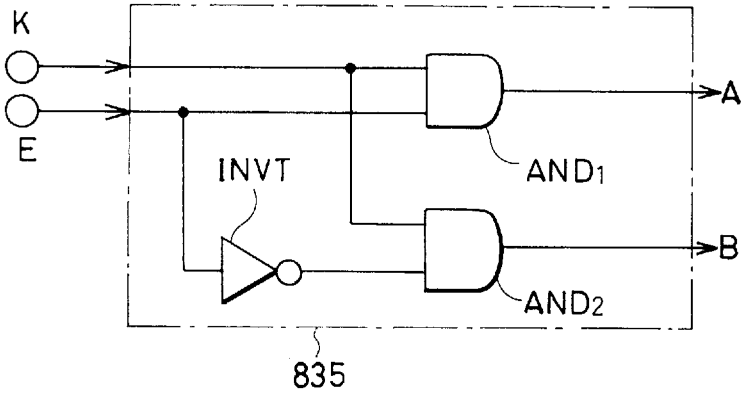
FIG. 64 shows one example of a specific structure of a switch circuit shown in FIG. 63.

FIG. 64 shows one example of a specific structure of switch circuit 835 shown in FIG. 63. Switch circuit 835 shown in FIG. 64 selectively drives charge pump circuit 830 and 831. Referring to FIG. 64, switch circuit 835 includes an AND circuit AND 1 receiving clock signal K and chip select signal E, an inverter circuit INVT receiving chip select signal E, and an AND circuit AND 2 receiving clock signal K and an output from inverter circuit INVT. In the structure of the switch circuit shown in FIG. 64, when chip select signal E is inactive and the semiconductor memory device is at the non-selected state, chip select signal E is at "H", AND circuit AND1 is enabled, and AND circuit AND2 is disabled. Therefore, clock signal K is applied to a charge pump circuit (for example, 830) having smaller capacity of driving through AND circuit AND 1. Consequently, driving capability of internal voltage generating circuit 800 is made small when the chip is at non-selected state.

When chip select signal E is at active state, that is, "L" and the semiconductor memory device is selected, AND circuit AND2 is enabled and AND circuit AND1 is disabled. At this state, clock signal K is transmitted to a charge pump circuit (for example, 831) having larger driving capability through AND circuit AND2. Therefore, by using switch circuit 835 shown in FIG. 64, charge pump circuits 830 and 831 can be selectively operated dependent on selected/non-selected state of the semiconductor memory device, preventing unnecessary power consumption.

Figure 65:
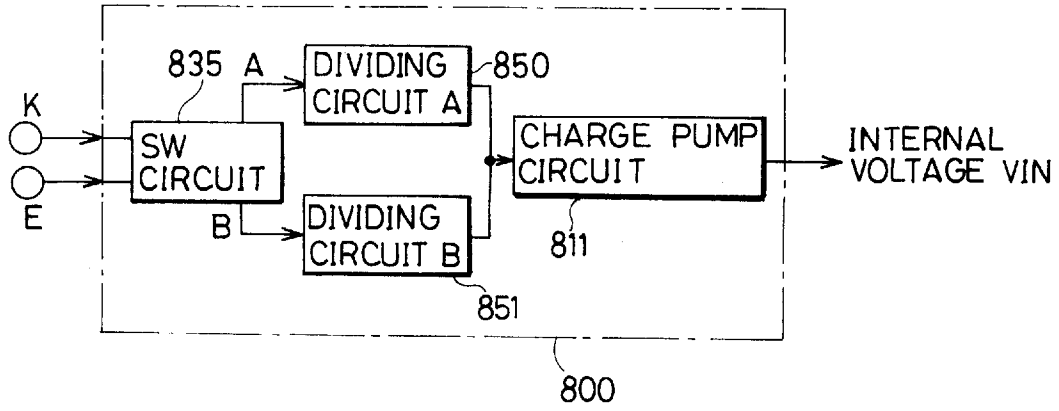
FIG. 65 shows another structure of the internal voltage generating circuit shown in FIG. 62.

FIG. 65 shows a further example of internal voltage generating circuit shown in FIG. 62. Referring to FIG. 65, internal voltage generating circuit 800 includes one charge pump circuit 811, dividing circuits 850 and 851 having different division ratio, and switch circuit 835 responsive to a chip select signal E for selectively transmitting clock signal K to the dividing circuits 850 and 851. Current supplying capability of charge pump circuit is changed dependent on the frequency of an oscillating signal applied thereto. Therefore, by changing the frequency of an oscillating signal for the charge pump operation dependent on the selected/non-selected state of the semiconductor memory device, driving capability of the internal voltage generating circuit 800 can be adjusted. The structure shown in FIG. 61 may be used as the dividing circuit 850 and 851, and oscillating frequency thereof can be adjusted by changing the number of 1 bit binary counters.

Switch circuit 835 selectively transmits clock signal K to dividing circuit 850 or 851 in response to a chip select signal E. A structure shown in FIG. 64 may be used for switch circuit 835. In the structure shown in FIG. 65 also, the driving capability of internal voltage generating circuit 800 can be adjusted dependent on selected/non selected state of the semiconductor memory device, and the current consumption can be reduced.

In the structure of internal voltage generating circuit shown in FIG. 62, driving capability of internal voltage generating circuit is adjusted by chip select signal E. However, the semiconductor memory device includes a DRAM, and internal circuits are operating at a time of refresh. Therefore, in order to bias the substrate potential to a prescribed potential during refreshing, a structure may be used in which a refresh designating signal REF is applied as a conditional signal to switch circuit 835. In such a case, if refreshing operation is designated when chip select signal E is at "HH" and refresh designating signal REF is at "L", an NANDed signal of the refresh designating signal REF and the chip select signal E may be applied to AND circuits AND1 and AND2 shown in FIG. 64 instead of chip select signal E.

In the charge pump circuit structure shown in FIGS. 58 and 59, a negative internal voltage VIN is generated. However, in a semiconductor memory device, an internal voltage higher than the supply voltage, such as a boosted word line driving signal for DRAM may be necessary. A structure for generating a boosting signal which is higher than the supply voltage will be described.

Figure 66:
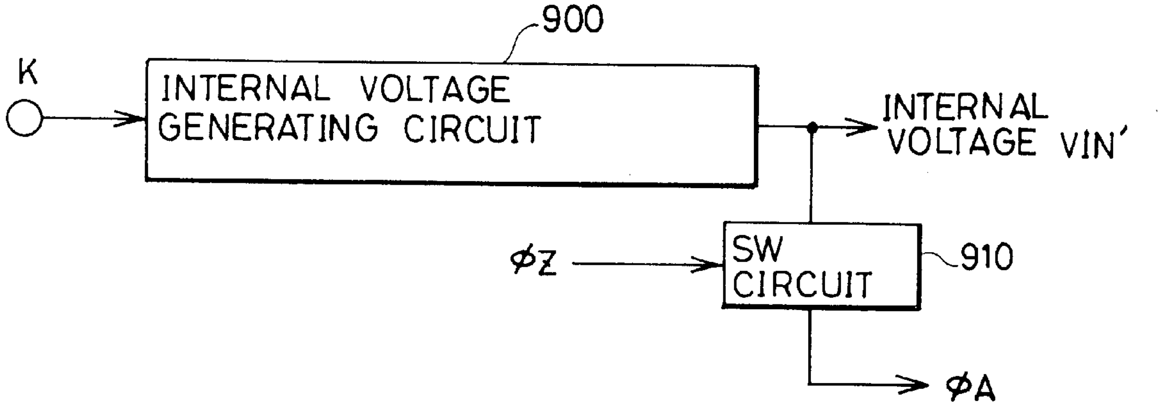
FIG. 66 shows an internal voltage which is higher than the supply voltage, and a structure for generating an internal signal unitizing the internal voltage.

FIG. 66 shows a structure of a boosting signal generating system employing an internal voltage generating circuit in accordance with another embodiment of the present invention. Referring to FIG. 66, an internal voltage generating circuit 900 generates an internal voltage VIN' which is boosted to be higher than operational supply voltage Vcc in response to a clock signal K. Switch circuit 910 generates a boosted signal ϕA in response to an internal control signal ϕZ, "H" level of which is the operational supply voltage Vcc level. When the internal control signal ϕA is the boosted word line driving signal to be transferred to a selected DRAM word line, the signal ϕA is applied to a node at which the substrate and the source of the transistor TQ2 are connected, in the structure shown in FIG. 9. At this time, internal control signal ϕZ whose level is the operational supply voltage Vcc applied to switch circuit 910 corresponds to internal control signal dr2 shown in FIG. 9. The internal control signal ϕA is not limited to the word line driving signal, and it may be any control signal when boosted level is necessary.

Figure 67:
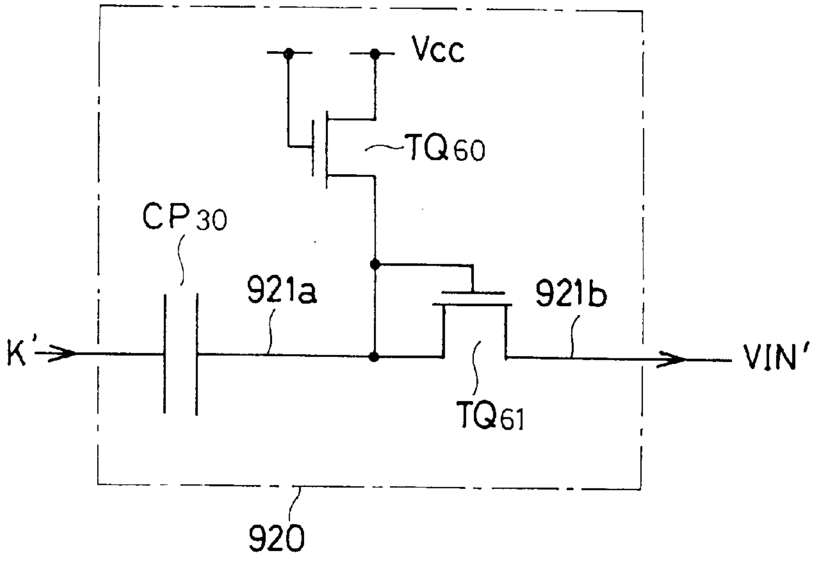
FIG. 67 shows one example of a specific structure of the charge pump circuit used in the internal voltage generating circuit shown in FIG. 66.

FIG. 67 shows a specific structure of a charge pump circuit shown in internal voltage generating circuit 900 shown in FIG. 56. A charge pump circuit 920 for generating a boosted internal voltage VIN', which is higher than the supply voltage includes a capacitance CP30 receiving a clock signal K', an n channel MOS transistor TQ61 diode connected between nodes 921*a* and 921*b*, and an n channel MOS transistor TQ60 diode connected between node 921*a* and supply potential Vcc. Transistor TQ60 has its gate and one conduction terminal connected to the supply potential Vcc. Transistor TQ61 has its gate and one conduction terminal connected to node 921*a*. Boosted internal voltage VIN' is generated from node 921*b*. The operation will be described.

Capacitance CP30 carries out charge pump operation for the node 921*a* in response to clock signal K'. When clock signal K' rises to "H", positive charges are supplied to node 921*a* and potential of node 921*a* rises. At this time, transistor TQ60 is turned off, transistor TQ61 is turned on and positive charges are supplied to node 921*b*. When clock signal K' falls to "L", positive charges in node 921*a* are removed, and potential of node 921*a* lowers. At this time, transistor TQ61 is turned off, transistor TQ60 is turned on, and potential at node 921*a* is clamped at Vcc−Vth. This operation is repeated every time clock signal K' is applied, positive charges are supplied to node 921*b*, internal voltage VIN' rises, and finally potential at node 921*b* reaches the boosted level of Vcc+2·Vth.

Figure 68:
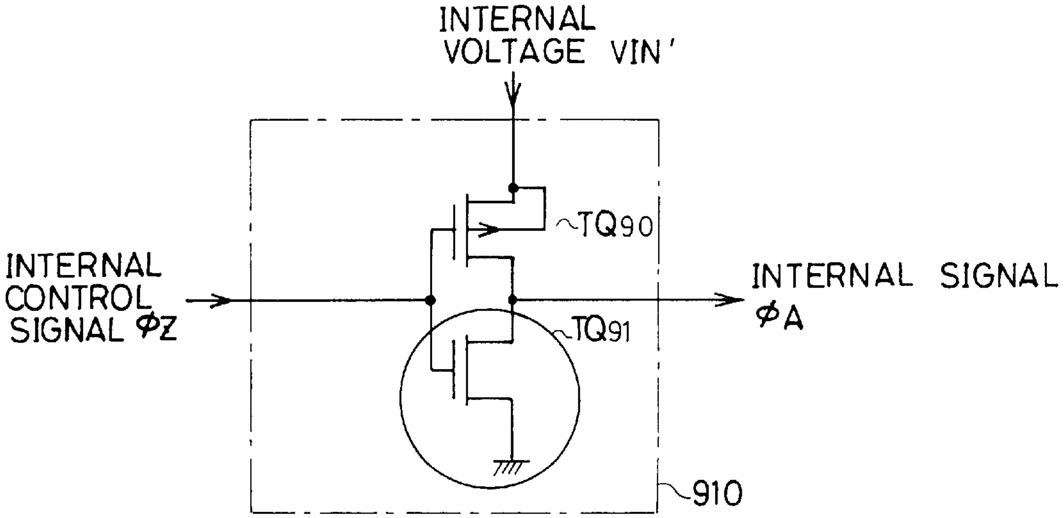
FIG. 68 shows an example of a specific structure of the switch circuit shown in FIG. 66.

FIG. 68 shows one example of a specific structure of switch circuit 910 shown in FIG. 66. Referring to FIG. 68, switch circuit 910 includes complementarily connected p channel MOS transistor TQ90 and n channel MOS transistor TQ91. Boosted internal voltage VIN' is applied to the substrate of transistor TQ90. Consequently, transistor TQ90 surely transmits the boosted internal voltage VIN without causing signal loss or punch through. Internal control signal ϕZ is applied to gates of transistors TQ90 and TQ91.

Figure 9:
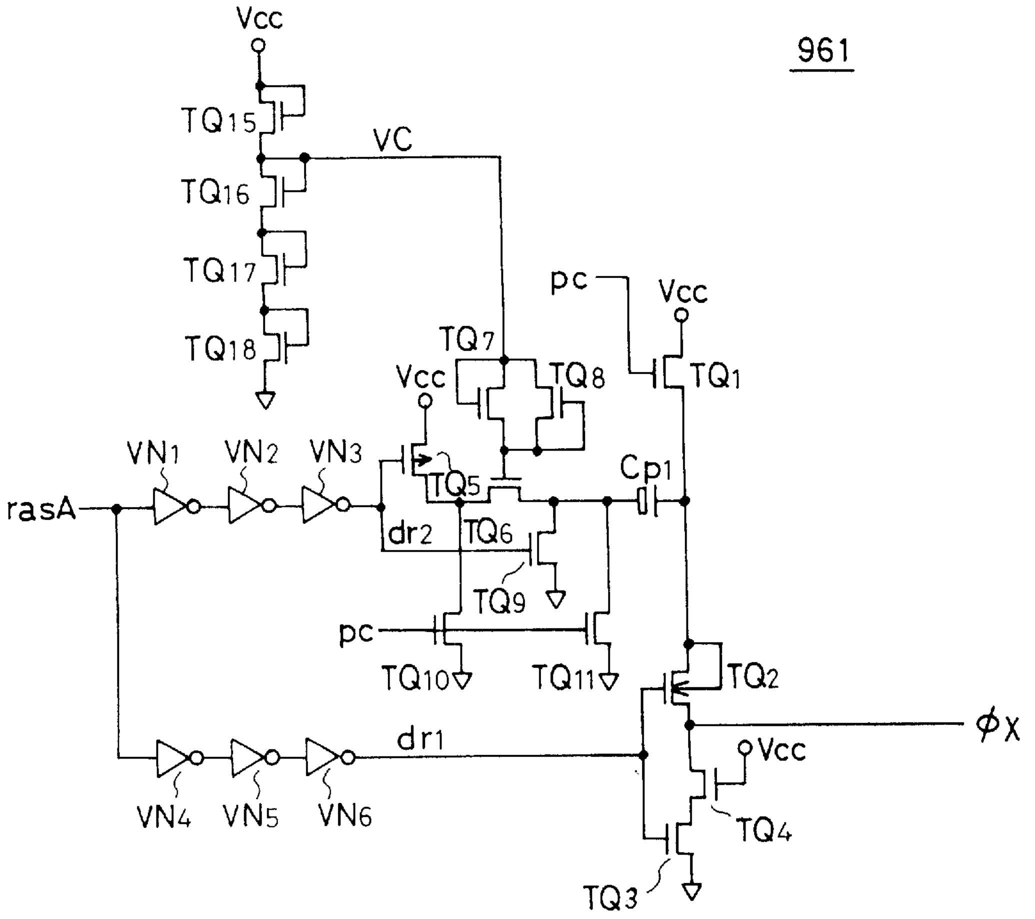
FIG. 9 shows an example of a specific structure of a conventional boosted word line driving signal generating circuit.
Figure 10:
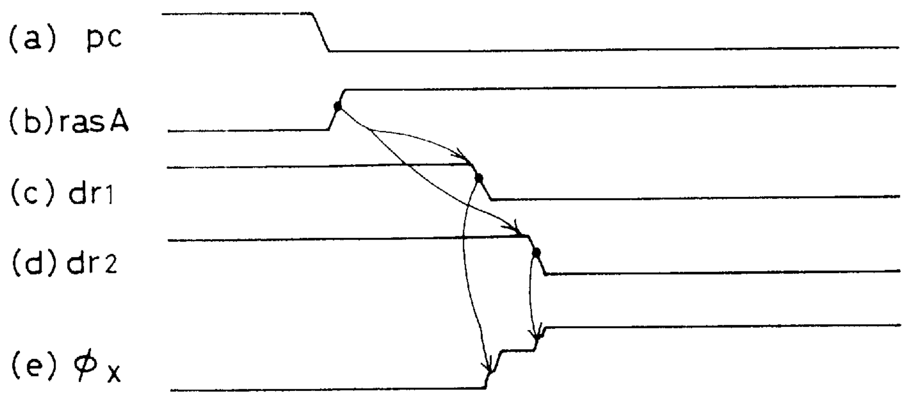
FIG. 10 is a diagram of signal waveforms showing the operation of the circuit shown in FIG. 9.

When a circuit shown in FIGS. 67 and 68 is used as a boosted word line driving signal generating circuit, the device structure becomes more simple as compared with the structure of FIG. 9, and a boosting circuit having smaller area of occupation can be provided. When internal signal ϕA is used as word line driving signal, boosting may be done not only at restoring but boosted voltage may be maintained continuously during the period in which the word line is active.

In the switch circuit shown in FIG. 68, transistor TQ90 is turned on and transistor TQ91 is turned off when internal control signal ϕZ attains to "L", and a boosted internal signal ϕA is output. When internal control signal ϕZ attains to "H", transistor TQ90 is turned off, transistor TQ91 is turned on, and internal signal ϕA is discharged to "L".

In the structure shown in FIG. 68, a transistor TQ4 may be interposed between the transistor TQ91 and an output node of internal signal ϕA in order to prevent the drain/source potential of the transistor TQ91 from becoming high voltage.

In the structure of switch circuit 910 shown in FIG. 68, it is necessary to maintain boosted level of the internal signal ϕA in a prescribed period only. Therefore, when it is inactive, it must be set to "L". For this purpose, transistor TQ91 is necessary. However, when this transistor TQ91 is removed, and the structure is adapted to receive internal control signal ϕZ only at the gate of transistor TQ90, internal signal ϕA which is always at the boosted level is generated. The resulting circuit may be used as a level retaining circuit for continuously holding the boosted level. More specifically, when there is a leak in the internal signal ϕA and the voltage level thereof may lower, leaked charges can be sufficiently made up for by the charges supplied from the charge pump circuit in the internal voltage generating circuit, and therefore, a level holding circuit capable of stably holding the boosted level of the signal ϕA can be provided. When it is used as such a level holding circuit, a stable boosted level can be maintained with the leak compensated for by the charges supplied from the charge pump circuit 920, even when internal signal ϕA is used as the word line driving signal.

Figure 69:
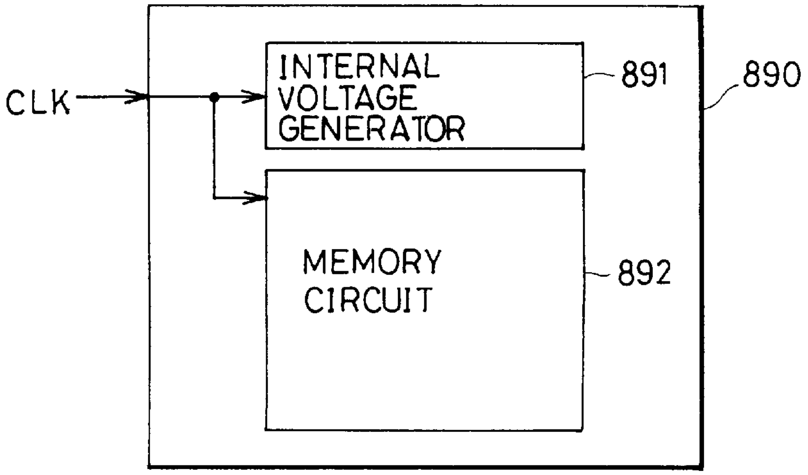
FIG. 69 shows another structure of a semiconductor memory device including the internal voltage generating circuit of the present invention.

Although a CDRAM has been described as an example of the semiconductor memory device to which the above described internal voltage generating circuit is applied, the semiconductor device is not limited thereto. For example, when a semiconductor memory device 890 includes a DRAM or SRAM memory circuit 892 and the memory circuit 892 operates in synchronization with external clock signal CLK as shown in FIG. 69, an internal voltage generating circuit 890 generating a desired internal voltage in response to the external clock signal CLK may be provided. Any memory circuit may be used provided that data input/output is carried out in synchronization with external clock signal CLK.

The clock signal may not necessarily be clock signals applied at constant prescribed period, such as a system clock. For example, in the above described CDRAM, when the DRAM is being accessed, it is impossible to access to the SRAM to read data therefrom. In that case, frequency of the clock signal K may be lowered to reduce power consumption. In the standby state or during refreshing of the DRAM, period of the clock signal K may be made longer, provided that SRAM is not accessed during refreshing. By changing the period of the external clock signal K dependent on the state of operation of the CDRAM, current consumption can be reduced. Therefore, the externally applied clock signal K does not need to have constant period. More specifically, any control signal which is applied repeatedly no matter whether the semiconductor memory device is accessed or not may be used as the clock signal to which the internal voltage generating circuit responds. Another example of a semiconductor memory device having such a control signal includes a dual port RAM which is generally used in the field of image processing.

Figure 70:
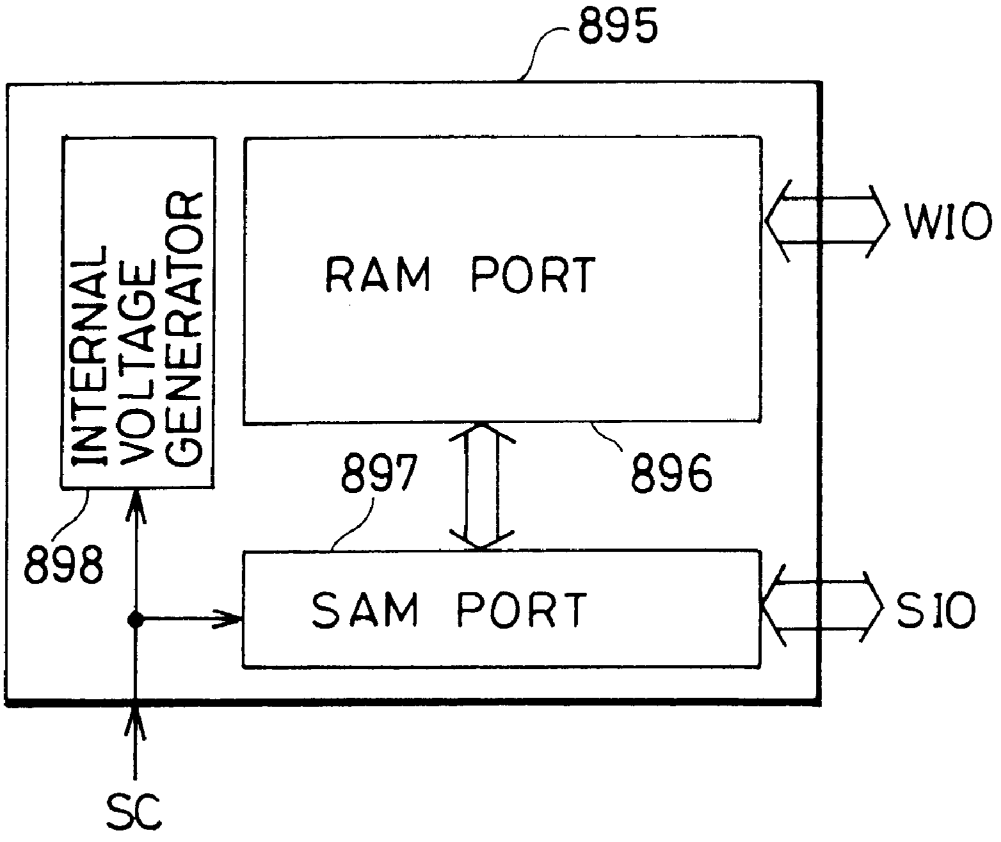
FIG. 70 shows a further structure of a semiconductor memory device having the internal voltage generating circuit in accordance with the present invention.

FIG. 70 schematically shows a structure in which the internal voltage generating circuit in accordance with the present invention is applied to a VRAM (dual port RAM). The dual port RAM includes a RAM port 896 capable of inputting/outputting data WIO at random sequence, and an SAM port capable of inputting/outputting data SIO sequentially. The RAM port 896 is generally formed by a DRAM having large storage capacity. One row of data of RAM port 896 can be transferred to a serial access memory of SAM port 89, and input/output of data SIO is successively carried out between the serial access memory and an outside of the device.

Timings of input/output of data to and from SAM port, and speed of input/output of data are determined by an externally applied clock signal SC. The clock signal SC is utilized only in the SAM port, and not used in the RAM port 896. If the internal voltage generating circuit 898 responsive to the external clock signal SC for generating a desired internal voltage is provided in the dual port RAM 895, an internal voltage generating circuit 898 of low current consumption having small area of occupation can be provided, as in the above described embodiments, so that a dual port RAM having higher degree of integration can be provided.

As described above, according to the present invention, a desired internal voltage is generated in response to a control signal which is applied externally and repeatedly. Therefore, a semiconductor memory device having an internal voltage generating circuit of simple structure, low current consumption and having smaller area of occupation can be provided. Consequently, a semiconductor memory device of low current consumption having high degree of integration can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device receiving an externally applied external clock signal, comprising:

input means in synchronization with said external clock signal for strobing an externally applied external control signal thereinto to generate an internal control signal for use in said semiconductor memory device; and means for generating an internal supply voltage used in said semiconductor memory device in response to said external clock signal, said external clock signal being applied during both access and standby states of said semiconductor memory device.

2. The semiconductor memory device according to claim 1, wherein said semiconductor memory device is formed on a semiconductor substrate, and wherein said means for generating includes means for applying a predetermined bias potential to said semiconductor substrate.

3. The semiconductor memory device according to claim 1, wherein said means for generating includes means responsive to sLaid external control signal for generating a boosted signal having a level higher than an operating power supply potential.

4. The semiconductor memory device according to claim 3, further comprising means responsive to a drive control signal for transmitting said boosted signal as a word line drive signal to be transferred onto a selected word line.

5. The semiconductor memory device according to claim 1, further comprising means responsive to a control signal for transmitting said internal supply voltage to an internal signal line to hold the internal signal line to said internal voltage level.

6. The semiconductor memory device according to claim 1, wherein said means for generating includes a frequency divider coupled to receive said external clock signal, for frequency-dividing the external clock signal to generate a divided clock signal, and a charge pump circuit receiving said divided clock signal to generate said internal supply voltage through charge pumping operation responsive to said divided clock signal.

7. The semiconductor memory device according to claim 1, further comprising a serial output circuit for serially outputting data in response to said external clock signal.

8. A semiconductor memory device formed on a single substrate, comprising:

a clock input terminal for receiving a continuous external clock signal; and generating circuit means connected to said clock input terminal for generating an internal supply voltage in response to said clock signal.

9. The semiconductor memory device as recited in claim 8, wherein said internal supply voltage is a substrate bias voltage applied to said substrate.

10. The semiconductor memory device as recited in claim 8, wherein said generating circuit means comprises a charge pump circuit.

11. The semiconductor memory device as recited in claim 10, wherein said charge pump circuit comprises a capacitor having one electrode for receiving said external clock signal and another electrode, and clamping means for clamping a potential at said another electrode to a predetermined potential.

12. The semiconductor memory device as recited in claim 11, wherein said clamping means comprises diode connected field effect transistors.

13. The semiconductor memory device as recited in claim 10, wherein said generating circuit means further comprises frequency divider circuit means connected between said charge pump circuit and said clock input terminal, for frequency dividing the clock signal received at said clock input terminal for application to said charge pump circuit.

14. The semiconductor memory device as recited in claim 13, wherein said frequency divider circuit means comprises a plurality of binary counter circuits connected in cascade relationship for counting the clock signal at said clock input terminal.

15. The semiconductor memory device as recited in claim 10, further comprising a chip select terminal for receiving a chin select signal by which memory functions are enabled, and wherein said generating circuit means further comprises switching circuit means connected to said chip select terminal for selectively activating said charge pump circuit in response to said chip select signal.

16. The semiconductor memory device as recited in claim 15, wherein said generating circuit means further comprises another charge pump circuit having a different charge supply capability from said charge pump circuit and said switching circuit means comprises logic circuit means for activating both said charge pump circuit and said another charge pump circuit mutually exclusively in response to said chip select signal.

17. The semiconductor memory device as recited in claim 15, wherein said charge pump circuit comprises capacitor and diode connected field effect transistor which operate together in response to said clock signal for boosting voltage.

18. The semiconductor memory device as recited in claim 10, further comprising a chip select terminal for receiving a signal by which memory functions are enabled, and wherein said generating circuit means further comprises a pair of frequency divider circuit means having different division ratios connected to said charge pump circuit and to said clock input terminal for frequency-dividing the clock signal at said clock input terminal; and switching circuit means connected to said chip select terminal for activating said pair of frequency divider circuit means mutually exclusively in response to said chip select signal.

19. The semiconductor memory device as recited in claim 18, wherein said charge pump circuit comprises capacitor and diode connected field effect transistor which operate together in response to said clock signal for boosting voltage.

20. The semiconductor memory device as recited in claim 8, further comprising means responsive to a control signal for transferring said internal supply voltage as an internal drive signal.

21. The semiconductor memory device as recited in claim 20, wherein said internal supply voltage is at a level higher than an operating power supply voltage of said semiconductor memory device.

22. The semiconductor memory device as recited in claim 21, wherein said internal drive signal is a boosted word line drive signal to be transferred onto a selected word line.

23. The semiconductor memory device according to claim 8, wherein said generating circuit means includes frequency dividing means for dividing in frequency said external clock signal, and means responsive to the frequency-divided external clock signal from the frequency dividing means for generating said internal supply voltage through a charge pumping operation.

24. A semiconductor memory device formed on a single semiconductor chip, comprising:

a first memory array including a plurality of dynamic type memory cells;

a second memory array including a plurality of static type memory cells;

data transfer means for transferring data between said first memory array and second memory array;

control means responsive to an external repeatedly applied clock signal for generating internal signals for use in said semiconductor memory device; and voltage generating means responsive to said repeatedly applied clock signal for generating an internal supply voltage.

25. The semiconductor memory device according to claim 24, wherein said internal supply voltage provides a substrate bias voltage applied to said semiconductor chip.

26. The semiconductor memory device according to claim 24, wherein said internal supply voltage provides a boosted voltage higher than an operating power supply voltage of said semiconductor memory device.

27. The semiconductor memory device according to claim 26, further comprising transfer means responsive to a transfer control signal for transferring said internal supply voltage as an internal signal for use in said semiconductor memory device.

28. The semiconductor memory device according to claim 27, wherein said voltage generating means includes means for generating a boosted word line drive signal to be transferred onto a selected word line connecting a row of memory cells in said first memory array as said internal supply voltage.

29. The semiconductor memory device according to claim 24, wherein said voltage generating means includes charge pump means for generating said internal supply voltage through charge pumping operation of a capacitor element, and wherein said semiconductor memory device further includes means, responsive to a chip select signal indicating enabling of said semiconductor memory device, for controlling a charge pumping operation repeating cycle of said charge pump means.

30. A method of generating an internal supply voltage in a semiconductor device, comprising the steps of:

in response to a clock signal repeatedly applied to said semiconductor device, generating said internal supply voltage for use in said semiconductor device and using an external control signal in synchronization with the clock signal to generate an internal control signal, the clock signal being applied regardless whether the semiconductor device is accessed.

31. The method according to claim 27, wherein said step of generating includes the step of generating, through charge pumping operation of a capacitor, a substrate bias voltage to be applied to a substrate where said semiconductor device is formed, as said internal supply voltage.

32. The method according to claim 30, wherein said step of generating includes the step of generating, through charge pumping operation of a capacitor, a boosted voltage signal higher than an operating power supply voltage of said semiconductor device, as said internal supply voltage.

33. The method according to claim 32, wherein said semiconductor device includes a plurality of dynamic type memory cells arranged in a matrix of rows and columns, and wherein said step of generating includes the step of generating a boosted word line drive signal to be transferred onto a selected word line connecting a row of memory cells of said matrix, as said internal supply voltage.

34. A method of generating an internal supply voltage for use in a semiconductor memory device comprising a cache memory including a plurality of static type memory cells and a main memory including a plurality of dynamic type memory cells, and data transfer means for transferring data between said cache memory and said main memory, comprising the steps of:

in response to an external clock signal continuously applied to said semiconductor memory device, generating said internal supply voltage.

35. The method according to claim 34, wherein said step of generating includes the step of generating, through charge pumping operation of a capacitor responsive to said clock signal, a bias voltage applied to a substrate where said semiconductor memory device is formed.

36. The method according to claim 34, wherein said step of generating includes the step of generating, through charge pumping operation of a capacitor responsive to said clock signal, a boosted voltage signal higher than an operating power supply voltage of said semiconductor memory device.

37. The method according to claim 36, further comprising the step of transferring said boosted voltage signal as an internal signal for use in said semiconductor memory device, in response to a transfer control signal.

38. The method according to claim 36, wherein said dynamic type memory cells are arranged in a matrix of rows and columns, and wherein said method further includes the step of transferring said boosted voltage signal onto a selected word line connecting a selected row of memory cells of said matrix, in response to a word line drive control signal.

39. A semiconductor memory device formed on a single semiconductor chip, comprising:

a first memory array including a plurality of first type memory cells;

a second memory array including a plurality of second type memory cells;

data transfer means for transferring data between said first memory array and said second memory array;

control means in synchronization with an external clock signal for strobing an external control signal thereinto for generating an internal control signal corresponding to the strobed external control signal, said external clock signal having a width of a predetermined time duration and repeatedly applied; and, voltage generation means responsive to said external clock signal for generating an internal supply voltage for use in said semiconductor memory device.

40. The semiconductor memory device according to claim 39, wherein said voltage generation means includes means for generating as said internal supply voltage a boosted voltage higher than an operating power supply voltage of said semiconductor memory device.

41. A semiconductor memory device comprising:

a memory cell array including a plurality of memory cells;

means for receiving data from memory cells selected in said memory cell array and for sequentially outputting the received data externally in synchronization with an external clock signal of repeated pulses; and voltage generation means responsive to said external clock signal for generating an internal supply voltage for use in said semiconductor memory device.

42. The semiconductor memory device according to claim 41, wherein said voltage generation means includes frequency-dividing means for dividing in frequency said external clock signal, and means responsive to the frequency-divided external clock signal for generating said internal supply voltage.

43. The semiconductor memory device according to claim 41, wherein said voltage generation means includes means for generating as said internal supply voltage a boosted voltage higher than an operating power supply voltage.

44. A semiconductor memory device comprising:

a memory cell array including a plurality of memory cells;

means for inputting data sequentially in synchronization with an external clock signal for writing into memory cells selected in said memory cell array; and, voltage generation means responsive to said external clock signal for generating an internal supply voltage for use in said semiconductor memory device.

45. The semiconductor memory device according to claim 44 wherein said voltage generation means includes means for generating as said internal supply voltage a boosted voltage higher than an operating power supply voltage.

46. The semiconductor memory device according to claim 44, wherein said voltage generation means includes means for dividing in frequency said external clock signal, and means responsive to the frequency-divided external clock signal for generating said internal supply voltage.

47. A semiconductor memory device comprising:

memory storage means;

control means for receiving external signals including an external clock signal and external control signals; and voltage generating means for generating an internal voltage for use in said semiconductor memory device in response to said external clock signal; wherein said external control signals define access and standby states of the memory storage means; and said voltage generating means is responsive to receipt of the external clock signal irrespective of whether the semiconductor memory device is in the access state or the standby state to generate said internal voltage for the memory device from said external clock signal.

* * * * *